US012706144B2

(12) United States Patent
Son et al.

(10) Patent No.: US 12,706,144 B2
(45) Date of Patent: Aug. 11, 2026

(54) SEMICONDUCTOR DEVICE AND ELECTRONIC SYSTEM

(71) Applicant: Samsung Electronics Co., Ltd., Suwon-si (KR)

(72) Inventors: Yoonhwan Son, Seoul (KR); Hyeongjin Kim, Suwon-si (KR); Seungjun Shin, Yongin-si (KR); Joongshik Shin, Yongin-si (KR); Minsoo Shin, Seoul (KR); Jeehoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 847 days.

(21) Appl. No.: 17/860,800

(22) Filed: Jul. 8, 2022

(65) Prior Publication Data

US 2023/0062069 A1 Mar. 2, 2023

(30) Foreign Application Priority Data

Aug. 25, 2021 (KR) ........................ 10-2021-0112658

(51) Int. Cl.

*G11C 16/04* (2006.01)
*H10B 41/10* (2023.01)

(Continued)

(52) U.S. Cl.

CPC ......... *G11C 16/0483* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10W 20/435* (2026.01)

(58) Field of Classification Search

CPC ............................ H10B 41/10; G11C 16/0483

See application file for complete search history.

(56) References Cited

U.S. PATENT DOCUMENTS 9,911,692 B2 3/2018 Smith et al.
9,991,271 B2 6/2018 Kang et al.

(Continued)

FOREIGN PATENT DOCUMENTS

KR 20190122372 A 10/2019

*Primary Examiner* — Zandra V Smith
*Assistant Examiner* — Krishna J Palaniswamy
(74) *Attorney, Agent, or Firm* — Wolf, Greenfield & Sacks, P.C.

(57) ABSTRACT

A semiconductor device includes a lower stepped connection part at a first vertical level on a substrate, an upper stepped connection part at a second vertical level higher than the first vertical level on the substrate, a lower insulating block contacting each of the plurality of lower conductive pad parts at the first vertical level, an upper insulating block contacting each of the plurality of upper conductive pad parts at the second vertical level, an intermediate insulating film between the lower insulating block and the upper insulating block at a third vertical level between the first and second vertical levels, and a first plug structure extending into the lower stepped connection part, the intermediate insulating film, and the upper insulating block in the vertical direction, wherein a width of the first plug structure in the horizontal direction is greatest at the third vertical level.

9 Claims, 50 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10W 20/41*** | (2026.01) |

(56) References Cited

U.S. PATENT DOCUMENTS

| | | | | |
|---|---|---|---|---|
| 10,283,566 | B2 | 5/2019 | Sel et al. | |
| 10,651,198 | B2 | 5/2020 | Baek et al. | |
| 10,685,973 | B2 * | 6/2020 | Song | H10B 43/10 |
| 10,748,923 | B2 * | 8/2020 | Son | H10B 41/50 |
| 11,195,856 | B2 | 12/2021 | Son et al. | |
| 2016/0104715 | A1 * | 4/2016 | Pachamuthu | H10D 88/01<br>257/326 |
| 2019/0280000 | A1 * | 9/2019 | Nakamura | H10B 43/10 |
| 2020/0303416 | A1 | 9/2020 | Song et al. | |
| 2021/0028111 | A1 | 1/2021 | Kai et al. | |
| 2021/0066347 | A1 * | 3/2021 | Titus | H10B 43/50 |
| 2021/0134832 | A1 * | 5/2021 | Choi | H10B 43/10 |

* cited by examiner

Figure 11:
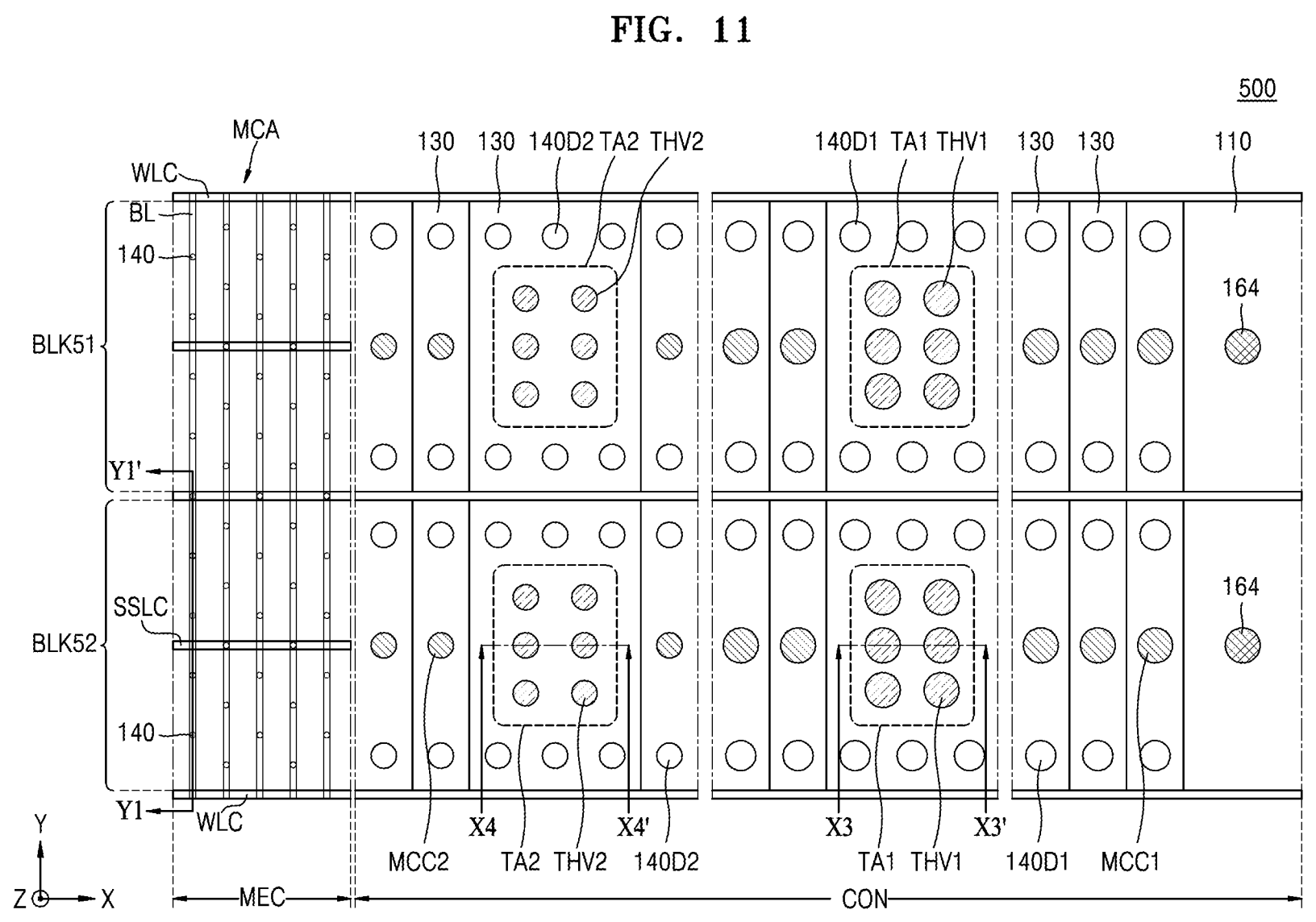

500
110
164
130
130
140D1 TA1 THV1
130
130
140D2 TA2 THV2
MCA
WLC
BL
140
Y1'
SSLC
140
Y1
WLC
MCC1
140D1
X3'
THV1
TA1
X3
140D2
X4'
THV2
TA2
X4
MCC2
CON
MEC
BLK51
BLK52
X
Y
Z

700
W74
W75
W76
740D1
740D2
740D3
148
146
144
142
139
PR72
PR71
736
735
137
136
135
133
130A
118
112C
112B
112A
112
110
STP
X2 - X2'
CON
UL6
UL5
UL4
UL3
UL2
UL1
130
132
STC
STB
STA
Z
X
Y 3210
3220
II'
2500
2210
2400
2100
2130
II
2200
2300
2003
2000
2001
2002
2004
2003b
2003a
2003
2005
2006

SEMICONDUCTOR DEVICE AND ELECTRONIC SYSTEM

CROSS-REFERENCE TO RELATED APPLICATION

This application is based on and claims priority under 35 U.S.C. § 119 to Korean Patent Application No. 10-2021-0112658, filed on Aug. 25, 2021, in the Korean Intellectual Property Office, the disclosure of which is incorporated by reference herein in its entirety.

The inventive concept relates to a semiconductor device and an electronic system including the same, and more particularly, to a semiconductor device including a nonvolatile vertical memory device and an electronic system including the same.

BACKGROUND

In an electronic system that requires data storage, a semiconductor device capable of storing high-capacity data is desirable, and accordingly, a method of increasing the data storage capacity of the semiconductor device is studied. For example, as one of the methods for increasing the data storage capacity of a semiconductor device, a semiconductor device including a vertical memory device having memory cells arranged three-dimensionally instead of two-dimensionally arranged memory cells has been proposed.

SUMMARY

The inventive concept provides a semiconductor device capable of maintaining proper electrical characteristics and reliability even when the number of stacked word lines is increased to improve the degree of integration in a semiconductor device having three-dimensionally arranged memory cells.

The inventive concept also provides an electronic system capable of maintaining proper electrical characteristics and reliability even when the number of stacked word lines is increased to improve the degree of integration in a semiconductor device having three-dimensionally arranged memory cells.

According to an aspect of the inventive concept, there is provided a semiconductor device including a substrate, a lower stepped connection part at a first vertical level on the substrate and having a plurality of lower conductive pad parts, an upper stepped connection part at a second vertical level higher than the first vertical level on the substrate and having a plurality of upper conductive pad parts, a lower insulating block in contact with each of the plurality of lower conductive pad parts at the first vertical level and covering the lower stepped connection part, an upper insulating block in contact with each of the plurality of upper conductive pad parts at the second vertical level, the upper insulating block including a part covering the upper stepped connection part and a part covering the lower insulating block, an intermediate insulating film between the lower insulating block and the upper insulating block at a third vertical level between the first vertical level and the second vertical level, and a first plug structure extending into the lower stepped connection part, the intermediate insulating film, and the upper insulating block in the vertical direction at a position horizontally spaced apart from the upper stepped connection part, the first plug structure having a width in the horizontal direction that is greatest at the third vertical level.

According to another aspect of the inventive concept, there is provided a semiconductor device including: a substrate including a memory cell region and a connection region; a first stack at a first vertical level on the substrate, the first stack including a lower stepped connection part having a plurality of lower gate lines overlapping each other in a vertical direction in the memory cell region and a plurality of lower conductive pad parts in the connection region and integrally connected to the plurality of lower gate lines; a second stack at a second vertical level higher than the first vertical level on the substrate, the second stack including an upper stepped connection part having a plurality of upper gate lines overlapping each other in the vertical direction in the memory cell region and a plurality of upper conductive pad parts in the connection region and integrally connected to the plurality of upper gate lines; a lower insulating block configured to cover the lower stepped connection part at the first vertical level; an upper insulating block configured to cover the upper stepped connection part and the lower insulating block at the second vertical level, an intermediate insulating film between the first stack and the second stack and between the lower insulating block and the upper insulating block at a third vertical level between the first vertical level and the second vertical level; and a plug structure extending into the lower stepped connection part, the intermediate insulating film, and the upper insulating block in the vertical direction at a location horizontally spaced apart from the first stack in the connection region, the plug structure having a width in the horizontal direction that is greatest at the third vertical level.

According to another aspect of the inventive concept, there is provided an electronic system including: a main board; a semiconductor device on the main board; and a controller electrically connected to the semiconductor device on the main board, wherein the semiconductor device includes: a substrate; a lower stepped connection part at a first vertical level on the substrate and having a plurality of lower conductive pad parts; an upper stepped connection part at a second vertical level higher than the first vertical level on the substrate and having a plurality of upper conductive pad parts; a lower insulating block in contact with each of the plurality of lower conductive pad parts at the first vertical level and covering the lower stepped connection part; an upper insulating block in contact with each of the plurality of upper conductive pad parts at the second vertical level, the upper insulating block including a part covering the upper stepped connection part and a part covering the lower insulating block; an intermediate insulating layer between the lower insulating block and the upper insulating block at a third vertical level between the first vertical level and the second vertical level; and a plug structure extending into the lower stepped connection part, the intermediate insulating film, and the upper insulating block in the vertical direction at a position horizontally spaced apart from the upper stepped connection part, the plug structure having a width in the horizontal direction that is greatest at the third vertical level.

BRIEF DESCRIPTION OF THE DRAWINGS

Embodiments of the inventive concept will be more clearly understood from the following detailed description taken in conjunction with the accompanying drawings in which:

FIG. 5 is a schematic plan view of some components of a memory cell block included in a semiconductor device according to embodiments of the inventive concept;

FIG. 11 is a schematic plan view of some components of a memory cell block included in a semiconductor device according to other embodiments of the inventive concept;

FIGS. 20A to 28 are cross-sectional views illustrating a method of manufacturing a semiconductor device according to embodiments according to the inventive concept, and FIGS. 20A, 21A, 22A, 23A, 24A, 25A, 26A, 27A, and 28 are cross-sectional views according to the process sequence of some components of a portion corresponding to the cross-section X1-X1' of FIG. 5, and FIGS. 20B, 21B, 22B 23B, 24B, 25B, 26B, and 27B are cross-sectional views according to the process sequence of some components of a portion corresponding to the cross-section along the line X2-X2' of FIG. 5, and FIGS. 20C, 23C, 26C, and 27C are cross-sectional views according to the process sequence of some components of a portion corresponding to the cross-section Y1-Y1' of FIG. 5.

DETAILED DESCRIPTION OF THE EMBODIMENTS

Figure 1:
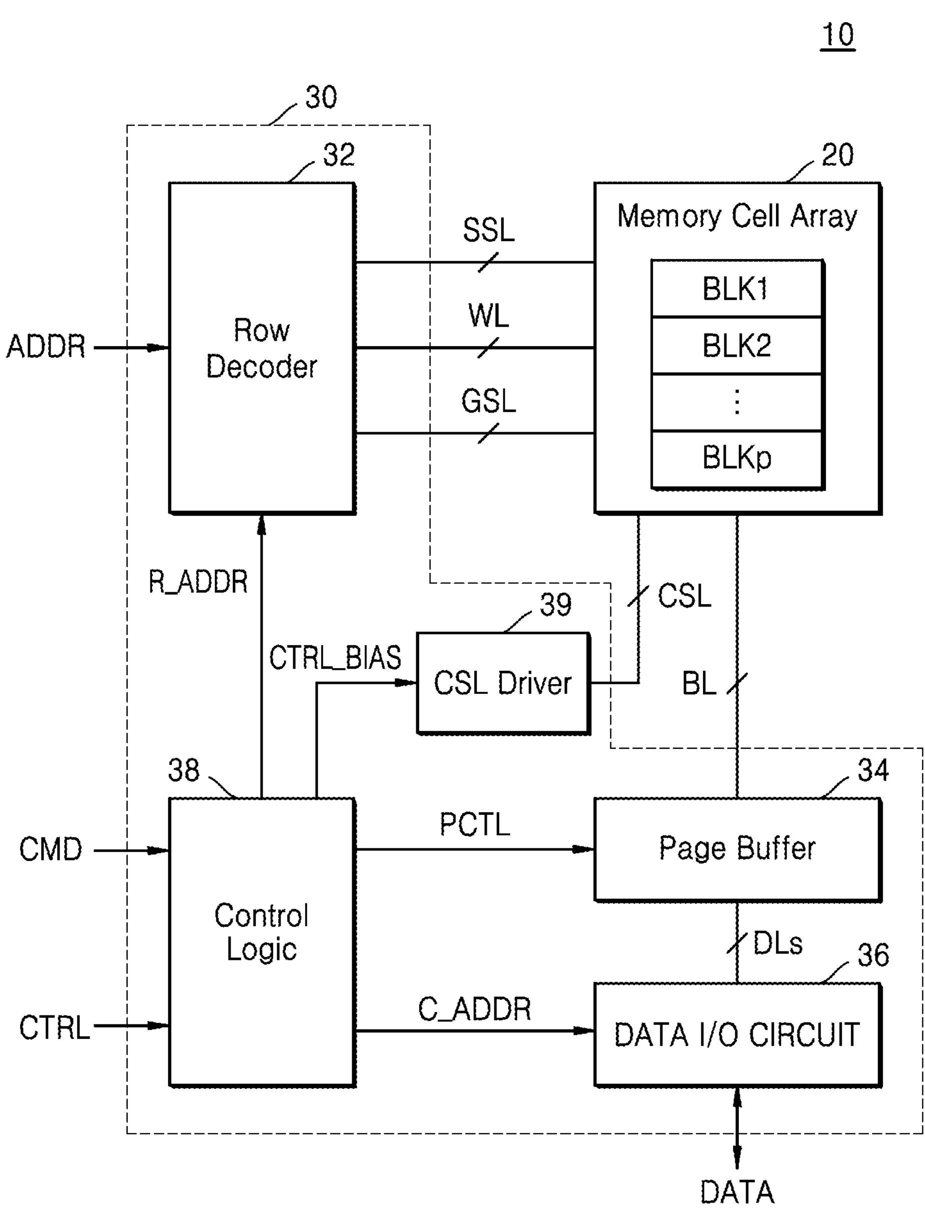
FIG. 1 is a block diagram of a semiconductor device according to embodiments according to the inventive concept.

Hereinafter, example embodiments of the inventive concept will be described in detail with reference to the accompanying drawings. The same reference numerals are used for the same components in the drawings, and duplicate descriptions thereof are omitted.

FIG. 1 is a block diagram of a semiconductor device 10 according to embodiments according to the inventive concept.

Referring to FIG. 1, the semiconductor device 10 may include a memory cell array 20 and a peripheral circuit 30. The memory cell array 20 includes a plurality of memory cell blocks BLK1, BLK2, . . . , BLKp. Each of the plurality of memory cell blocks BLK1, BLK2, . . . , BLKp may include a plurality of memory cells. The memory cell blocks BLK1, BLK2, . . . , BLKp may be connected to the peripheral circuit 30 through a bit line BL, a word line WL, a string select line SSL, and a ground select line GSL.

The peripheral circuit 30 may include a row decoder 32, a page buffer 34, a data input/output (I/O) circuit 36, a control logic 38, and a common source line driver 39. The peripheral circuit 30 may further include various circuits such as a voltage generation circuit for generating various voltages required for the operation of the semiconductor device 10, an error correction circuit for correcting errors in data read from the memory cell array 20, and an input/output interface.

The memory cell array 20 may be connected to the row decoder 32 through the word line WL, the string select line SSL, and the ground select line GSL, and may be connected to the page buffer 34 through the bit line BL. In the memory cell array 20, each of the plurality of memory cells included in the plurality of memory cell blocks BLK1, BLK2, . . . , BLKp may be a flash memory cell. The memory cell array 20 may include a three-dimensional memory cell array. The three-dimensional memory cell array may include a plurality of NAND strings, and each of the plurality of NAND strings may include a plurality of memory cells respectively connected to a plurality of vertically stacked word lines WL.

The peripheral circuit 30 may receive an address ADDR, a command CMD, and a control signal CTRL from the outside of the semiconductor device 10, and may transmit/receive data DATA to and from an external device of the semiconductor device 10.

The row decoder 32 may select at least one of the plurality of memory cell blocks BLK1, BLK2, . . . , BLKp in response to an address ADDR from the outside, and may select a word line WL, a string select line SSL, and a ground select line GSL of the selected memory cell block. The row decoder 32 may transmit a voltage for performing a memory operation to the word line WL of the selected memory cell block.

The page buffer 34 may be connected to the memory cell array 20 through the bit line BL. The page buffer 34 may operate as a write driver during a program operation to apply a voltage according to the data DATA to be stored in the memory cell array 20 to the bit line BL, and may operate as a sense amplifier during a read operation to sense data DATA stored in the memory cell array 20. The page buffer 34 may operate according to a control signal PCTL provided from the control logic 38.

The data I/O circuit 36 may be connected to the page buffer 34 through a plurality of data lines DLs. The data I/O circuit 36 may receive data DATA from a memory controller (not shown) during a program operation, and may provide the program data DATA to the page buffer 34 based on the column address C_ADDR provided from the control logic 38. The data I/O circuit 36 may provide the read data DATA stored in the page buffer 34 to the memory controller based on the column address C_ADDR provided from the control logic 38 during a read operation.

The data I/O circuit 36 may transmit an input address or command to the control logic 38 or the row decoder 32. The peripheral circuit 30 may further include an Electro Static Discharge (ESD) circuit and a pull-up/pull-down driver.

The control logic 38 may receive a command CMD and a control signal CTRL from the memory controller. The control logic 38 may provide the row address R_ADDR to the row decoder 32 and provide the column address C_ADDR to the data I/O circuit 36. The control logic 38 may generate various internal control signals used in the semiconductor device 10 in response to the control signal CTRL. For example, the control logic 38 may adjust the voltage level provided to the word line WL and the bit line BL when a memory operation such as a program operation or an erase operation is performed.

The common source line driver 39 may be connected to the memory cell array 20 through a common source line CSL. The common source line driver 39 may apply a common source voltage (e.g., a power supply voltage) or a ground voltage to the common source line CSL based on the control signal CTRL_BIAS of the control logic 38.

Figure 2:
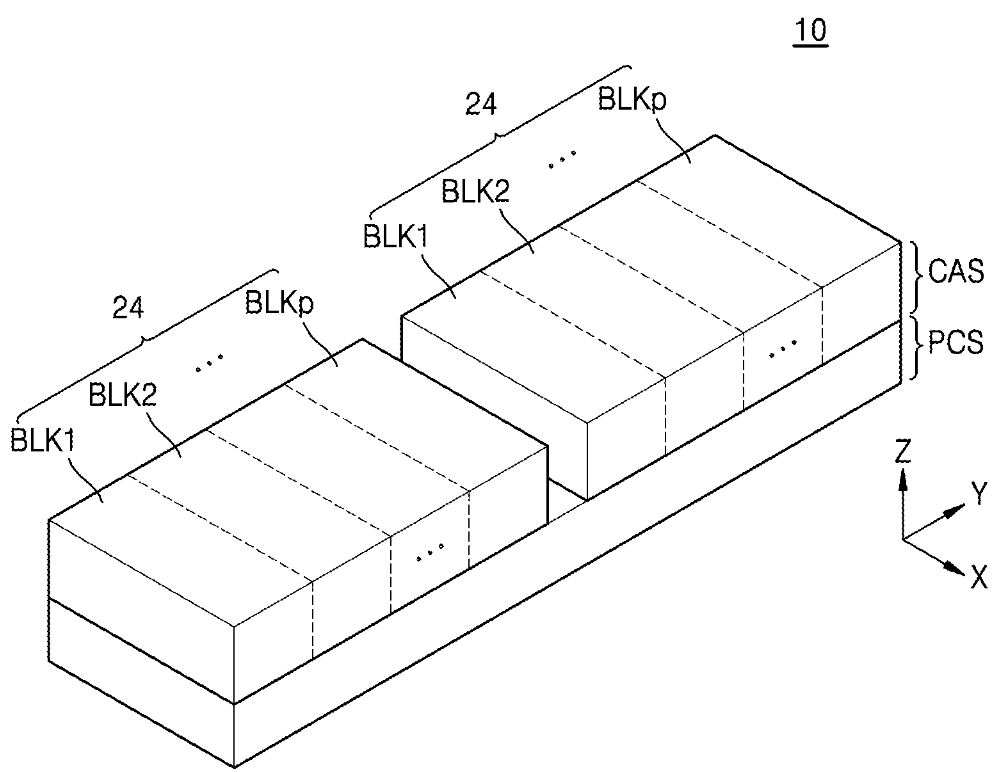
FIG. 2 is a schematic perspective view of a semiconductor device according to embodiments according to the inventive concept.

FIG. 2 is a schematic perspective view of a semiconductor device 10 according to embodiments according to the inventive concept.

Referring to FIG. 2, the semiconductor device 10 may include a cell array structure CAS and a peripheral circuit structure PCS overlapping each other in the vertical direction (Z direction). The cell array structure CAS may include the memory cell array 20 described with reference to FIG. 1. The peripheral circuit structure PCS may include the peripheral circuit 30 described with reference to FIG. 1. Although FIG. 2 illustrates a structure in which the cell array structure CAS and the peripheral circuit structure PCS are at different vertical levels and overlap each other in the vertical direction (Z direction), the technical idea of the inventive concept is not limited thereto. For example, the cell array structure CAS and the peripheral circuit structure PCS may be on the same vertical level.

The cell array structure CAS may include a plurality of tiles 24. Each of the plurality of tiles 24 may include a plurality of memory cell blocks BLK1, BLK2, . . . , BLKp. Each of the plurality of memory cell blocks BLK1, BLK2, . . . , BLKp may include three-dimensionally arranged memory cells.

In example embodiments, two tiles 24 may constitute one mat, but the inventive concept is not limited thereto. The memory cell array 20 described with reference to FIG. 1 may include a plurality of mats, for example, four mats, but is not limited thereto.

Figure 3:
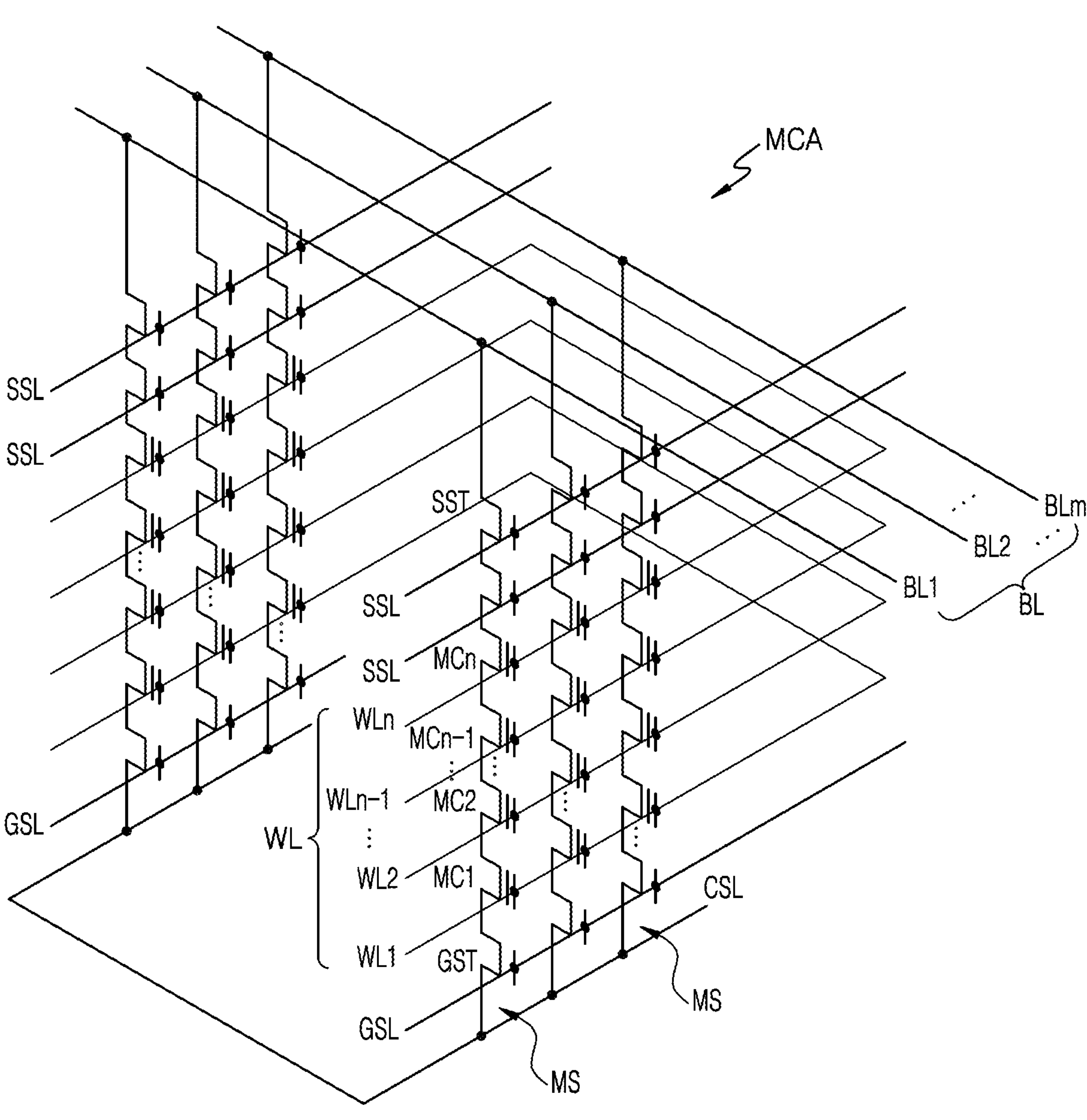
FIG. 3 is an equivalent circuit diagram of a memory cell array of a semiconductor device according to embodiments of the inventive concept.

FIG. 3 is an equivalent circuit diagram of a memory cell array MCA of a semiconductor device according to embodiments of the inventive concept. FIG. 3 illustrates an equivalent circuit diagram of a vertical NAND flash memory device having a vertical channel structure. The plurality of memory cell blocks BLK1, BLK2, . . . , BLKp illustrated in FIGS. 1 and 2 may each include a memory cell array MCA having the circuit configuration illustrated in FIG. 3.

Referring to FIG. 3, the memory cell array MCA may include a plurality of memory cell strings MS. The memory cell array MCA includes a plurality of bit lines BL: BL1, BL2, . . . , BLm, a plurality of word lines WL: WL1, WL2, . . . , WLn−1, WLn, at least one string select line SSL, at least one ground select line GSL, and a common source line CSL. A plurality of memory cell strings MS may be formed between the plurality of bit lines BL and the common source line CSL. FIG. 3 illustrates a case in which each of the plurality of memory cell strings MS includes one ground select line GSL and two string select lines SSL, but the technical idea of the inventive concept is not limited thereto. For example, each of the plurality of memory cell strings MS may include one string select line SSL.

Each of the plurality of memory cell strings MS may include a string select transistor SST, a ground select transistor GST, and a plurality of memory cell transistors MC1, MC2, . . . , MCn−1, MCn. A drain region of the string select transistor SST may be connected to the bit line BL, and a source region of the ground select transistor GST may be connected to the common source line CSL. The common source line CSL may be a region in which the source regions of the plurality of ground selection transistors GST are commonly connected.

The string select transistor SST may be connected to the string select line SSL, and the ground select transistor GST may be connected to the ground select line GSL. The plurality of memory cell transistors MC1, MC2, . . . , MCn−1, MCn may be respectively connected to the word line WL.

Figure 4:
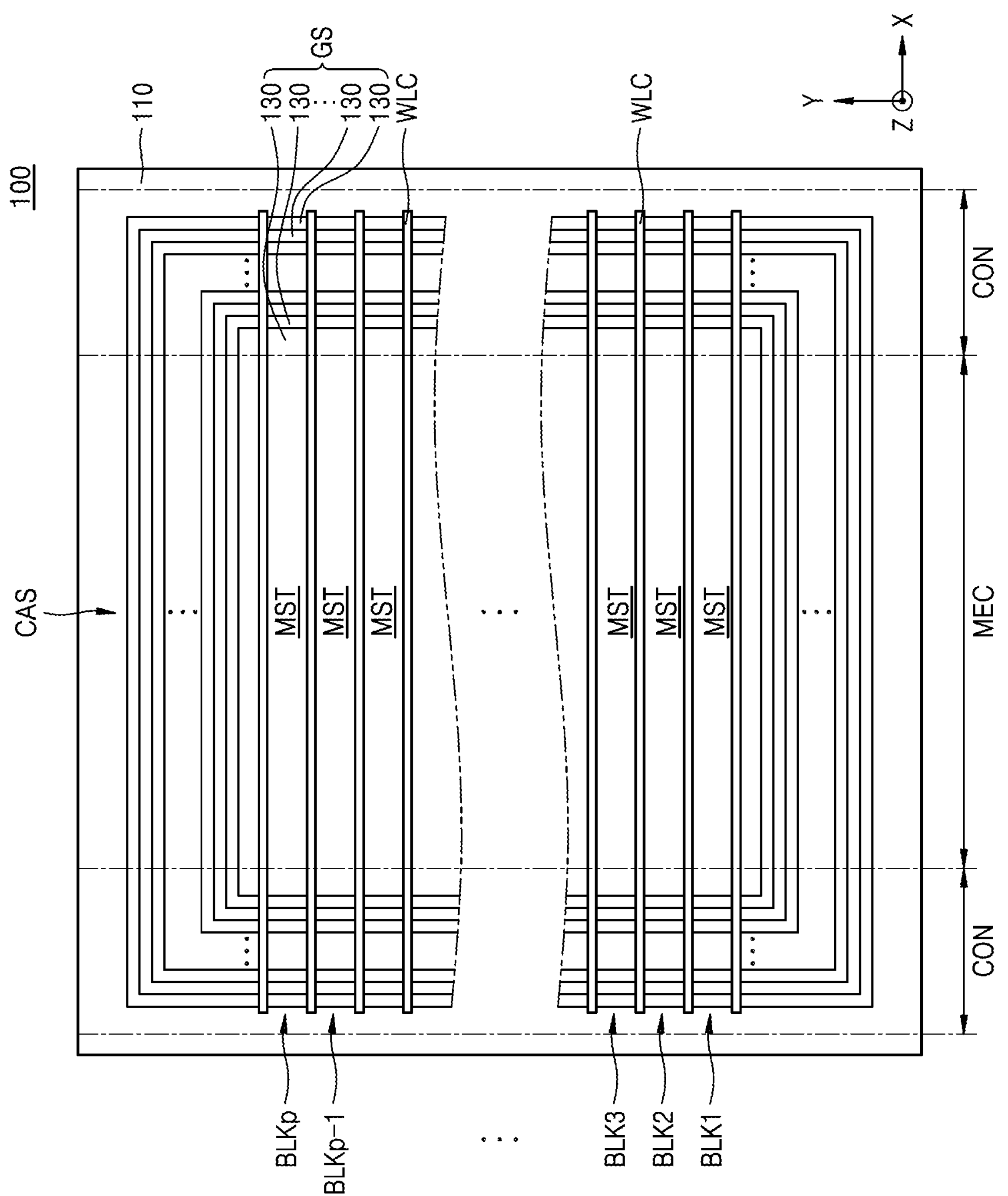
FIG. 4 is a schematic plan view of a partial region of a semiconductor device according to embodiments of the inventive concept.

FIG. 4 is a schematic plan view of a partial region of a semiconductor device 100 according to embodiments of the inventive concept.

Referring to FIG. 4, the cell array structure CAS of the semiconductor device 100 may include a substrate 110 and a plurality of memory cell blocks BLK1, BLK2, . . . , BLKp−1, and BLKp on the substrate 110.

The peripheral circuit 30 described with reference to FIG. 1 may be under the substrate 110 or in another region on the substrate 110. In example embodiments, the plurality of memory cell blocks BLK1, BLK2, . . . , BLKp−1, and BLKp may overlap the peripheral circuit structure PCS (refer to FIG. 2) in the vertical direction (Z direction) with the substrate 110 arranged therebetween.

The cell array structure CAS may include a memory cell region MEC and a connection region CON on both sides of the memory cell area MEC in the first horizontal direction (X direction). The plurality of memory cell blocks BLK1, BLK2, . . . , BLKp−1, and BLKp may each include a memory stack structure MST extending in a first horizontal direction (X direction) across the memory cell region MEC and the connection region CON, respectively. The memory stack structure MST may include a plurality of gate lines 130 stacked to overlap each other in the vertical direction (Z direction) in the memory cell region MEC and the connection region CON on the substrate 110. The plurality of gate lines 130 in each of the plurality of memory stack structures MST may constitute the gate stack GS. In each of the plurality of memory stack structures MST, the plurality of gate lines 130 may constitute the ground select line GSL, the plurality of word lines WL, and the string select line SSL illustrated in FIG. 3. The plurality of memory stack structures MST may include a plurality of memory stacks respectively at different vertical levels in the vertical direction (Z direction) and overlapping each other in the vertical direction (Z direction). Each of the plurality of memory stacks may include a plurality of gate lines 130 overlapping each other in a vertical direction (Z direction). In example embodiments, each of the plurality of memory stacks may include 48, 64, or 96 gate lines 130 stacked to overlap each other in a vertical direction (Z direction), but is not limited thereto.

In example embodiments, areas of the plurality of gate lines 130 included in the plurality of memory stack structures MST may gradually decrease as the distance from the substrate 110 increases. A central portion of each of the plurality of gate lines 130 overlapping each other in the vertical direction (Z direction) constitutes a memory cell region MEC, and an edge portion of each of the plurality of gate lines 130 may constitute a connection region CON.

A plurality of word line cut structures WLC extending in a first horizontal direction (X direction) from the memory cell region MEC and the connection region CON may be on the substrate 110. The plurality of word line cut structures WLC may be spaced apart from each other in the second horizontal direction (Y direction). The plurality of memory cell blocks BLK1, BLK2, . . . , BLKp−1, and BLKp may be between each of the plurality of word line cut structures WLC.

Figure 5:
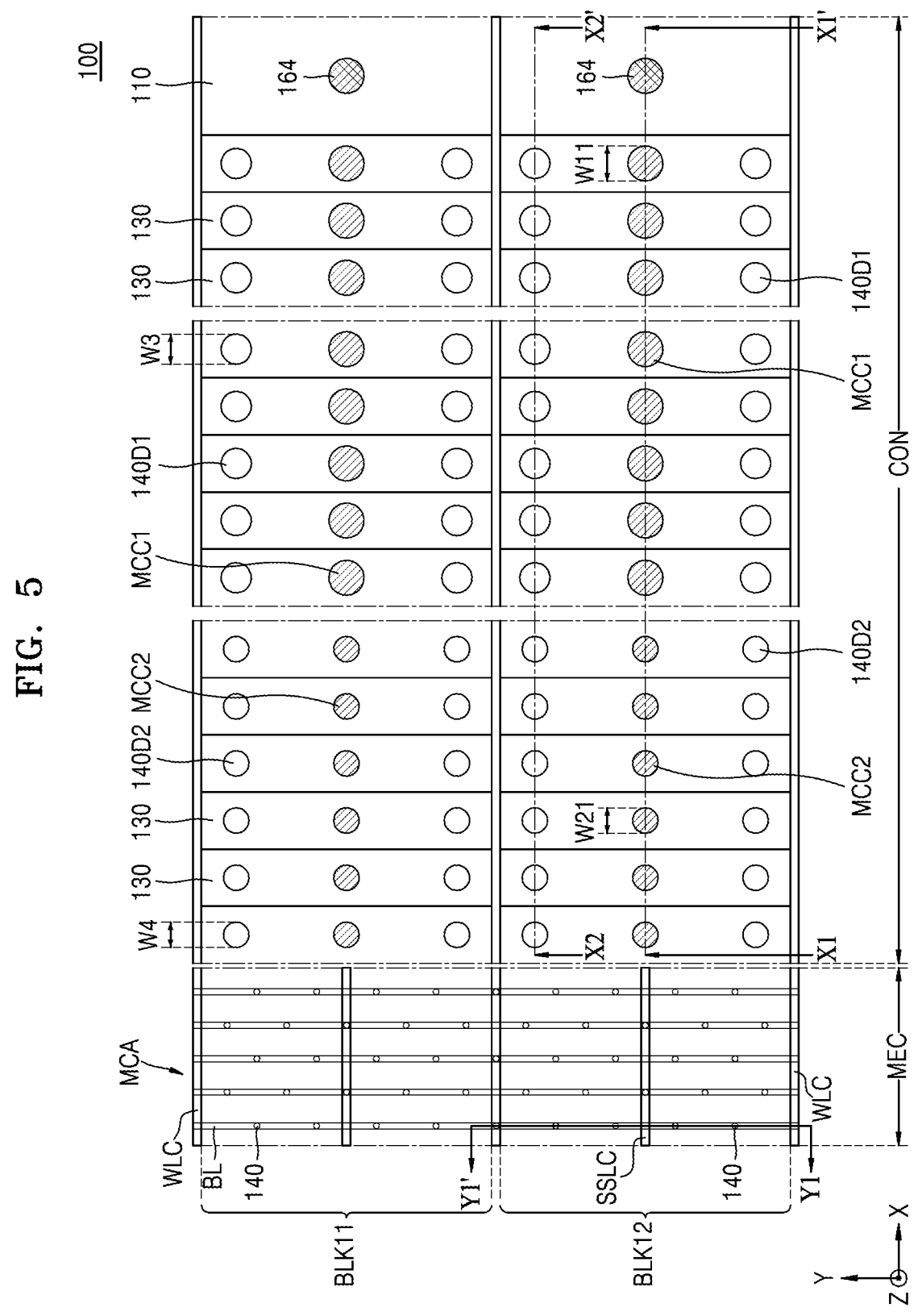
Figure 6A:
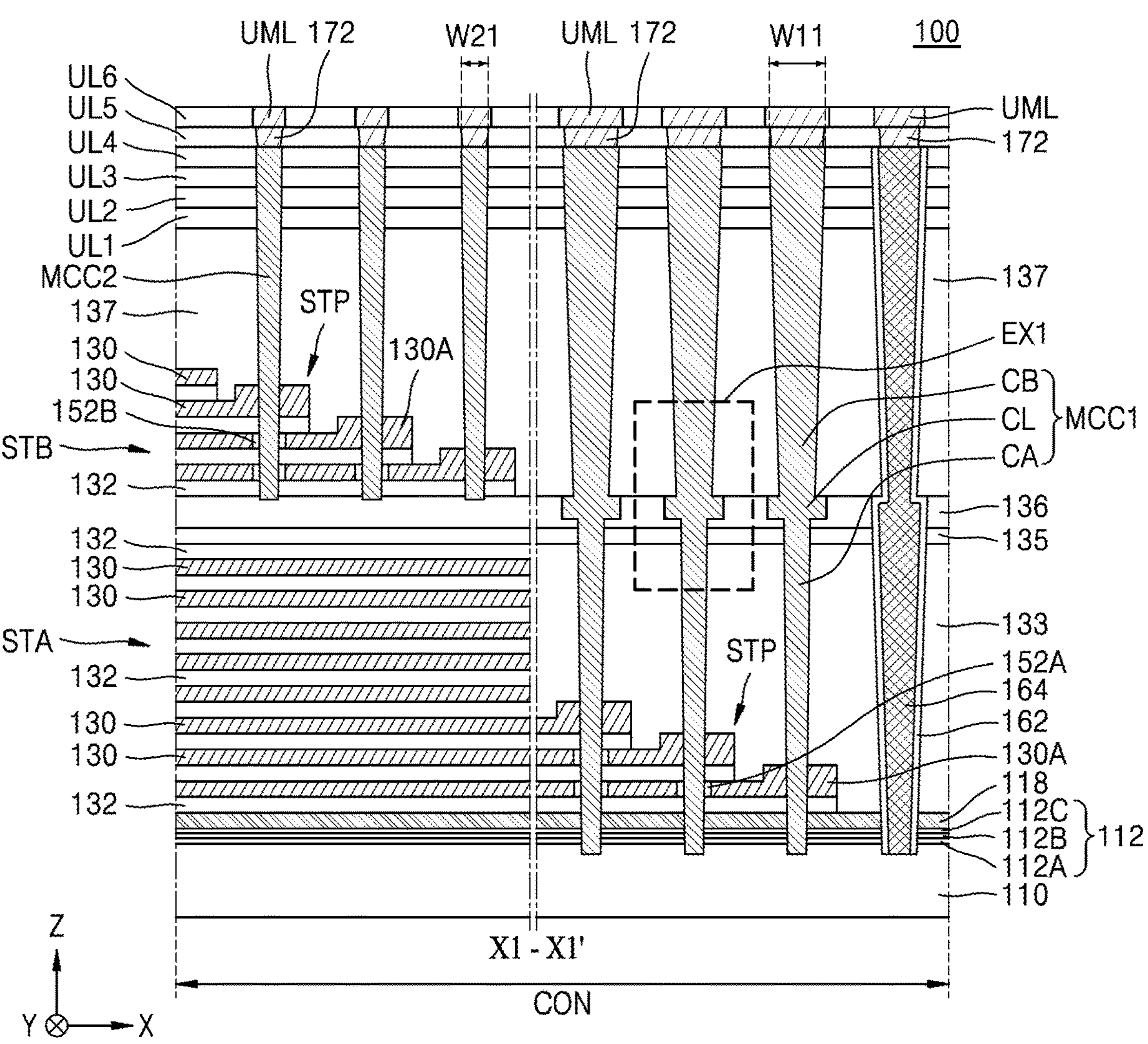
FIG. 6A is a cross-sectional view taken along line X1-X1' of FIG. 5.
Figure 6B:
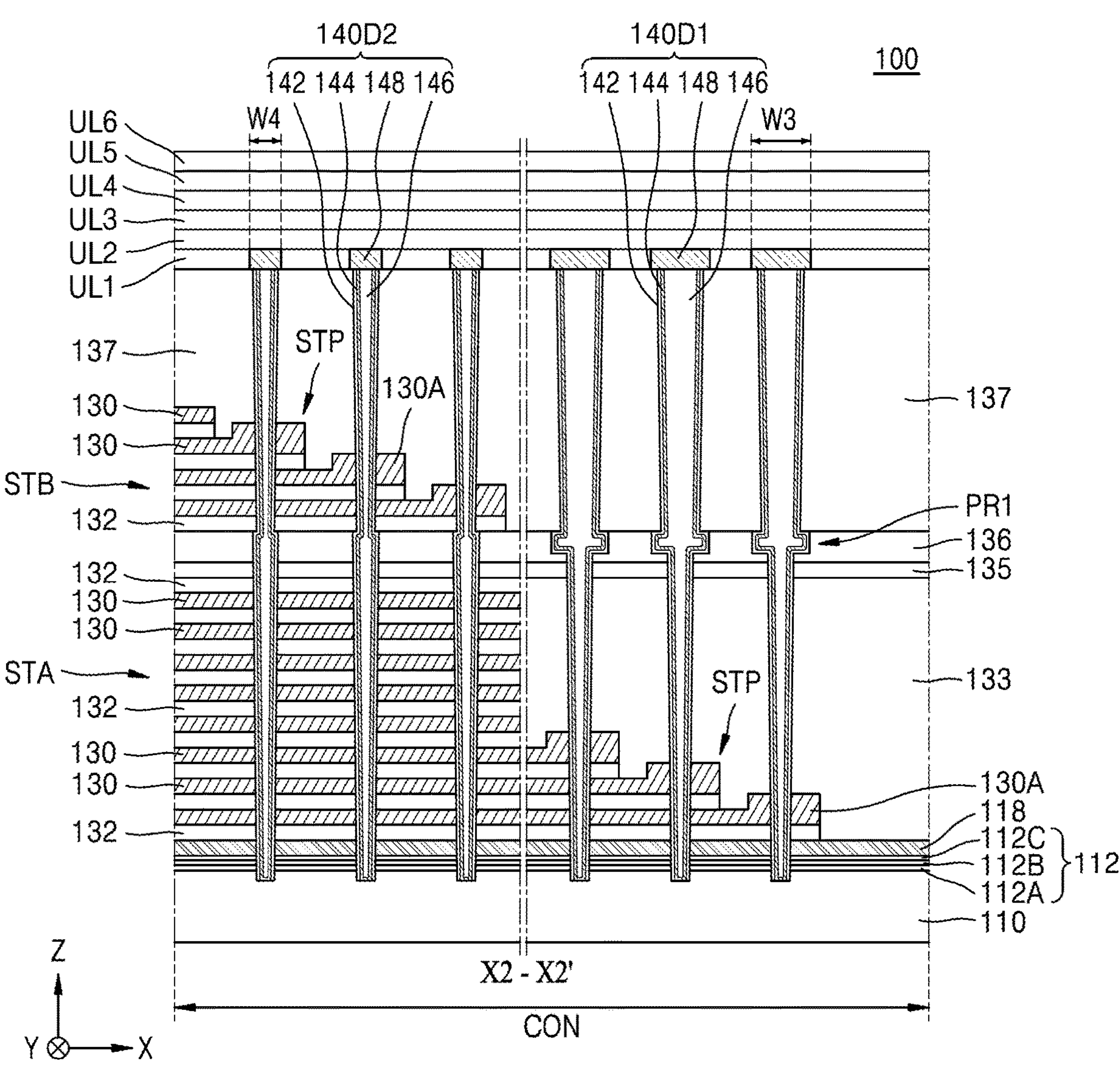
FIG. 6B is a cross-sectional view taken along line X2-X2' of FIG. 5.
Figure 6C:
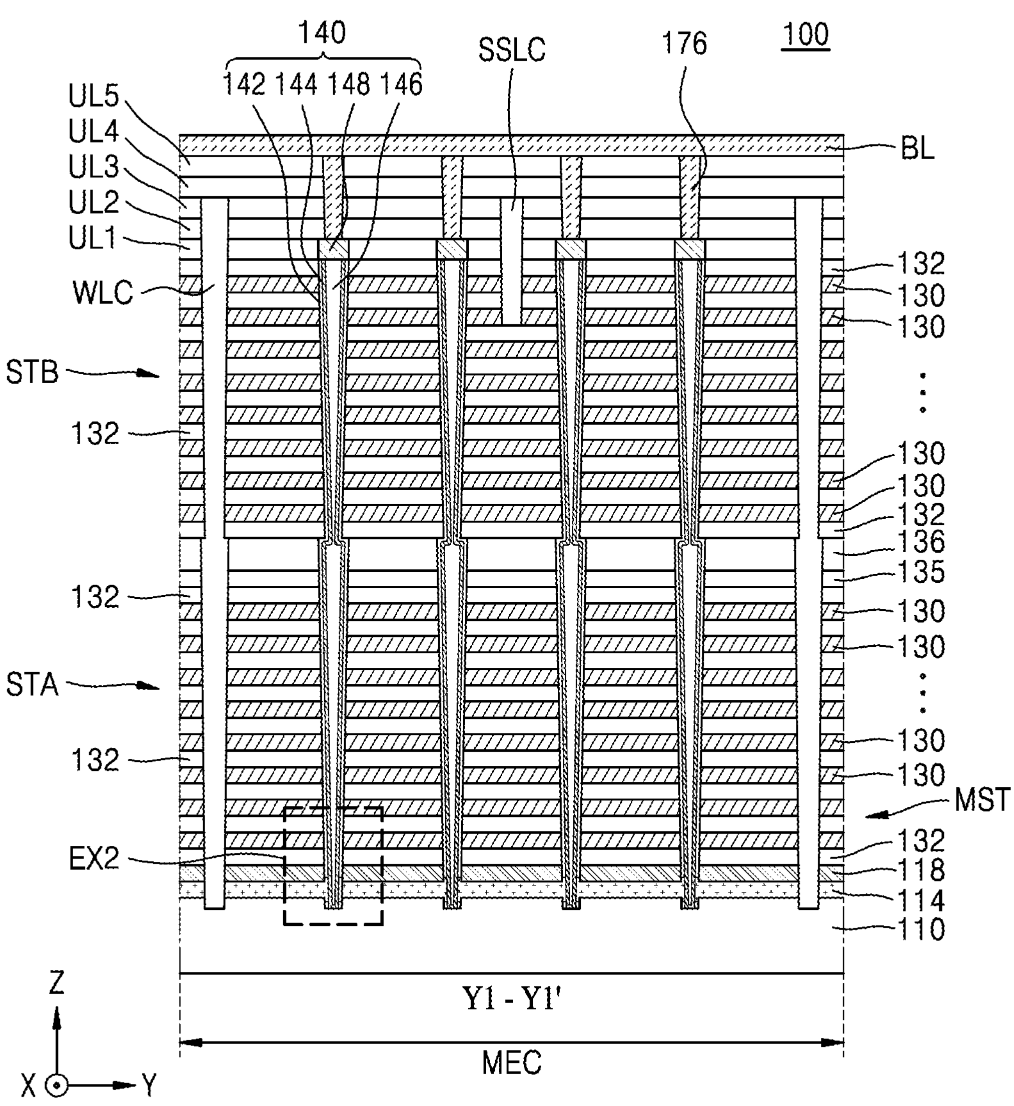
FIG. 6C is a cross-sectional view taken along line Y1-Y1' of FIG. 5.
Figure 6D:
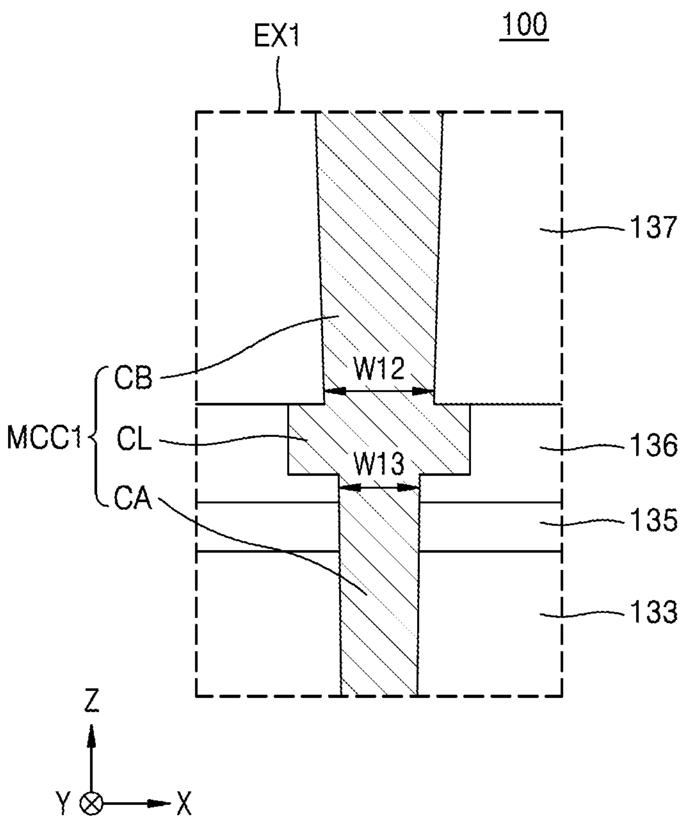
FIG. 6D is an enlarged cross-sectional view of some components included in a region EX1 in FIG. 6A.
Figure 6E:
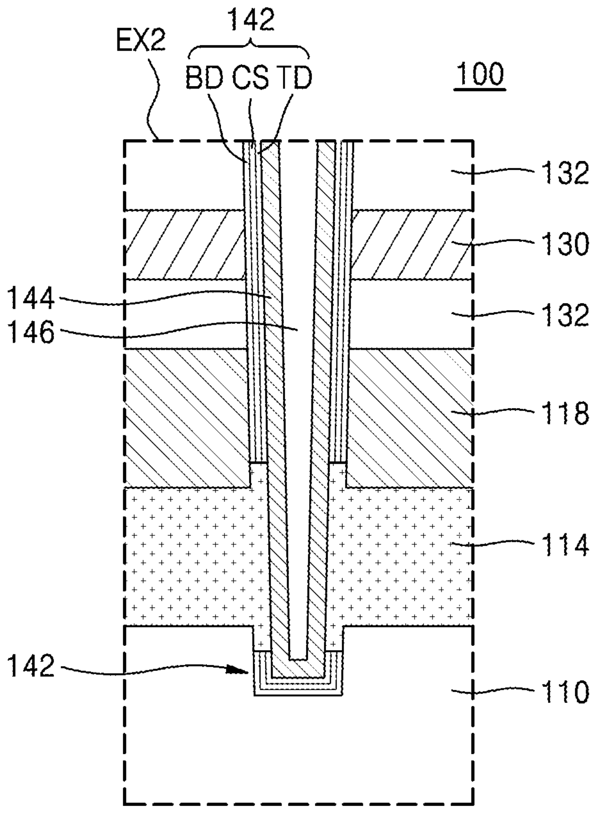
FIG. 6E is an enlarged cross-sectional view of some components included in a region EX2 in FIG. 6C.

FIGS. 5 and 6A to 6E are diagrams for explaining in more detail the semiconductor device 100 according to embodiments according to the inventive concept. In particular, FIG. 5 is a schematic plan view of some components of the memory cell blocks BLK11 and BLK12. FIG. 6A is a cross-sectional view taken along line X1-X1' of FIG. 5. FIG. 6B is a cross-sectional view taken along line X2-X2' of FIG. 5. FIG. 6C is a cross-sectional view taken along line Y1-Y1' of FIG. 5. FIG. 6D is an enlarged cross-sectional view of some components included in the region EX1 in FIG. 6A. FIG. 6E is an enlarged cross-sectional view of some components included in the region EX2 in FIG. 6C. The memory cell blocks BLK11 and BLK12 illustrated in FIG. 5 may each constitute one of the plurality of memory cell blocks BLK1, BLK2, . . . , BLKp−1, and BLKp illustrated in FIG. 4.

Referring to FIGS. 5 and 6A to 6E, the semiconductor device 100 may include a substrate 110 including a memory cell region MEC and a connection region CON, a first stack STA at a first vertical level on the substrate 110, and a second stack STB at a second vertical level higher than the first vertical level on the substrate 110. As used herein, the term “vertical level” refers to a distance in a vertical direction (Z direction or −Z direction) from the upper surface of the substrate 110.

The first stack STA and the second stack STB may each include a stepped connection part STP having a plurality of gate lines 130 overlapping each other in a vertical direction (Z direction) in the memory cell region MEC and a plurality of conductive pad parts 130A in the connection region CON and integrally connected to the plurality of gate lines 130. The first stack STA and the second stack STB may constitute the cell array structure CAS illustrated in FIG. 4. In this specification, the gate line 130 included in the first stack STA may be referred to as a “lower gate line,” and the conductive pad part 130A included in the first stack STA may be referred to as a “lower conductive pad part,” and the stepped connection part STP included in the first stack STA may be referred to as a “lower stepped connection part.” In addition, the gate line 130 included in the second stack STB may be referred to as an “upper gate line,” and the conductive pad part 130A included in the second stack STB may be referred to as an “upper conductive pad part,” and the stepped connection part STP included in the second stack STB may be referred to as an “upper stepped connection part.”

As illustrated in FIGS. 6A and 6B, an insulating plate 112 and a second conductive plate 118 are on the substrate 110 in the connection region CON, and as illustrated in FIG. 6C, a first conductive plate 114 and the second conductive plate 118 may be on the substrate 110 in the memory cell region MEC. A memory stack structure MST including the first stack STA and the second stack STB may be on the second conductive plate 118 in the memory cell region MEC and the connection region CON.

In example embodiments, the first conductive plate 114 and the second conductive plate 118 in the memory cell region MEC may function as the common source line CSL described with reference to FIG. 3. The first conductive plate 114 and the second conductive plate 118 may function as a source region for supplying current to vertical memory cells included in the cell array structure CAS.

In example embodiments, the substrate 110 may be made of a semiconductor material such as polysilicon. Each of the first conductive plate 114 and the second conductive plate 118 may include a doped polysilicon film, a metal film, or a combination thereof. The metal film may be made of tungsten (W), but is not limited thereto. In a memory stack structure MST, a plurality of gate lines 130 extending parallel to each other in the horizontal direction and overlapping each other in the vertical direction (Z direction) may constitute the gate stack GS (refer to FIG. 4). Each of the plurality of gate lines 130 may be formed of a metal, a metal silicide, a semiconductor doped with an impurity, or a combination thereof. For example, the plurality of gate lines 130 may include a metal such as tungsten, nickel, cobalt, tantalum, and the like, a metal silicide such as tungsten silicide, nickel silicide, cobalt silicide, tantalum silicide, and the like, doped polysilicon, or a combination thereof.

An insulating film 132 may be arranged between the second conductive plate 118 and the plurality of gate lines 130 and between each of the plurality of gate lines 130. In each of the first stack STA and the second stack STB, the uppermost gate line 130 of the plurality of gate lines 130 may be covered with an insulating film 132. The insulating film 132 may be made of silicon oxide.

Intermediate insulating films 135 and 136 may be arranged in a third vertical level between the first vertical level where the first stack STA is positioned and the second vertical level where the second stack STB is positioned. The intermediate insulating films 135 and 136 may include the first intermediate insulating film 135 and the second intermediate insulating film 136 sequentially stacked on the first stack STA. Each of the first intermediate insulating film 135 and the second intermediate insulating film 136 may be made of silicon oxide.

As illustrated in FIGS. 5 and 6C, a plurality of word line cut structures WLC may extend in a first horizontal direction (X direction) on the substrate 110 in the memory cell region MEC and the connection region CON. A width in the second horizontal direction (Y direction) of each of the plurality of gate lines 130 included in the memory cell blocks BLK11 and BLK12 may be limited by the plurality of word line cut structures WLC.

Each of the plurality of word line cut structures WLC may have an insulating structure. In example embodiments, the insulating structure may be formed of silicon oxide, silicon nitride, silicon oxynitride, or a low-k material. For example, the insulating structure may include a silicon oxide film, a silicon nitride film, an SiON film, a SiOCN film, a SiCN film, or a combination thereof. In other example embodiments, at least a portion of the insulating structure may be formed of an air gap. As used herein, the term “air” refers to the atmosphere or other gases that may be present during the manufacturing process.

A plurality of gate lines 130 may be stacked to overlap each other in the vertical direction (Z direction) on the second conductive plate 118 between two adjacent word line cut structures WLC. The plurality of gate lines 130 may include the ground select line GSL, the plurality of word lines WL, and the string select line SSL described with reference to FIG. 3.

In the plurality of gate lines 130, the upper two gate lines 130 may be separated in the second horizontal direction (Y direction) with the string select line cut structure SSLC arranged therebetween. The two gate lines 130 separated from each other with the string select line cut structure SSLC therebetween may constitute the string select line SSL described with reference to FIG. 3. FIG. 6C illustrates a case in which one string select line cut structure SSLC is formed in one gate stack GS (refer to FIG. 4) defined by two adjacent string select line cut structures SSLC, but the technical idea of the inventive concept is not limited to that illustrated in FIG. 6C. For example, at least two string select line cut structures SSLC may be formed on one gate stack GS. The string select line cut structure SSLC may be filled with an insulating film. In example embodiments, the string select line cut structure SSLC may include an insulating film including an oxide film, a nitride film, or a combination thereof. In example embodiments, at least a portion of the string select line cut structure SSLC may be formed of an air gap.

As illustrated in FIG. 6C, in the memory cell region MEC, a plurality of channel structures 140 may extend in a vertical direction (Z direction) on the substrate 110 through the plurality of gate lines 130, the plurality of insulating films 132, the first intermediate insulating film 135, the second intermediate insulating film 136, the second conductive plate 118, and the first conductive plate 114. The plurality of channel structures 140 may be arranged to be spaced apart from each other with a predetermined interval therebetween in the first horizontal direction (X direction) and the second horizontal direction (Y direction). Each of the plurality of channel structures 140 may include a gate dielectric film 142, a channel region 144, a buried insulating film 146, and a drain region 148.

As illustrated in FIG. 6E, the gate dielectric film 142 may include a tunneling dielectric film TD, a charge storage film CS, and a blocking dielectric film BD sequentially formed from the channel region 144 toward the gate line 130. The relative thicknesses of the tunneling dielectric film TD, the charge storage film CS, and the blocking dielectric film BD are not limited to those illustrated in FIG. 6E and may be variously modified.

The tunneling dielectric film TD may include silicon oxide, hafnium oxide, aluminum oxide, zirconium oxide, tantalum oxide, or the like. The charge storage film CS is a region in which electrons penetrating the tunneling dielectric film TD from the channel region 144 may be stored, and may include silicon nitride, boron nitride, silicon boron nitride, or polysilicon doped with impurities. The blocking dielectric film BD may be formed of silicon oxide, silicon nitride, or metal oxide having a higher dielectric constant than silicon oxide. The metal oxide may be formed of hafnium oxide, aluminum oxide, zirconium oxide, tantalum oxide, or a combination thereof.

As illustrated in FIGS. 6C and 6E, the first conductive plate 114 penetrates or extends into a partial region of the gate dielectric film 142 in the horizontal direction (X-direction and/or Y-direction) to be in contact with the channel region 144. The thickness (Z direction magnitude) of a portion of the first conductive plate 114 that vertically overlaps with the gate dielectric film 142 may be greater than the thickness (Z direction magnitude) of a portion of the first conductive plate 114 that vertically overlaps the second conductive plate 118. The gate dielectric film 142 may include a portion covering a sidewall of the channel region 144 at a level higher than the first conductive plate 114 and a portion covering a bottom surface of the channel region 144 at a level lower than the first conductive plate 114. The channel region 144 may be spaced apart from the substrate 110 with the lowest portion of the gate dielectric film 142 arranged therebetween. A sidewall of the channel region 144 may be configured to contact the first conductive plate 114 and be electrically connectable to the first conductive plate 114.

As illustrated in FIGS. 6C and 6E, the channel region 144 may have a cylindrical shape.

The channel region 144 may include doped polysilicon or undoped polysilicon.

The buried insulating film 146 may fill the inner space of the channel region 144. The buried insulating film 146 may be made of an insulating material. For example, the buried insulating film 146 may be formed of silicon oxide, silicon nitride, silicon oxynitride, or a combination thereof. In some embodiments, the buried insulating film 146 may be omitted. In this case, the channel region 144 may have a pillar structure without an internal space.

The drain region 148 may be formed of a doped polysilicon film. The plurality of drain regions 148 may be insulated from each other by a first upper insulating film UL1 covering the second stack STB. A second upper insulating film UL2 and a third upper insulating film UL3 may be sequentially formed on the plurality of channel structures 140 and the first upper insulating film UL1 in the memory cell region MEC.

The string select line cut structure SSLC may penetrate the first upper insulating film UL1, the second upper insulating film UL2, and the third upper insulating film UL3 in the vertical direction (Z direction). The upper surface of the string select line cut structure SSLC, the upper surface of the word line cut structure WLC, and the upper surface of the second upper insulating film UL2 may extend at substantially the same vertical level. A fourth upper insulating film UL4 and a fifth upper insulating film UL5 may be sequentially formed on the string select line cut structure SSLC, the word line cut structure WLC, and the third upper insulating film UL3. Each of the first upper insulating film UL1, the second upper insulating film UL2, the third upper insulating film UL3, the fourth upper insulating film UL4, and the fifth upper insulating film UL5 may include an oxide film, a nitride film, or a combination thereof.

As shown in FIGS. 5 and 6C, a plurality of bit lines BL may be on the fifth upper insulating film UL5 in the memory cell region MEC of the memory stack structure MST. The plurality of bit lines BL may extend parallel to each other in the second horizontal direction (Y direction). The plurality of channel structures 140 may be connected to a plurality of bit lines BL, respectively, through a plurality of contact plugs 176 penetrating the second upper insulating film UL2, the third upper insulating film UL3, the fourth upper insulating film UL4, and the fifth upper insulating film UL5.

As shown in FIGS. 6A and 6B, in the connection region CON, an insulating plate 112 and a second conductive plate 118 may be sequentially stacked on the substrate 110. The insulating plate 112 may have a multilayer structure including a first insulating film 112A, a second insulating film 112B, and a third insulating film 112C sequentially stacked on the substrate 110. In example embodiments, the first insulating film 112A and the third insulating film 112C may include a silicon oxide film, and the second insulating film 112B may include a silicon nitride film.

In the connection region CON, a conductive pad part 130A having a greater thickness in the vertical direction (Z direction) than other portions of the gate line 130 may be formed at one end of each of the plurality of gate lines 130 included in the first stack STA and the second stack STB. The conductive pad part 130A may be integrally connected with an edge portion of the gate line 130 that is farthest from the memory cell region MEC. FIGS. 6A and 6B show only the conductive pad part 130A connected to one end of some of the gate lines 130 among the plurality of gate lines 130, but another gate line 130 may also be integrally connected to the conductive pad part 130A in other portions not shown in FIGS. 6A and 6B.

In the connection region CON, an edge portion of each of the plurality of gate lines 130, the plurality of conductive pad parts 130A, and the plurality of insulating films 132 included in the first stack STA may be covered with a lower insulating block 133. The lower insulating block 133 may contact each of the plurality of gate lines 130, the plurality of conductive pad parts 130A, and the plurality of insulating films 132 included in the first stack STA. In the connection region CON, an edge portion of each of the plurality of gate lines 130, the plurality of conductive pad parts 130A, and the plurality of insulating films 132 included in the second stack STB may be covered with the upper insulating block 137. The upper insulating block 137 may contact each of the plurality of gate lines 130, the plurality of conductive pad parts 130A, and the plurality of insulating films 132 included in the second stack STB. The lower insulating block 133 and the upper insulating block 137 may be formed of a silicon oxide film, but are not limited thereto.

As shown in FIGS. 5 and 6A, a plurality of memory cell contacts MCC1 and MCC2 may be in the connection region CON. A plurality of memory cell contacts MCC1 and MCC2 may be configured to be electrically connectable to one lower conductive pad part 130A selected from a plurality of conductive pad parts 130A included in the first stack STA and the second stack STB, respectively.

The plurality of memory cell contacts MCC1 and MCC2 may include a plurality of first memory cell contacts MCC1 and a plurality of second memory cell contacts MCC2 having different greatest widths in a horizontal direction. In this specification, each of the plurality of first memory cell contacts MCC1 may be referred to as a first plug structure, and each of the plurality of second memory cell contacts MCC2 may be referred to as a second plug structure.

The plurality of first memory cell contacts MCC1 may be at positions spaced apart from each other in the horizontal direction (X direction in FIG. 6A) from the stepped connection part STP included in the second stack STB. The plurality of first memory cell contacts MCC1 may be configured to penetrate the stepped connection part STP, the lower insulating block 133, the first intermediate insulating film 135, the second intermediate insulating film 136, and the upper insulating block 137 included in the first stack STA in the vertical direction (Z direction), and configured to be electrically connectable to one conductive pad part 130A selected from a plurality of conductive pad parts 130A included in the first stack STA. A width in the horizontal direction of each of the plurality of first memory cell contacts MCC1 may have a greatest value at a vertical level in which the second intermediate insulating film 136 is positioned.

Each of the plurality of second memory cell contacts MCC2 may be configured to penetrate the stepped connection part STP included in the second stack STB in the vertical direction (Z direction), and may be configured to be electrically connectable to one conductive pad part 130A selected from a plurality of conductive pad parts 130A included in the second stack STB.

As shown in FIGS. 5 and 6A, the plurality of first memory cell contacts MCC1 may be spaced apart from the plurality of second memory cell contacts MCC2 in the horizontal direction. The first width W11 of the uppermost surface of each of the plurality of first memory cell contacts MCC1 in the horizontal direction (e.g., the X direction) may be greater than the second width W21 of the uppermost surface of each of the plurality of second memory cell contacts MCC2.

As illustrated in FIG. 6A, each of the plurality of first memory cell contacts MCC1 may include a lower plug portion CA, an upper plug portion CB, and a plug landing portion CL between the lower plug portion CA and the upper plug portion CB. The lower plug portion CA may be at a first vertical level together with the first stack STA and include a portion penetrating the stepped connection part STP included in the first stack STA. The upper plug portion CB may be at a second vertical level together with the second stack STB, and may be surrounded by the upper insulating block 137 included in the second stack STB. The plug landing portion CL may be at a third vertical level between the first vertical level and the second vertical level, and may have the greatest width from the first memory cell contacts MCC1 in a horizontal direction. The plug landing portion CL may protrude in a horizontal direction further than a horizontal position of the sidewalls of the lower plug portion CA and the upper plug portion CB, respectively. Sidewalls and a bottom surface of the plug landing portion CL may be surrounded by the second intermediate insulating film 136.

At least a portion of the plurality of first memory cell contacts MCC1 may include a portion surrounded by the lower insulating block 133. In each of the plurality of first memory cell contacts MCC1, the lower plug portion CA has an uppermost portion adjacent to the bottom of the plug landing portion CL, and the upper plug portion CB may have a lowermost portion adjacent to the upper surface of the plug landing portion CL. As illustrated in FIG. 6D, in the horizontal direction (e.g., the X direction), the width W12 of the lowest portion of the upper plug portion CB may be greater than the width W13 of the uppermost portion of the lower plug portion CA.

As illustrated in FIG. 6A, the plurality of first memory cell contacts MCC1 and the plurality of second memory cell contacts MCC2 may each pass through at least a portion of the plurality of gate lines 130 and the plurality of insulating films 132. Each of the plurality of first memory cell contacts MCC1 and the plurality of second memory cell contacts MCC2 may be positioned in a hole penetrating at least one of the plurality of gate lines 130. Each of the plurality of first memory cell contacts MCC1 and the plurality of second memory cell contacts MCC2 may be connected to one gate line 130 selected from the plurality of gate lines 130, and may not be connected to other gate lines 130 except for the one selected gate line 130. Each of the plurality of first memory cell contacts MCC1 and the plurality of second memory cell contacts MCC2 may be in contact with the conductive pad part 130A of one gate line 130 selected from the plurality of gate lines 130 and may be connected to the selected one gate line 130 through the conductive pad part 130A.

Each of the plurality of first memory cell contacts MCC1 and the plurality of second memory cell contacts MCC2 may be horizontally spaced apart from other gate lines 130 except for the one selected gate line 130. A first insulating ring 152A may be between each of the plurality of first memory cell contacts MCC1 and the other gate line 130 not connected thereto in the first stack STA. A second insulating ring 152B may be between each of the plurality of second memory cell contacts MCC2 and the other gate line 130 not connected thereto in the second stack STB. In example embodiments, the first insulating ring 152A and the second insulating ring 152B may include a silicon oxide layer, but the inventive concept is not limited thereto.

As shown in FIGS. 5 and 6B, a plurality of dummy channel structures 140D1 and 140D2 may be in the connection region CON. The plurality of dummy channel structures 140D1 and 140D2 may include a plurality of first dummy channel structures 140D1 penetrating the stepped connection part STP included in the first stack STA in the vertical direction (Z direction) and a plurality of second dummy channel structures 140D2 penetrating the stepped connection part STP and the intermediate insulating films 135 and 136 included in each of the first stack STA and the second stack STB in the vertical direction (Z direction). FIG. 6B illustrates a case in which the plurality of first dummy channel structures 140D1 and the plurality of second dummy channel structures 140D2 penetrate the conductive pad part 130A included in the stepped connection part STP in the vertical direction (Z direction), but the technical idea of the inventive concept is not limited to that illustrated in FIG. 6B. For example, at least some of the plurality of first dummy channel structures 140D1 and the plurality of second dummy channel structures 140D2 may also penetrate a portion of the gate line 130 that is horizontally spaced apart from the conductive pad part 130A in the vertical direction (Z direction) in the connection region CON.

In the horizontal direction, a width of each of the plurality of first dummy channel structures 140D1 and a width of each of the plurality of second dummy channel structures 140D2 may be different from each other. In this specification, each of the plurality of first dummy channel structures 140D1 may be referred to as a first plug structure, and each of the plurality of second dummy channel structures 140D2 may be referred to as a second plug structure.

As shown in FIGS. 5 and 6B, the plurality of first dummy channel structures 140D1 and the plurality of second dummy channel structures 140D2 may be spaced apart from each other in a horizontal direction (e.g., an X direction). In the horizontal direction (e.g., the X direction), the width W3 of the upper surface of each of the plurality of first dummy channel structures 140D1 may be greater than the width W4 of the upper surface of each of the plurality of second dummy channel structures 140D2.

The plurality of first dummy channel structures 140D1 may be at positions spaced apart from each other in the horizontal direction (X direction in FIG. 6B) from the stepped connection part STP included in the second stack STB. Each of the plurality of first dummy channel structures 140D1 may penetrate the stepped connection part STP, the lower insulating block 133, the first intermediate insulating film 135, the second intermediate insulating film 136, and the upper insulating block 137 included in the first stack STA in the vertical direction (Z direction). Each of the plurality of first dummy channel structures 140D1 may include a protrusion PR1 having a greatest width in the horizontal direction. Sidewalls and bottom surfaces of the protrusion PR1 of each of the plurality of first dummy channel structures 140D1 may be surrounded by the second intermediate insulating film 136.

Each of the plurality of first dummy channel structures 140D1 and the plurality of second dummy channel structures 140D2 may be arranged to be spaced apart from each other with a predetermined interval therebetween in the first horizontal direction (X direction) and the second horizontal direction (Y direction). Each of the plurality of first dummy channel structures 140D1 and the plurality of second dummy channel structures 140D2 may include a gate dielectric film 142, a channel region 144, a buried insulating film 146, and a drain region 148 like the channel structure 140 in each memory cell region MEC. However, the planar size of each of the plurality of first dummy channel structures 140D1 and the plurality of second dummy channel structures 140D2 may be greater than the planar size of the channel structure 140. The number and arrangement shape of the plurality of first dummy channel structures 140D1 and the plurality of second dummy channel structures 140D2 illustrated in FIG. 5 are merely examples, and the technical idea of the inventive concept is not limited thereto. In the connection region CON, the plurality of first dummy channel structures 140D1 and the plurality of second dummy channel structures 140D2 may be in various arrangements at various positions selected in the memory stack structure MST.

As illustrated in FIGS. 6A and 6B, the upper insulating block 137 in the connection region CON may be covered with the first upper insulating film UL1. The drain region 148 of each of the plurality of first dummy channel structures 140D1 and the plurality of second dummy channel structures 140D2 may be insulated from each other by the first upper insulating film UL1. In the connection region CON, the plurality of first dummy channel structures 140D1 and the plurality of second dummy channel structures 140D2 may be covered with a second upper insulating film UL2.

As illustrated in FIGS. 5 and 6A, a conductive plate contact 164 may be in the connection region CON. The conductive plate contact 164 may extend to the substrate 110 in a vertical direction Z through the fourth upper insulating film UL4, the third upper insulating film UL3, the second upper insulating film UL2, the first upper insulating film UL1, the upper insulating block 137, the intermediate insulating films 135 and 136, the lower insulating block 133, the second conductive plate 118, and the insulating plate 112. A sidewall of the conductive plate contact 164 may be covered with an insulating spacer 162. The insulating spacer 162 may be formed of a silicon oxide film.

Each of the plurality of first memory cell contacts MCC1 and the plurality of second memory cell contacts MCC2 may include a portion penetrating the fourth upper insulating film UL4, the third upper insulating film UL3, the second upper insulating film UL2, and the first upper insulating film ULL.

Each of the plurality of first memory cell contacts MCC1, the plurality of second memory cell contacts MCC2, and the conductive plate contact 164 may be connected to one upper wiring layer UML among the plurality of upper wiring layers UML through the contact plugs 172 penetrating the fifth upper insulating film UL5. The plurality of upper wiring layers UML may be at the same vertical level as the plurality of bit lines BL in the memory cell region MEC. A space between each of the plurality of upper wiring layers UML and the plurality of bit lines BL may be filled with a sixth upper insulating film UL6. The sixth upper insulating film UL6 may include an oxide film, a nitride film, or a combination thereof.

In example embodiments, the plurality of first memory cell contacts MCC1, the plurality of second memory cell contacts MCC2, the conductive plate contact 164, the plurality of contact plugs 172, the plurality of contact plugs 176, the plurality of upper wiring layers UML, and the plurality of bit lines BL each may be made of tungsten, titanium, tantalum, copper, aluminum, titanium nitride, tantalum nitride, tungsten nitride, or a combination thereof, but are not limited thereto.

According to the semiconductor device 100 described with reference to FIGS. 4 to 6E, to improve the degree of integration of the semiconductor device 100, the number of stacks in the vertical direction (Z direction) of the gate lines 130 constituting the memory stack structure MST is increased, and accordingly, even when the cell array structure CAS includes a plurality of stacks including the first stack STA and the second stack STB, the semiconductor device 100 may include plug structures having various cross-sectional shapes and planar sizes according to positions in the connection region CON of the cell array structure CAS, for example, the plurality of first memory cell contacts MCC1 and the plurality of second memory cell contacts MCC2 having different greatest widths in the horizontal direction and the plurality of first dummy channel structures 140D1 and the plurality of second dummy channel structures 140D2 having different greatest widths in the horizontal direction. Therefore, when forming holes with relatively large aspect ratios to form the plug structures, even when it is necessary to etch various films having different etching characteristics under a given etching condition, by forming various holes having different cross-sectional shapes and different planar sizes in regions having different etching environments on the substrate 110, the manufacturing process of the semiconductor device 100 may be facilitated, and electrical characteristics and reliability of the semiconductor device 100 may be maintained.

Figure 7:
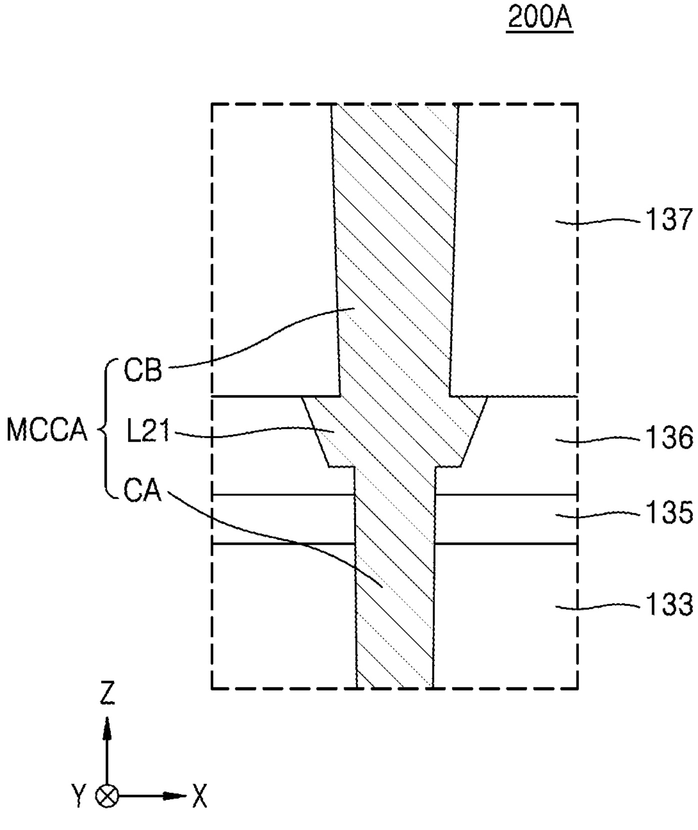
FIGS. 7 to 9 are cross-sectional views each illustrating a semiconductor device according to other embodiments according to the inventive concept.

FIG. 7 is a cross-sectional view for explaining a semiconductor device 200A according to other example embodiments according to the inventive concept. FIG. 7 illustrates some components of a region corresponding to the region EX1 in FIG. 6A.

Referring to FIG. 7, the semiconductor device 200A may have substantially the same configuration as the semiconductor device 100 described with reference to FIGS. 4 to 6E. However, the semiconductor device 200A may include the first memory cell contact MCCA instead of the first memory cell contact MCC1.

The first memory cell contact MCCA may have substantially the same configuration as that described for the first memory cell contact MCC1 illustrated in FIGS. 5 and 6A. However, the first memory cell contact MCCA includes a plug landing portion L21 between the lower plug portion CA and the upper plug portion CB.

The horizontal width of the plug landing portion L21 may be variable in the vertical direction (Z direction). For example, the horizontal width of the plug landing portion L21 may gradually decrease towards the lower plug portion CA, and may have an inverted trapezoidal cross-section.

Figure 8:
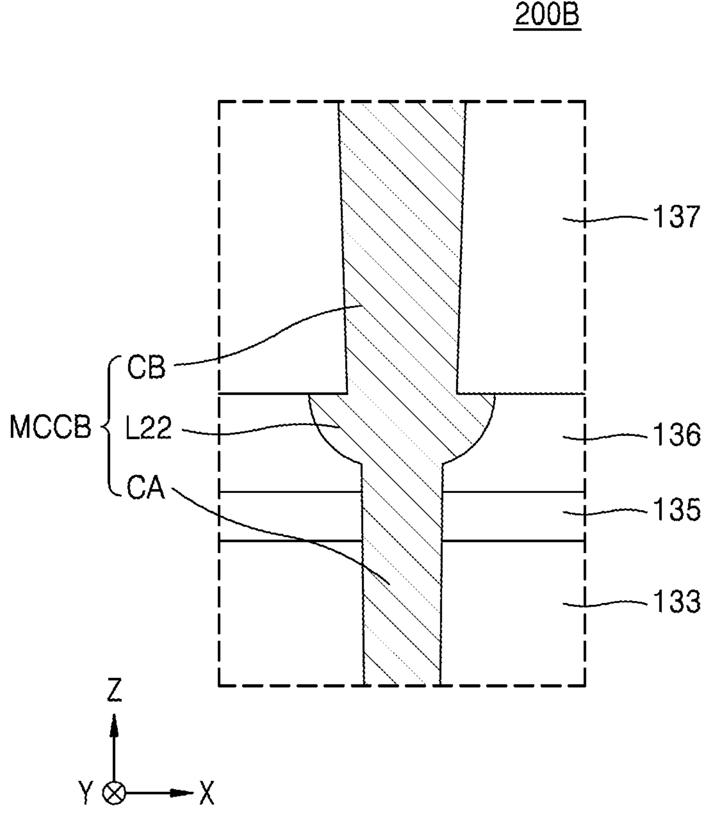

FIG. 8 is a cross-sectional view illustrating a semiconductor device 200B according to some embodiments according to the inventive concept. FIG. 8 illustrates some components of a region corresponding to the region EX1 in FIG. 6A.

Referring to FIG. 8, the semiconductor device 200B may have substantially the same configuration as the semiconductor device 100 described with reference to FIGS. 4 to 6E. However, the semiconductor device 200B may include the first memory cell contact MCCB instead of the first memory cell contact MCC1.

The first memory cell contact MCCB may have substantially the same configuration as that described for the first memory cell contact MCC1 illustrated in FIGS. 5 and 6A. However, the first memory cell contact MCCB includes a plug landing portion L22 between the lower plug portion CA and the upper plug portion CB.

The horizontal width of the plug landing portion L22 may be variable in the vertical direction (Z direction). For example, the horizontal width of the plug landing portion L21 may gradually decrease towards the lower plug portion CA, and may have a semicircular cross-section.

Figure 9:
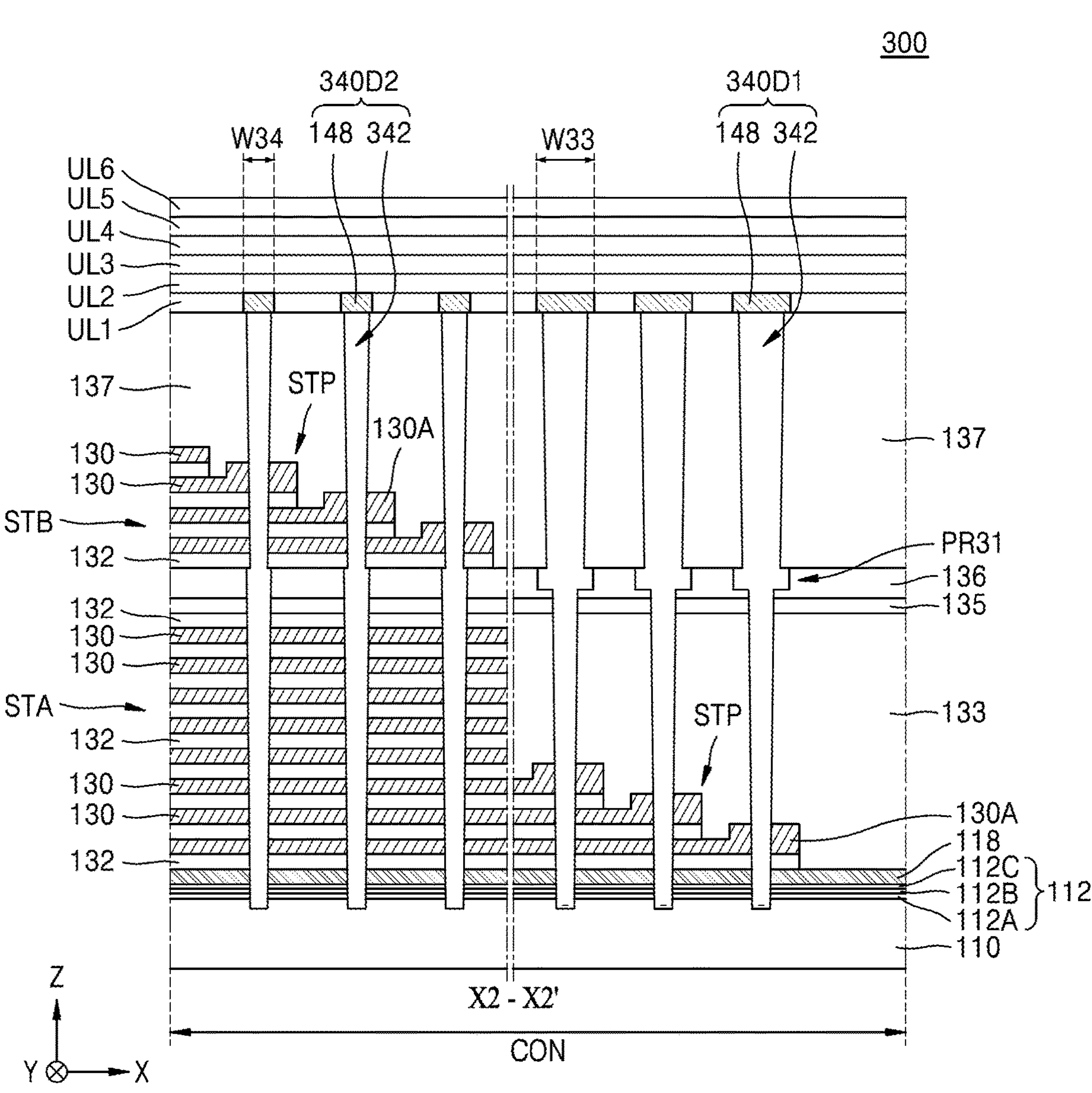

FIG. 9 is a cross-sectional view illustrating a semiconductor device 300 according to some embodiments according to the inventive concept. FIG. 9 illustrates some components of a portion corresponding to the cross-section taken along line X2-X2' of FIG. 5.

Referring to FIG. 9, the semiconductor device 300 may have substantially the same configuration as the semiconductor device 100 described with reference to FIGS. 4 to 6E. However, the semiconductor device 300 includes a plurality of first dummy channel structures 340D1 and a plurality of second dummy channel structures 340D2 instead of the plurality of first dummy channel structures 140D1 and the plurality of second dummy channel structures 140D2.

The plurality of first dummy channel structures 340D1 and the plurality of second dummy channel structures 340D2 may have substantially the same configuration as those described for the plurality of first dummy channel structures 140D1 and the plurality of second dummy channel structures 140D2. However, the plurality of first dummy channel structures 340D1 and the plurality of second dummy channel structures 340D2 may each include a dummy insulating structure 342 instead of the gate dielectric film 142, the channel region 144, and the buried insulating film 146 illustrated in FIG. 6B. In example embodiments, the drain region 148 in each of the plurality of first dummy channel structures 340D1 and the plurality of second dummy channel structures 340D2 may be omitted.

In the horizontal direction, a width of each of the plurality of first dummy channel structures 340D1 and a width of each of the plurality of second dummy channel structures 340D2 may be different from each other. In this specification, each of the plurality of first dummy channel structures 340D1 may be referred to as a first plug structure, and each of the plurality of second dummy channel structures 340D2 may be referred to as a second plug structure. The plurality of first dummy channel structures 340D1 and the plurality of second dummy channel structures 340D2 may be spaced apart from each other in a horizontal direction (e.g., an X direction). In the horizontal direction (e.g., the X direction), the width W33 of the upper surface of each of the plurality of first dummy channel structures 340D1 may be greater than the width W34 of the upper surface of each of the plurality of second dummy channel structures 340D2.

The dummy insulating structure 342 included in the plurality of first dummy channel structures 340D1 may include a protrusion PR31 having a greatest width in a horizontal direction.

Sidewalls and a bottom surface of the protrusion PR31 may be surrounded by the second intermediate insulating film 136. In example embodiments, the dummy insulating structure 342 may be formed of silicon oxide, but is not limited thereto.

Figure 10A:
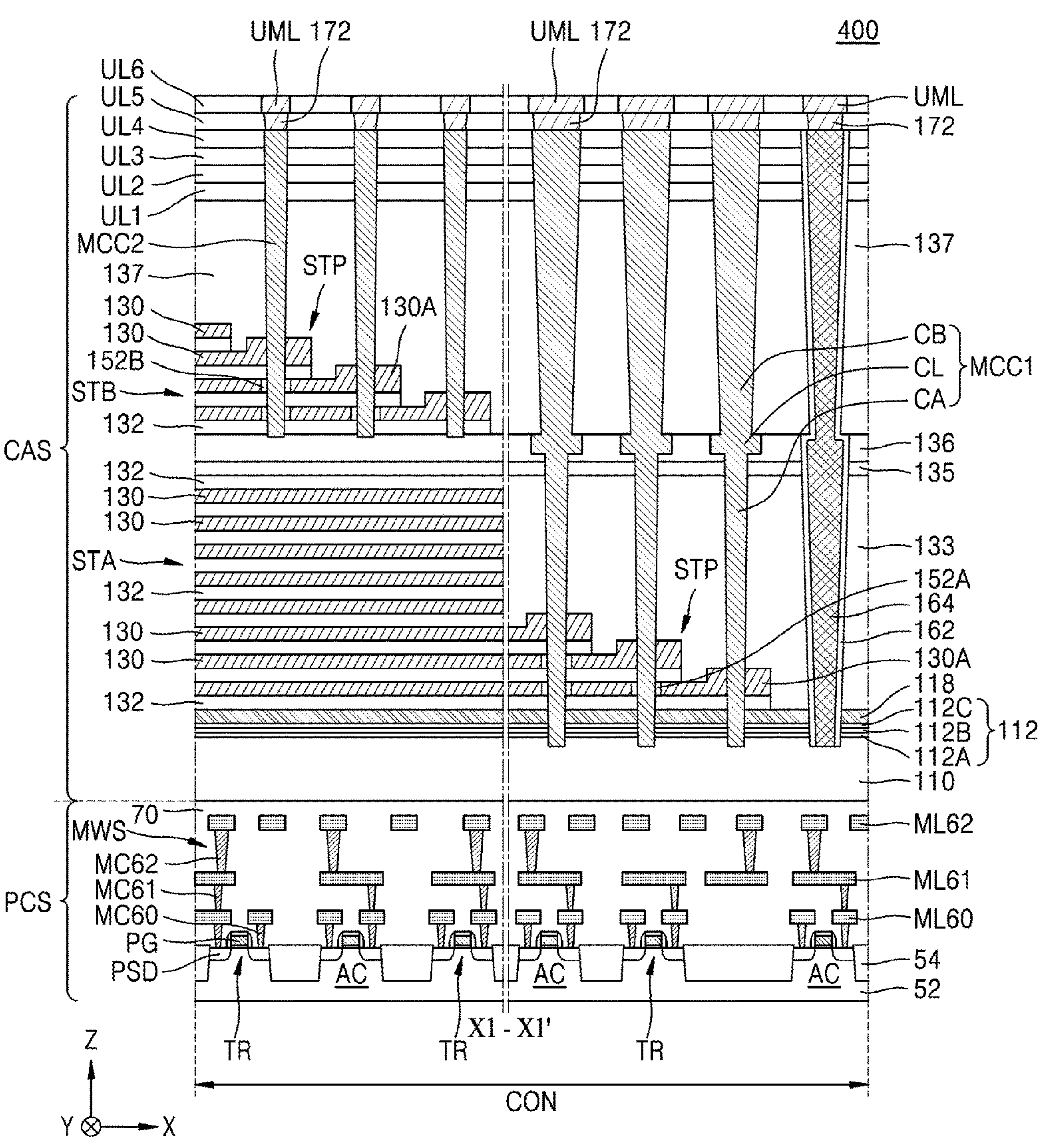
FIGS. 10A, 10B, and 10C are cross-sectional views illustrating semiconductor devices according to some embodiments according to the inventive concept.
Figure 10B:
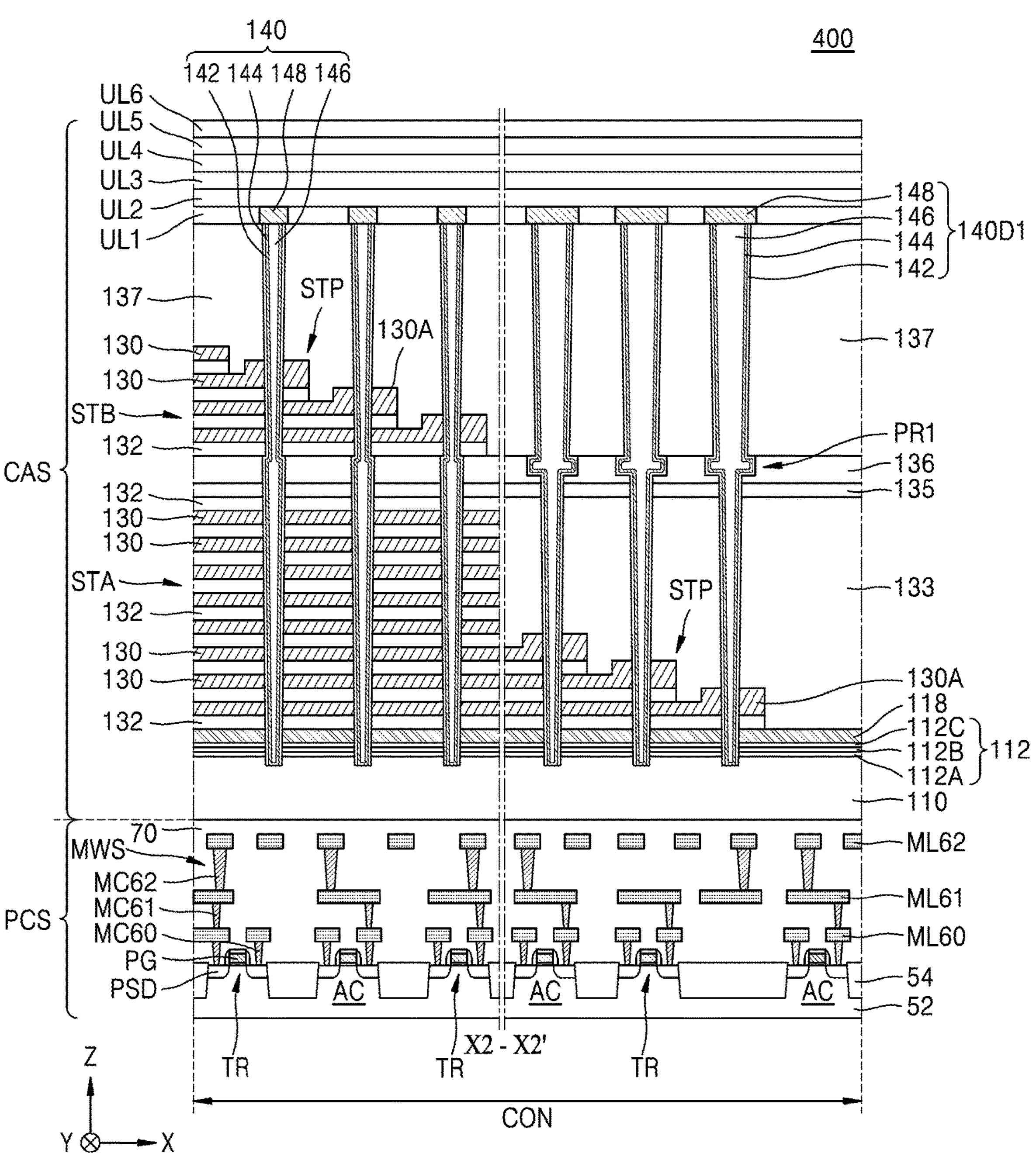
Figure 10C:
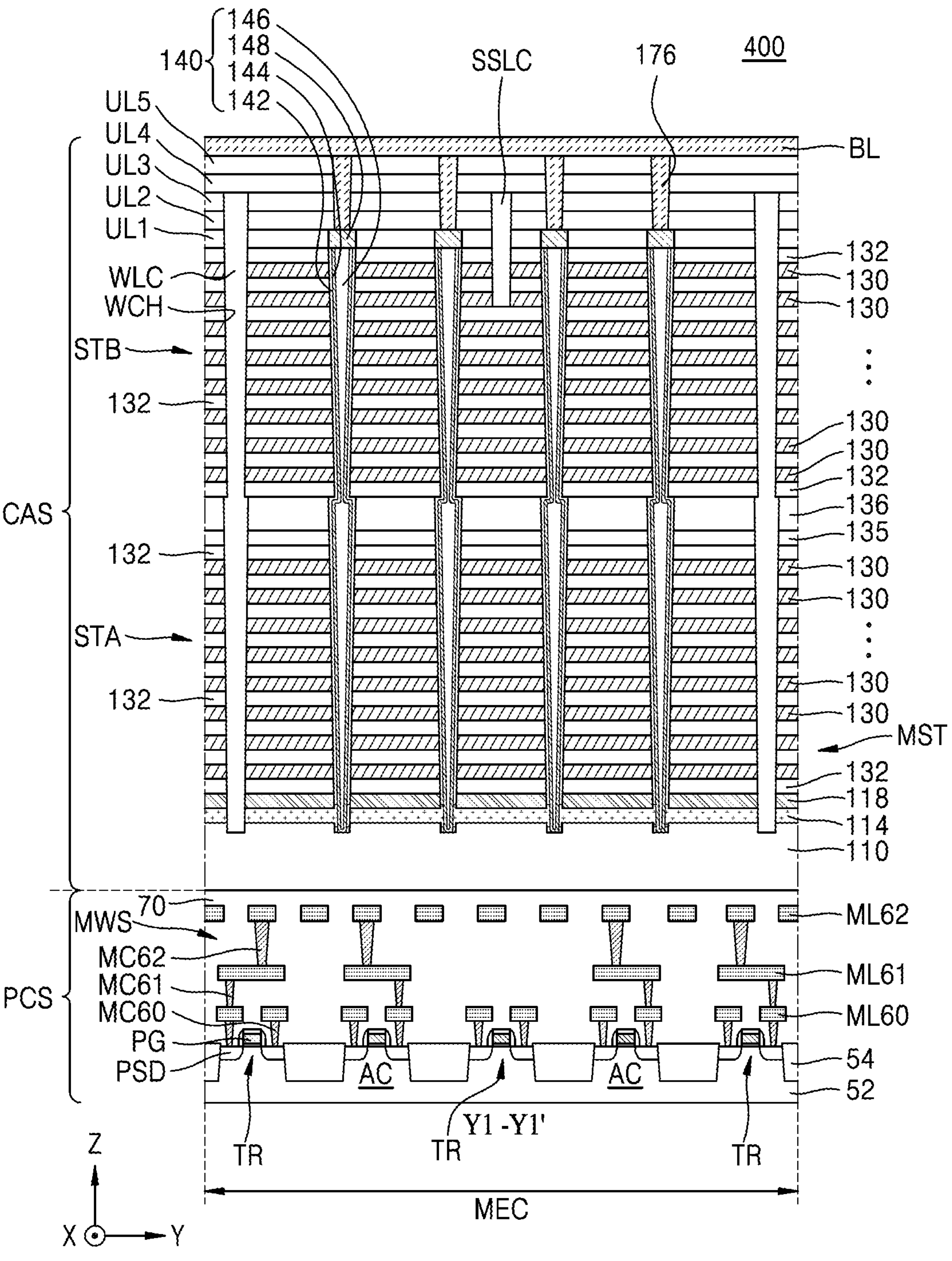

FIGS. 10A, 10B, and 10C are cross-sectional views illustrating a semiconductor device 400 according to some embodiments according to the inventive concept, and FIG. 10A is a cross-sectional view of some components of a portion corresponding to the cross-section taken along line X1-X1' of FIG. 5, and FIG. 10B is a cross-sectional view of some components of a portion corresponding to the cross-section taken along line X2-X2' of FIG. 5, and FIG. 10C is a cross-sectional view of some components of a portion corresponding to the cross-section along line Y1

Y1' of FIG. 5. In FIGS. 10A, 10B, and 10C, the same reference numerals as in FIGS. 6A to 6C denote the same members, and detailed descriptions thereof are omitted herein.

Referring to FIGS. 10A, 10B, and 10C, the semiconductor device 400 may have substantially the same configuration as the semiconductor device 100 described with reference to FIGS. 4 to 6E. However, the semiconductor device 400 may include a cell array structure CAS and a peripheral circuit structure PCS overlapping each other in the vertical direction (Z direction). The cell array structure CAS may include the memory cell array 20 described with reference to FIG. 1. The peripheral circuit structure PCS may include the peripheral circuit 30 described with reference to FIG. 1. The cell array structure CAS may have substantially the same configuration as described with reference to FIGS. 5 and 6A to 6E.

The peripheral circuit structure PCS may include a lower substrate 52, a plurality of peripheral circuits formed on the lower substrate 52, and a multilayer wiring structure MWS for interconnecting the plurality of peripheral circuits or for connecting the plurality of peripheral circuits to components in the memory cell region MEC.

The lower substrate 52 may include a semiconductor substrate. For example, the lower substrate 52 may include Si, Ge, or SiGe. An active region AC may be defined in the lower substrate 52 by a device isolation film 54. A plurality of transistors TR constituting a plurality of peripheral circuits may be formed in the active region AC. Each of the plurality of transistors TR may include a gate PG and a plurality of ion implantation regions PSD formed in the active region AC at both sides of the gate PG. Each of the plurality of ion implantation regions PSD may constitute a source region or a drain region of the transistor TR.

The plurality of peripheral circuits included in the peripheral circuit structure PCS may include various circuits included in the peripheral circuit 30 described with reference to FIG. 1. In example embodiments, a plurality of peripheral circuits included in the peripheral circuit structure PCS may include the row decoder 32, the page buffer 34, the data I/O circuit 36, the control logic 38, and the common source line driver 39 illustrated in FIG. 1.

The multilayer wiring structure MWS included in the peripheral circuit structure PCS may include a plurality of peripheral circuit wiring layers ML60, ML61, and ML62 and a plurality of peripheral circuit contacts MC60, MC61, and MC62. At least some of the plurality of peripheral circuit wiring layers MHL60, ML61, and ML62 may be configured to be electrically connectable to the transistor TR. The plurality of peripheral circuit contacts MC60, MC61, and MC62 may be configured to interconnect some of the plurality of transistors TR and the plurality of peripheral circuit wiring layers ML60, ML61 and ML62.

In FIGS. 10A, 10B, and 10C, the multilayer wiring structure MWS is illustrated as having three wiring layers in the vertical direction (Z direction), but the technical idea of the inventive concept is not limited to that illustrated in FIGS. 10A, 10B, and 10C. For example, a multilayer wiring structure MWS may have two or more wiring layers.

Each of the plurality of peripheral circuit wiring layers MHL60, ML61, and MHL62 and the plurality of peripheral circuit contacts MC60, MC61, and MC62 may be formed of a metal, a conductive metal nitride, a metal silicide, or a combination thereof. For example, the plurality of peripheral circuit wiring layers MHL60, ML61, and ML62 and the plurality of peripheral circuit contacts MC60, MC61, and MC62 may each include a conductive material such as tungsten, molybdenum, titanium, cobalt, tantalum, nickel, tungsten silicide, titanium silicide, cobalt silicide, tantalum silicide, or nickel silicide.

The plurality of transistors TR and the multilayer wiring structure MWS included in the peripheral circuit structure PCS may be covered with an interlayer insulating film 70. The interlayer insulating film 70 may include silicon oxide, SiON, SiOCN, or the like.

As illustrated in FIGS. 10A and 10B, the substrate 110 is on the peripheral circuit structure PCS in the connection region CON of the cell array structure CAS, and an insulating plate 112, a second conductive plate 118, a first stack STA, and a second stack STB may be sequentially stacked on the substrate 110.

As illustrated in FIG. 10C, the substrate 110 is on the peripheral circuit structure PCS in the memory cell region MEC of the cell array structure CAS, and a first conductive plate 114, a second conductive plate 118, a first stack STA, and a second stack STB may be sequentially stacked on the substrate 110.

Figure 12:
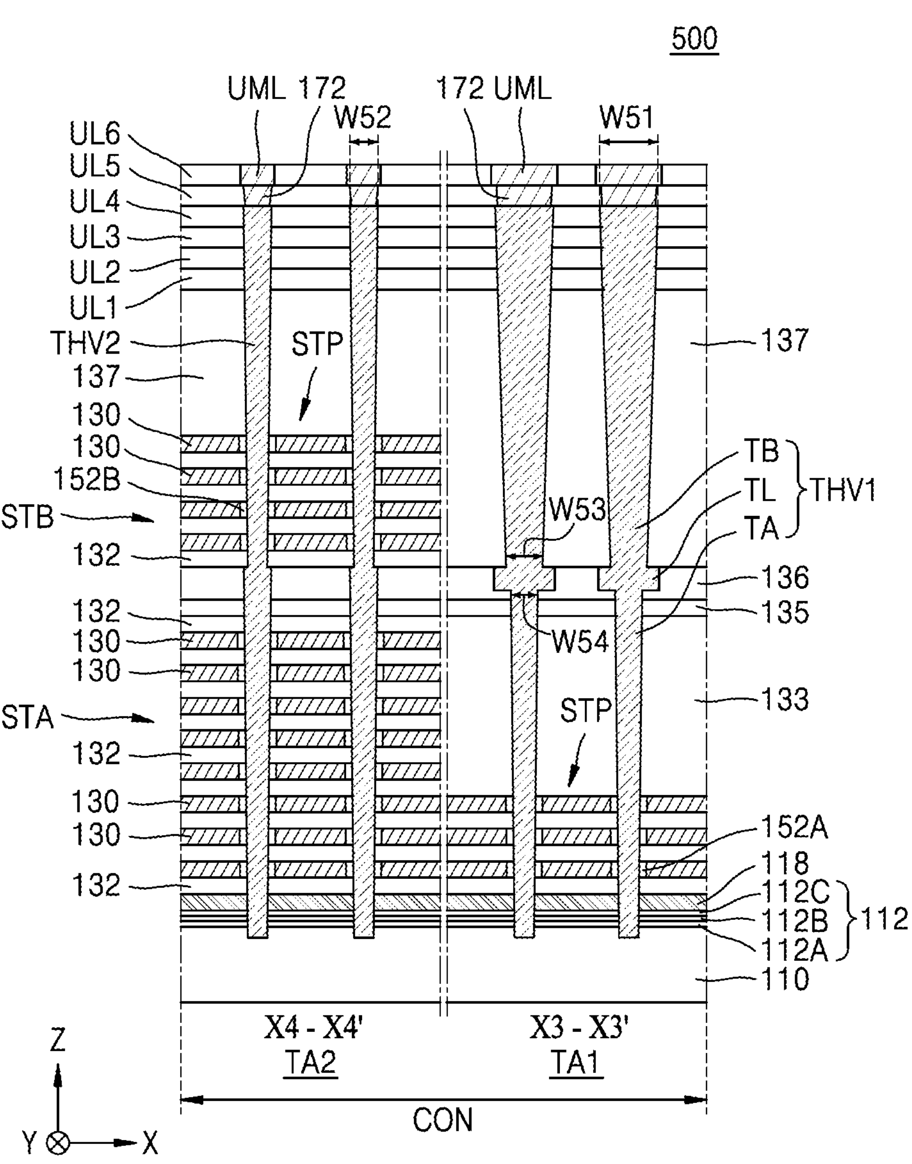
FIG. 12 is a cross-sectional view showing the configurations of the cross-section taken along the line X3-X3' and the cross-section along the line X4-X4' of FIG. 11.

FIG. 11 is a schematic plan view of some components of memory cell blocks BLK51 and BLK52 included in a semiconductor device 500 according to other embodiments of the inventive concept. FIG. 12 is a cross-sectional view showing the configurations of a cross-section taken along line X3-X3' and a cross-section taken along line X4-X4' of FIG. 11. In FIGS. 11 and 12, the same reference numerals as in FIGS. 5 and 6A to 6C denote the same members, and detailed descriptions thereof are omitted herein.

Referring to FIGS. 10 and 11, the semiconductor device 500 may have substantially the same configuration as the semiconductor device 100 described with reference to FIGS. 4 to 6E.

However, the semiconductor device 500 may further include the memory cell blocks BLK51 and BLK52. The memory cell blocks BLK51 and BLK52 may include a plurality of through electrode regions TA1 and TA2 including a plurality of through electrodes THV1 and THV2 in the connection region CON.

The plurality of through electrode regions TA1 and TA2 may include a plurality of first through electrode regions TA1 and a plurality of second through electrode regions TA2 spaced apart from each other in a horizontal direction. The plurality of first through electrode regions TA1 may each include a plurality of first through electrodes THV1, and the plurality of second through electrode regions TA2 may each include a plurality of second through electrodes THV2. In this specification, each of the plurality of first through electrodes THV1 may be referred to as a first plug structure, and each of the plurality of second through electrodes THV2 may be referred to as a second plug structure.

Each of the plurality of first through electrodes THV1 may penetrate the stepped connection part STP included in the first stack STA in the vertical direction (Z direction), and may not penetrate the stepped connection part STP included in the second stack STB. Each of the plurality of second through electrodes THV2 may penetrate the stepped connection part STP included in the first stack STA and the stepped connection part STP included in the second stack STB in the vertical direction (Z direction). The plurality of first through electrodes THV1 and the plurality of second through electrodes THV2 may each be configured not to be electrically connected (e.g., to be electrically insulated from) to the gate line 130 and the conductive pad part 130A included in the first stack STA and the second stack STB.

Each of the plurality of first through electrodes THV1 may be at a position spaced apart from the stepped connection part STP included in the second stack STB in the horizontal direction (e.g., the X direction). A width in the horizontal direction of each of the plurality of first through electrodes THV1 may have a greatest value at a vertical level in which the second intermediate insulating film 136 is positioned.

The plurality of first through electrodes THV1 may be at positions spaced apart from the plurality of second through electrodes THV2 in the horizontal direction. The first width W51 of the uppermost surface of each of the plurality of first through electrodes THV1 in the horizontal direction (e.g., the X direction) may be greater than the second width W52 of the uppermost surface of each of the plurality of second through electrodes THV2.

As illustrated in FIG. 12, the plurality of first through electrodes THV1 may each include a lower plug portion TA, an upper plug portion TB, and a plug landing portion TL between the lower plug portion TA and the upper plug portion TB. The lower plug portion TA may be on a first vertical level together with the first stack STA and include a portion penetrating the stepped connection part STP included in the first stack STA. The upper plug portion TB may be on a second vertical level together with the second stack STB, and may be surrounded by the upper insulating block 137 included in the second stack STB. The plug landing portion TL may be at a third vertical level between the first vertical level and the second vertical level, and may have a width greater than the first through electrodes THV1 in a horizontal direction. The plug landing portion TL may protrude in a horizontal direction further than a horizontal position of the sidewalls of each of the lower plug portion TA and the upper plug portion TB. Sidewalls and a bottom surface of the plug landing portion TL may be surrounded by the second intermediate insulating film 136.

At least a portion of the plurality of first through electrodes THV1 may include a portion surrounded by the lower insulating block 133. In each of the plurality of first through electrodes THV1, the lower plug portion TA may have an uppermost portion adjacent to the bottom surface of the plug landing portion TL, and the upper plug portion TB may have a lowermost portion adjacent to the upper surface of the plug landing portion TL. As illustrated in FIG. 12, in the horizontal direction (e.g., the X direction), the width W53 of the lowermost portion of the upper plug portion TB may be greater than the width W54 of the uppermost portion of the lower plug portion TA.

As illustrated in FIG. 12, the plurality of first through electrodes THV1 and the plurality of second through electrodes THV2 may each pass through at least some of the plurality of gate lines 130 and the plurality of insulating films 132. The plurality of first through electrodes THV1 and the plurality of second through electrodes THV2 may each be in holes penetrating at least one of the plurality of gate lines 130. Each of the plurality of first through electrodes THV1 and the plurality of second through electrodes THV2 may not be connected to the gate line 130. The plurality of first through electrodes THV1 and the plurality of second through electrodes THV2 may be horizontally spaced apart from the gate line 130. Each of the plurality of first through electrodes THV1 and the plurality of second through electrodes THV2 may be made of tungsten, titanium, tantalum, copper, aluminum, titanium nitride, tantalum nitride, tungsten nitride, or a combination thereof, but is not limited thereto.

A first insulating ring 152A may be between the plurality of first through electrodes THV1 and the gate line 130 adjacent thereto in the first stack STA. A second insulating ring 152B may be between the plurality of second through electrodes THV2 and the gate line 130 adjacent thereto in the second stack STB. A detailed configuration of the first insulating ring 152A and the second insulating ring 152B is the same as described with reference to FIG. 6A.

Figure 13:
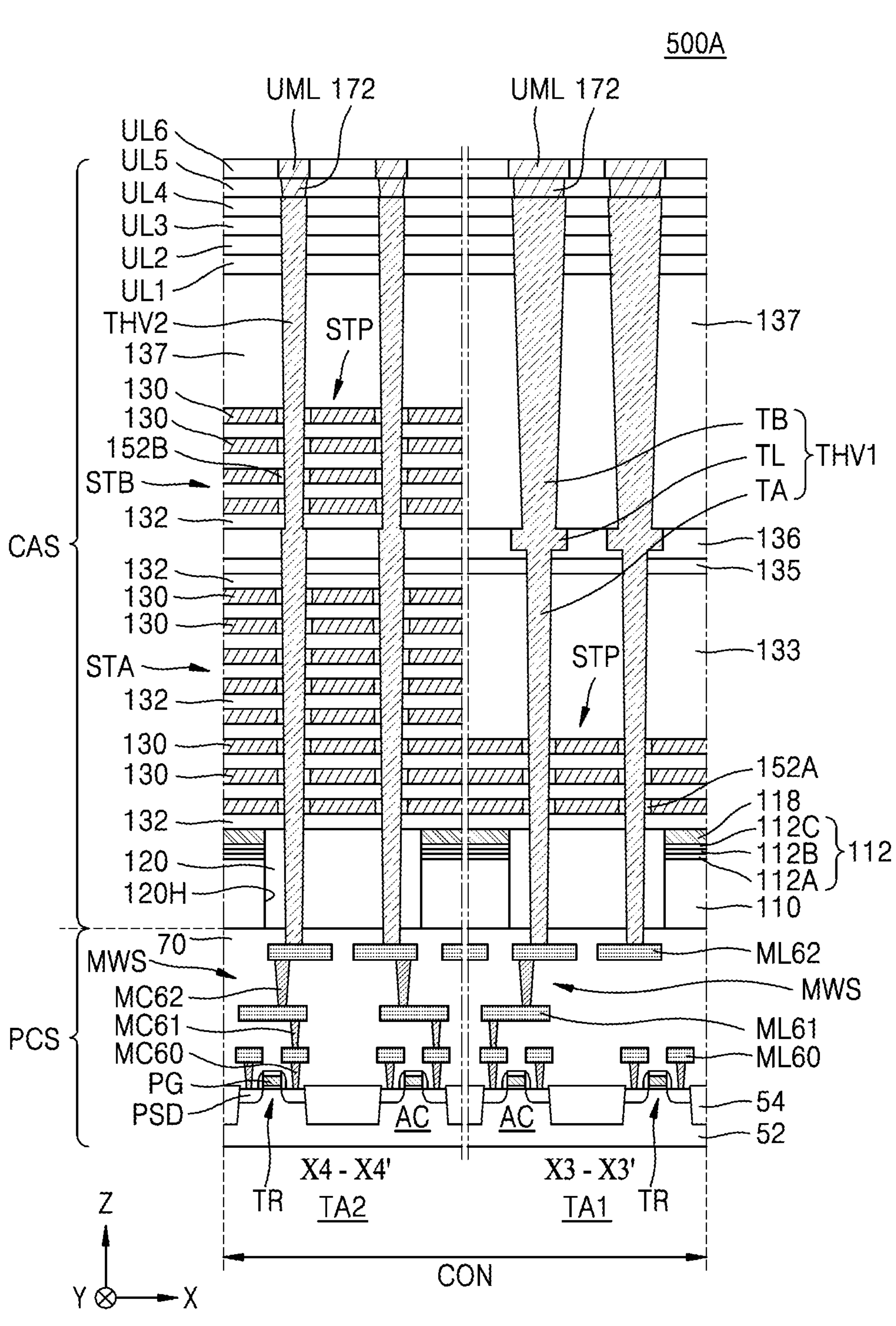
FIGS. 13 to 18 are cross-sectional views each illustrating a semiconductor device according to some embodiments according to the inventive concept.

FIG. 13 is a cross-sectional view illustrating a semiconductor device 500A according to some embodiments according to the inventive concept. FIG. 13 exemplifies some components of parts corresponding to the X3-X3' line cross-section and the X4-X4' line cross-section of FIG. 11.

Referring to FIG. 13, the semiconductor device 500A may have substantially the same configuration as the semiconductor device 500 described with reference to FIGS. 11 and 12. However, the semiconductor device 500A may include a cell array structure CAS and a peripheral circuit structure PCS overlapping each other in the vertical direction (Z direction). The cell array structure CAS may include the memory cell array 20 described with reference to FIG. 1. The peripheral circuit structure PCS may include the peripheral circuit 30 described with reference to FIG. 1. The cell array structure CAS may have substantially the same configuration as described with reference to FIGS. 5 and 6A to 6E. The peripheral circuit structure PCS may have substantially the same configuration as described with reference to FIGS. 10A to 10C.

A plurality of through openings 120H penetrating the substrate 110, the insulating plate 112, and the second conductive plate 118 may be formed in a portion of the connection region CON. Each of the plurality of through openings 120H may be filled with an insulating plug 120. The plurality of through openings 120H may be at positions overlapping with a portion of the peripheral circuit structure PCS in the vertical direction (Z direction). The insulating plug 120 may include a silicon oxide film, a silicon nitride film, or a combination thereof.

In the connection region CON, each of the plurality of first through electrodes THV1 and the plurality of second through electrodes THV2 may be configured to extend to the peripheral circuit structure PCS through the through opening 120H, and thus to be electrically connected to one wiring layer selected from a plurality of peripheral circuit wiring layers ML60, ML61, and ML62. For example, each of the plurality of first through electrodes THV1 and the plurality of second through electrodes THV2 may be configured to be electrically connected to the uppermost peripheral circuit wiring layer ML62 closest to the cell array structure CAS of the peripheral circuit wiring layers ML60, ML61, and ML62.

Each of the plurality of first through electrodes THV1 and the plurality of second through electrodes THV2 may be configured to be connected to at least one peripheral circuit selected from a plurality of peripheral circuits through the multilayer wiring structure MWS included in the peripheral circuit structure PCS.

Figure 14:
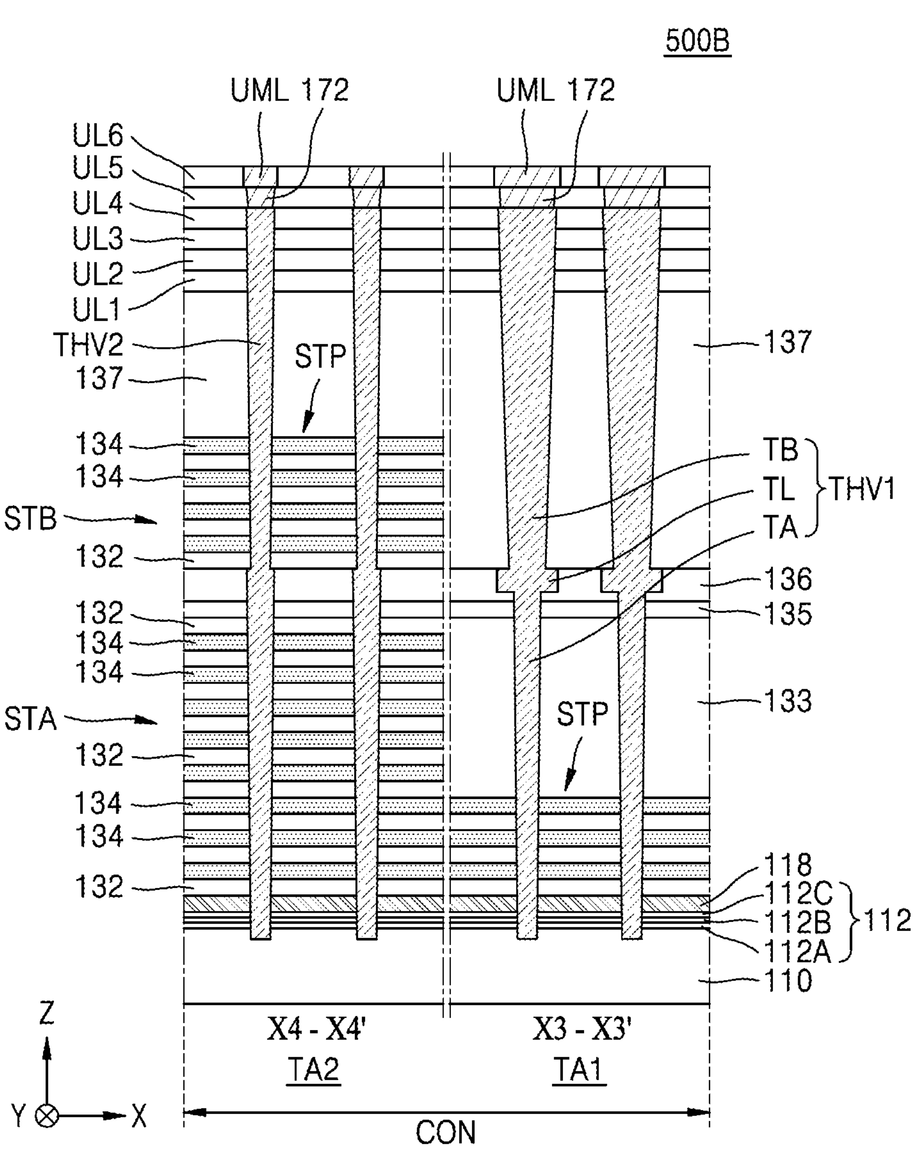

FIG. 14 is a cross-sectional view illustrating a semiconductor device 500B according to some embodiments according to the inventive concept. FIG. 14 exemplifies some components of parts corresponding to the X3-X3' line cross-section and the X4-X4' line cross-section of FIG. 11.

Referring to FIG. 14, the semiconductor device 500B may have substantially the same configuration as the semiconductor device 500 described with reference to FIGS. 11 and 12. However, in relation to the stepped connection part STP included in the first stack STA of the semiconductor device

500B and the stepped connection part STP included in the second stack STB, some regions corresponding to the first through-electrode region TA1 and the second through-electrode region TA2, may have a structure in which some regions of the plurality of gate lines 130 (refer to FIGS. 6A to 6C) are replaced with the sacrificial insulating film 134. In the first through electrode region TA1 and the second through electrode region TA2, the sidewalls of each of the plurality of first through electrodes THV1 and the plurality of second through electrodes THV2 may have a structure in which the sidewalls are surrounded by the plurality of insulating films 132 and the plurality of sacrificial insulating films 134. In example embodiments, the plurality of sacrificial insulating films 134 may be formed of a silicon nitride film.

In example embodiments, a dam structure (not shown) may be arranged between the insulating structure including the plurality of insulating films 132 and the plurality of sacrificial insulating films 134 and the plurality of gate lines 130 (refer to FIGS. 6A to 6C). The constituent material of the dam structure is substantially the same as that described for the word line cut structure WLC (refer to FIG. 6C).

Figure 15:
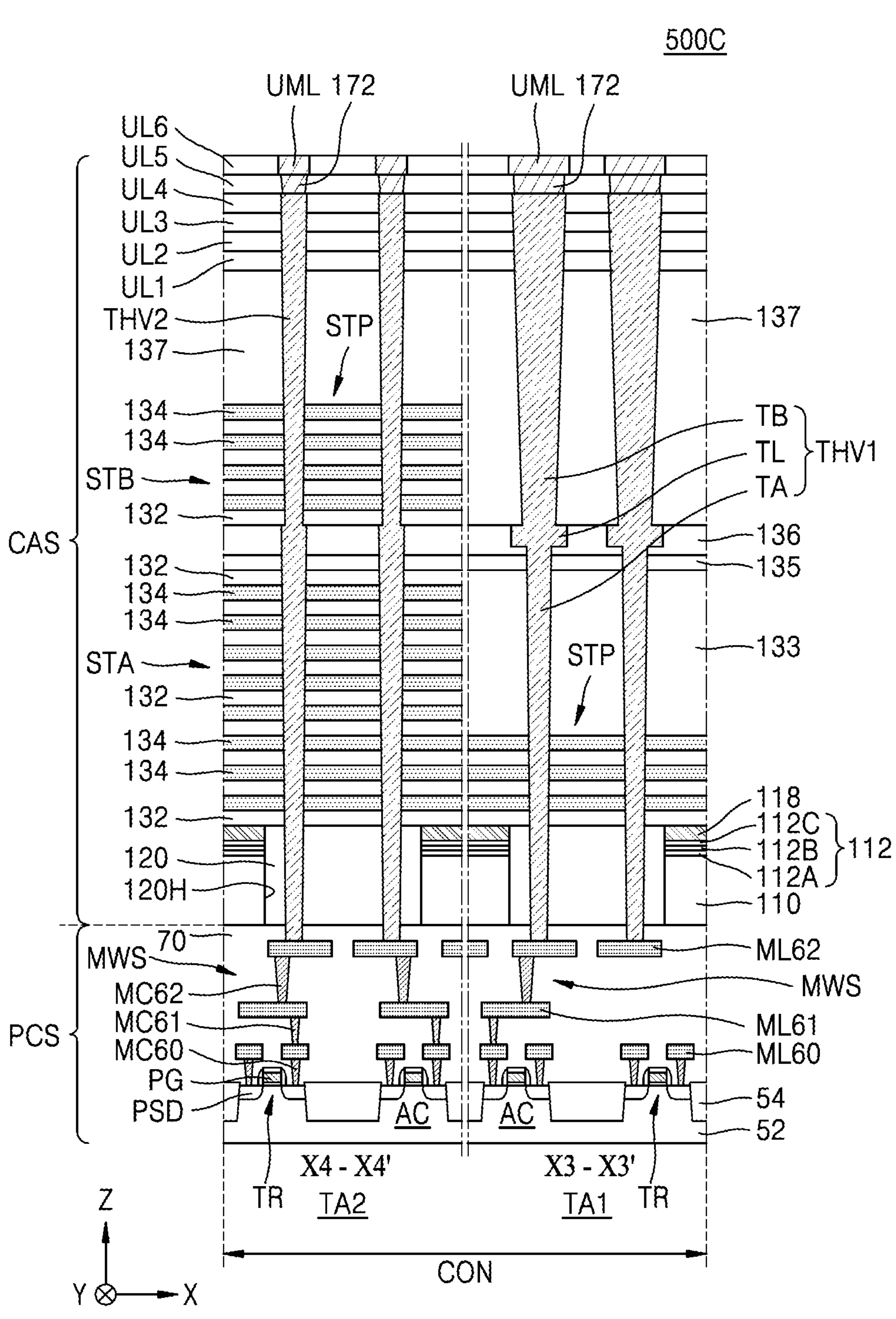

FIG. 15 is a cross-sectional view illustrating a semiconductor device 500C according to some embodiments according to the inventive concept. FIG. 15 exemplifies some components of parts corresponding to the X3-X3' line cross-section and the X4-X4' line cross-section of FIG. 11.

Referring to FIG. 15, the semiconductor device 500C may have substantially the same configuration as the semiconductor device 500B described with reference to FIG. 14. However, the semiconductor device 500C may include a cell array structure CAS and a peripheral circuit structure PCS overlapping each other in the vertical direction (Z direction). The cell array structure CAS may include the memory cell array 20 described with reference to FIG. 1. The peripheral circuit structure PCS may include the peripheral circuit 30 described with reference to FIG. 1. The cell array structure CAS may have substantially the same configuration as described with reference to FIGS. 5, 6A to 6E, and 14. The peripheral circuit structure PCS may have substantially the same configuration as described with reference to FIGS. 10A to 10C.

A plurality of through openings 120H penetrating the substrate 110, the insulating plate 112, and the second conductive plate 118 may be formed in a portion of the connection region CON. Each of the plurality of through openings 120H may be filled with an insulating plug 120.

In the connection region CON, each of the plurality of first through electrodes THV1 and the plurality of second through electrodes THV2 may be configured to extend to the peripheral circuit structure PCS through the through opening 120H, and thus to be electrically connected to one wiring layer selected from a plurality of peripheral circuit wiring layers ML60, ML61, and ML62.

Figure 16:
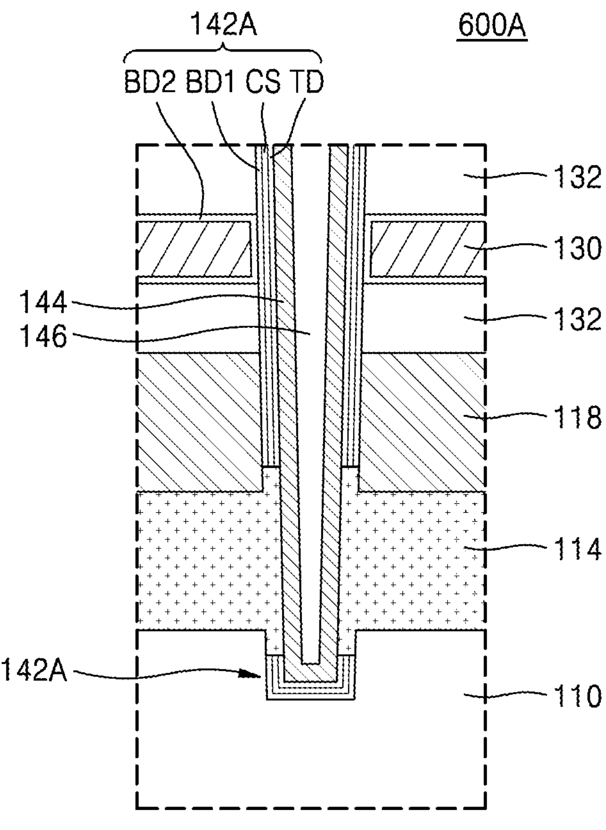

FIG. 16 is a cross-sectional view for explaining a semiconductor device 600A according to still another embodiment according to the inventive concept. FIG. 16 illustrates an enlarged cross-sectional configuration of a portion corresponding to the region EX2 in FIG. 6C.

Referring to FIG. 16, the semiconductor device 600A may have substantially the same configuration as the semiconductor device 100 described with reference to FIGS. 4 to 6E. However, the semiconductor device 600A may include the gate dielectric film 142A instead of the gate dielectric film 142. The gate dielectric film 142A may have substantially the same configuration as the gate dielectric film 142 described with reference to FIGS. 6B, 6C, and 6E. However, the gate dielectric film 142A may include the first blocking dielectric film BD1 and the second blocking dielectric film BD2 instead of the blocking dielectric film BD. The first blocking dielectric film BD1 may extend parallel to the channel region 144, and the second blocking dielectric film BD2 may be positioned to surround the gate line 130. Each of the first blocking dielectric film BD1 and the second blocking dielectric film BD2 may be formed of silicon oxide, silicon nitride, or metal oxide. For example, the first blocking dielectric film BD1 may be formed of silicon oxide, and the second blocking dielectric film BD2 may be formed of a metal oxide having a higher dielectric constant than that of the silicon oxide film. The metal oxide may be formed of hafnium oxide, aluminum oxide, zirconium oxide, tantalum oxide, or a combination thereof.

Figure 17:
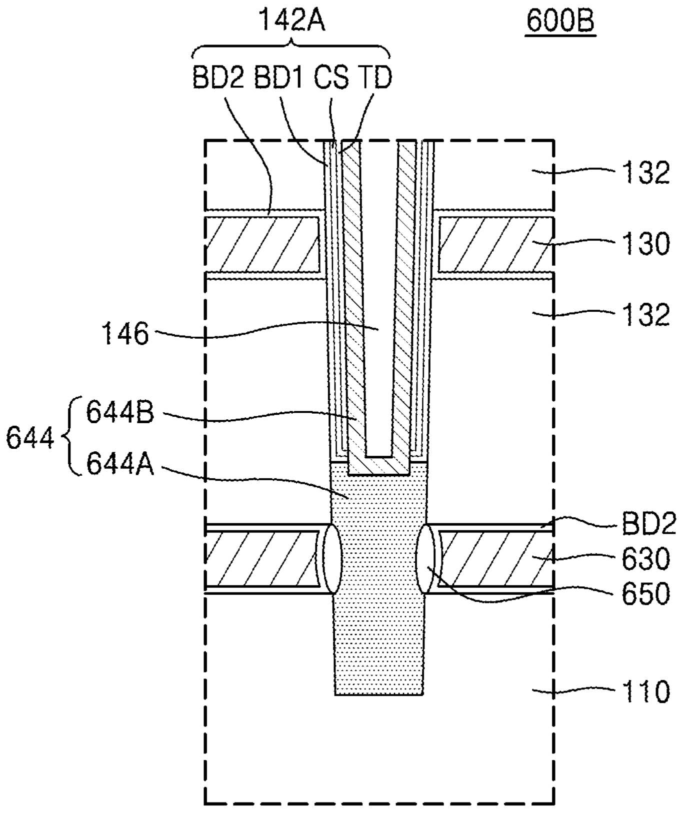

FIG. 17 is a cross-sectional view for explaining a semiconductor device 600B according to still another embodiment according to the inventive concept. FIG. 17 illustrates an enlarged cross-sectional configuration of a portion corresponding to the region EX2 in FIG. 6C.

Referring to FIG. 17, the semiconductor device 600B may have substantially the same configuration as the semiconductor device 100 described with reference to FIGS. 4 to 6E. However, the semiconductor device 600B may include the gate dielectric film 142A instead of the gate dielectric film 142. The gate dielectric film 142A may include a first blocking dielectric film BD1 and a second blocking dielectric film BD2. More detailed configurations of the first blocking dielectric film BD1 and the second blocking dielectric film BD2 are described with reference to FIG. 16.

The semiconductor device 600B may include a ground select gate line 630 between the substrate 110 and the plurality of gate lines 130. Also, the semiconductor device 600B may include a channel region 644 instead of the channel region 144 of the semiconductor device 100. The channel region 644 may include a lower semiconductor pattern 644A and an upper semiconductor pattern 644B. The lower semiconductor pattern 644A may be formed of a semiconductor material layer epitaxially grown from the substrate 110. The lower semiconductor pattern 644A may have a pillar shape, and an upper surface of the lower semiconductor pattern 644A may be positioned above an upper surface of the lowermost ground select gate line 630. The upper semiconductor pattern 644B and the lower semiconductor pattern 644A may contact each other. Each of the lower semiconductor patterns 644A may be formed of Si, Ge, or a combination thereof. The upper semiconductor pattern 644B may have substantially the same configuration as that described for the channel region 144 with reference to FIGS. 6B, 6C, and 6E.

The ground select gate line 630 may be surrounded by a second blocking dielectric film BD2. A gate dielectric film 650 may be arranged between the second blocking dielectric film BD2 and the lower semiconductor pattern 644A and between the ground select gate line 630 and the lower semiconductor pattern 644A.

Figure 18:
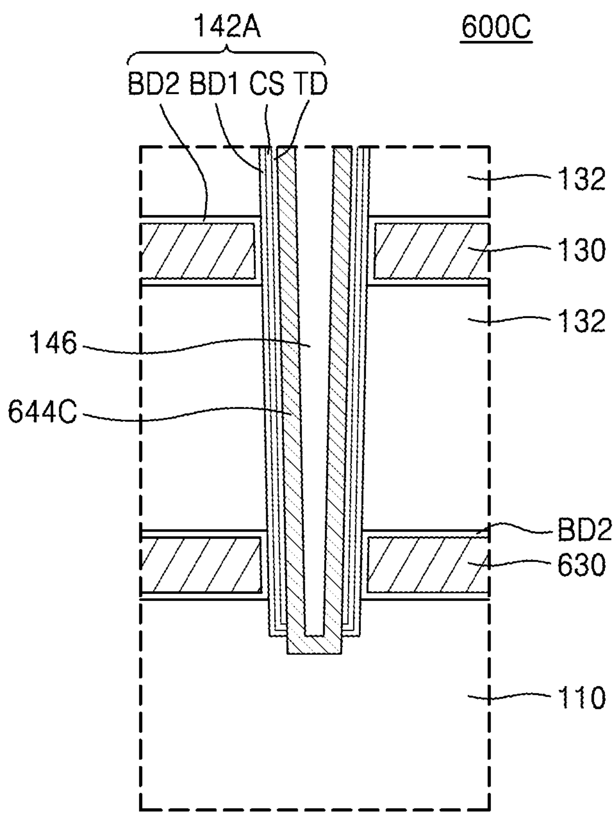

FIG. 18 is a cross-sectional view for explaining a semiconductor device 600C according to still another embodiment according to the inventive concept. FIG. 18 illustrates an enlarged cross-sectional configuration of a portion corresponding to the region EX2 in FIG. 6C.

Referring to FIG. 18, the semiconductor device 600C may have substantially the same configuration as that described with reference to FIG. 17. However, the semiconductor device 600C may not include the lower semiconductor pattern 644A illustrated in FIG. 17. The semiconductor device 600C may include a channel region 644C instead of the channel region 144 of the semiconductor device 100. A lower end of the channel region 644C may contact the substrate 110. A gate dielectric film 142A may be arranged between the channel region 644C and the ground select gate line 630.

Figure 19A:
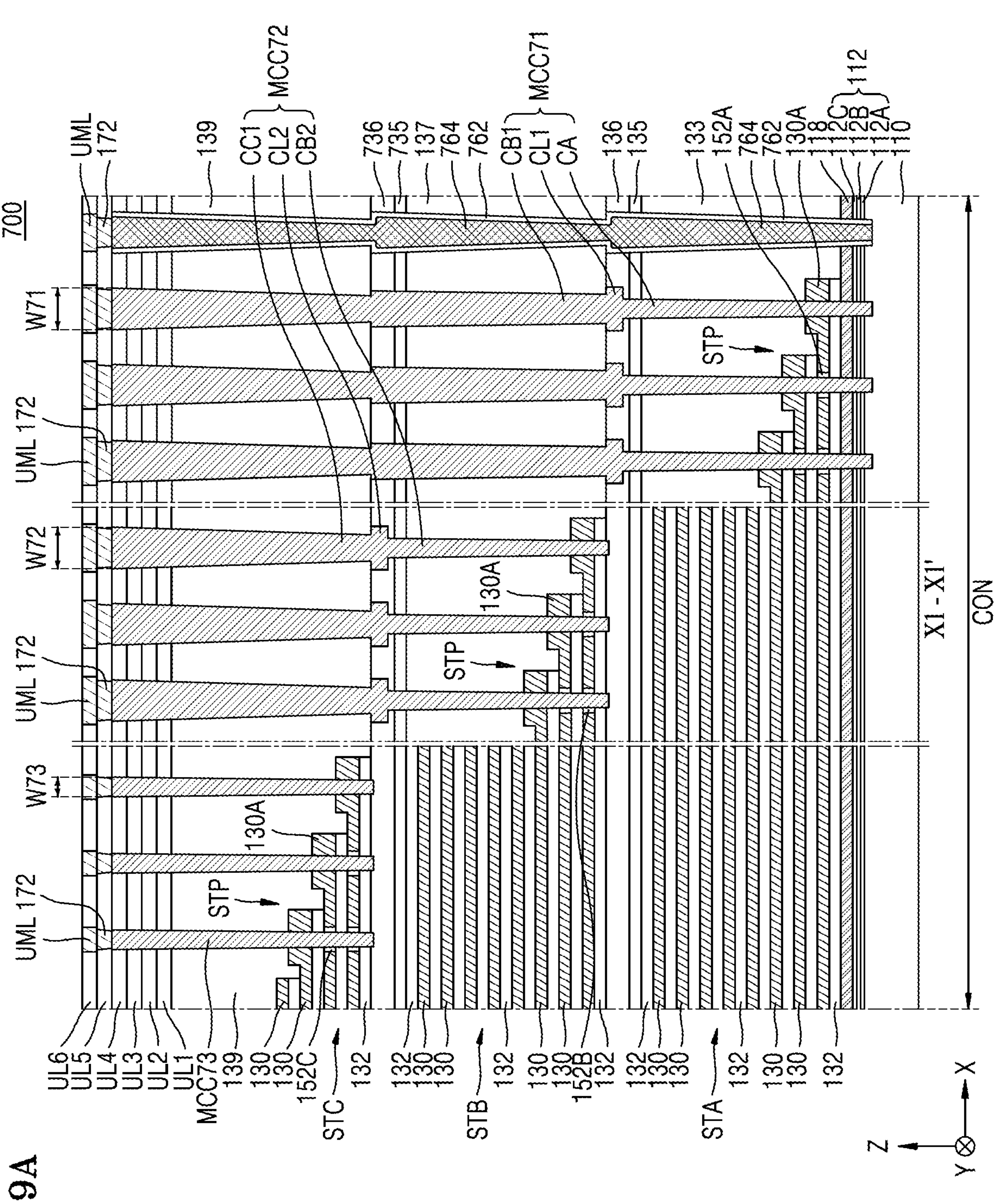
FIGS. 19A and 19B are cross-sectional views illustrating semiconductor devices according to some embodiments according to the inventive concept.
Figure 19B:
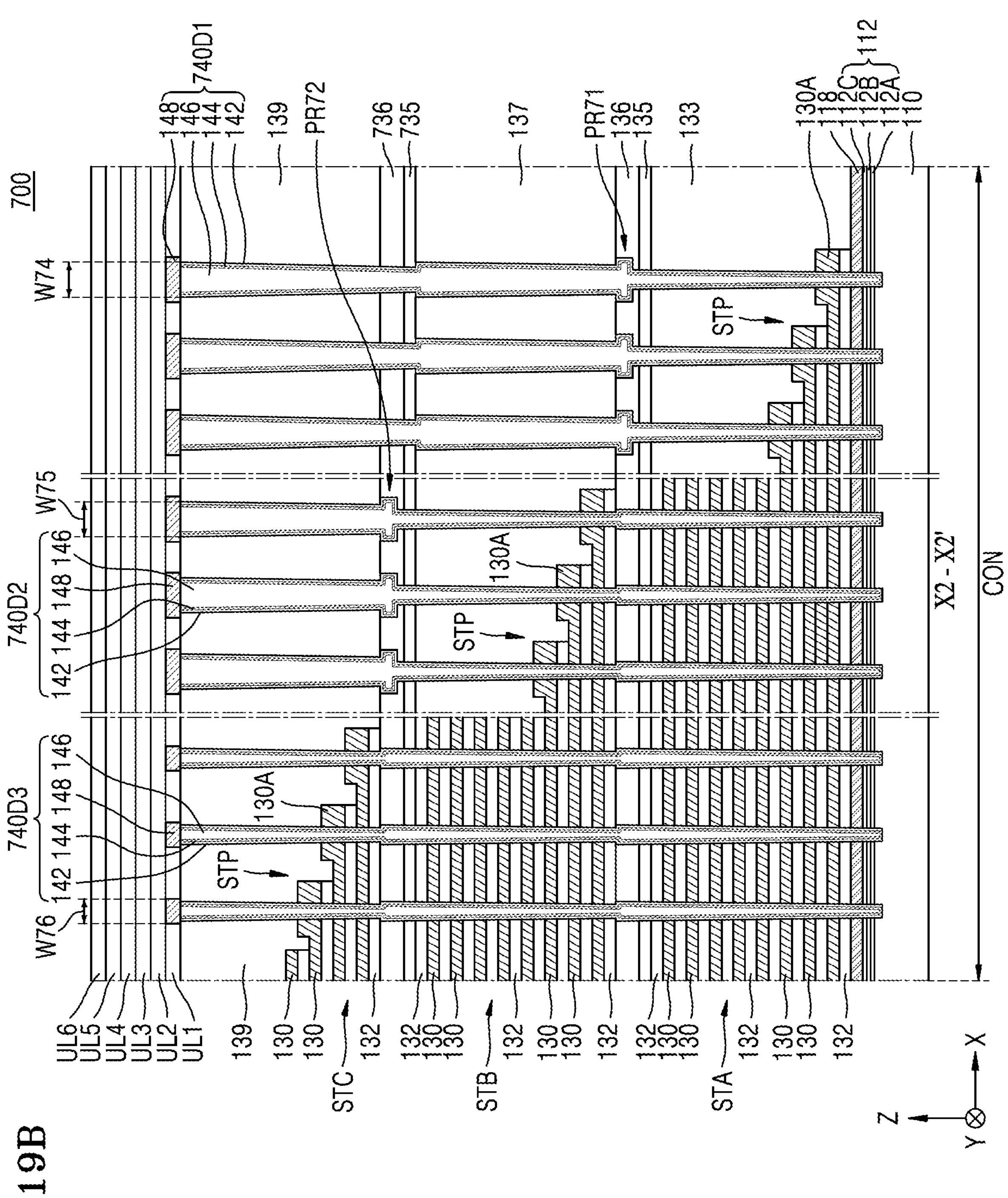

FIGS. 19A and 19B are cross-sectional views for explaining a semiconductor device 700 according to some embodiments according to the inventive concept, and FIG. 19A is a cross-sectional view of some components of a portion corresponding to the cross-section taken along line X1-X1' of FIG. 5, and FIG. 19B is a cross-sectional view of some components of a portion corresponding to the cross-section taken along line X2-X2' of FIG. 5. In FIGS. 19A and 19B, the same reference numerals as in FIGS. 6A to 6C denote the same members, and detailed description thereof will be omitted herein.

Referring to FIGS. 19A and 19B, the semiconductor device 700 may have substantially the same configuration as the semiconductor device 100 described with reference to FIGS. 4 to 6E. However, the semiconductor device 700 may include a first stack STA on the substrate 110, a second stack STB on the first stack STA, and a third stack STC on the second stack STB. The intermediate insulating films 135 and 136 may be arranged between the first stack STA and the second stack STB, and the intermediate insulating films 735 and 736 may be arranged between the second stack STB and the third stack STC. The intermediate insulating films 735 and 736 may include the first intermediate insulating film 735 and the second intermediate insulating film 736 sequentially stacked on the second stack STB. Each of the first intermediate insulating film 735 and the second intermediate insulating film 736 may be made of silicon oxide.

Detailed configurations of the first stack STA and the second stack STB have been described with reference to FIGS. 6A to 6C. The third stack STC may include a stepped connection part STP having a plurality of gate lines 130 overlapping each other in a vertical direction (Z direction) in the memory cell region MEC (see FIG. 5) and a plurality of conductive pad parts 130A in the connection region CON and integrally connected to the plurality of gate lines 130. Edge portions of each of the plurality of gate lines 130, the plurality of conductive pad parts 130A, and the plurality of insulating films 132 included in the third stack STC may be covered with an insulating block 139. The insulating block 139 may contact each of the plurality of gate lines 130, the plurality of conductive pad parts 130A, and the plurality of insulating films 132 included in the third stack STC. The insulating block 139 may be formed of a silicon oxide film, but is not limited thereto. The first stack STA, the second stack STB, and the third stack STC may constitute the cell array structure CAS illustrated in FIG. 4.

As illustrated in FIG. 19A, a plurality of memory cell contacts MCC71, MCC72, and MCC73 may be in the connection region CON. Each of the plurality of memory cell contacts MCC71, MCC72, and MCC73 may be configured to be electrically connectable to the sub-galactic conductive pad part 130A of one selected from a plurality of conductive pad parts 130A included in the first stack STA, the second stack STB, and the third stack STC.

The plurality of memory cell contacts MCC71, MCC72, and MCC73 may include a plurality of first memory cell contact MCC71 penetrating the stepped connection part STP included in the first stack STA in the vertical direction (Z direction) and spaced apart from the second stack STB and the third stack STC in the horizontal direction, a plurality of second memory cell contacts MCC72 penetrating the stepped connection part STP included in the second stack STB in the vertical direction (Z direction) and spaced apart from the third stack STC in the horizontal direction, and a plurality of third memory cell contacts MCC73 penetrating the stepped connection part STP included in the third stack STC in the vertical direction (Z direction).

A width in the horizontal direction of each of the plurality of first memory cell contacts MCC71 may have a greatest value at a vertical level in which the second intermediate insulating film 136 is positioned. A width in the horizontal direction of each of the plurality of second memory cell contacts MCC72 may have a greatest value at a vertical level in which the second intermediate insulating film 736 is positioned. The width W71 of an uppermost surface of each of the plurality of first memory cell contacts MCC71 in a horizontal direction (e.g., the X direction) and the width W72 of the uppermost surface of each of the plurality of second memory cell contacts MCC72 may be greater than the width W73 of the uppermost surface of each of the plurality of third memory cell contacts MCC73.

The plurality of first memory cell contacts MCC71 may each include a lower plug portion CA, an upper plug portion CB1, and a plug landing portion CL1 between the lower plug portion CA and the upper plug portion CB1. The lower plug portion CA may be at the same vertical level as the first stack STA and include a portion penetrating the stepped connection part STP included in the first stack STA. The upper plug portion CB1 is at the same vertical level as the second stack STB and the third stack ST3, and may include portions surrounded by the upper insulating block 137 included in the second stack STB and the insulating block 139 included in the third stack ST3. The upper plug portion CB1 may include a side wall portion bent at a portion adjacent to the upper surface of the second intermediate insulating film 736. The plug landing portion CL1 of the first memory cell contact MCC71 may have the greatest width in the horizontal direction. The plug landing portion CL1 may protrude in a horizontal direction further than a horizontal position of the sidewalls of the lower plug portion CA and the upper plug portion CB1, respectively. The sidewalls and the bottom surface of the plug landing portion CL1 may be surrounded by the second intermediate insulating film 136.

In each of the plurality of first memory cell contacts MCC71, the lower plug portion CA has an uppermost portion adjacent to the bottom surface of the plug landing portion CL1, and the upper plug portion CB1 may have a lowermost portion adjacent to the upper surface of the plug landing portion CL1. In a horizontal direction (e.g., the X direction), a width of the lowermost portion of the upper plug portion CB1 may be greater than a width of the uppermost portion of the lower plug portion CA.

The plurality of second memory cell contacts MCC72 may each include a lower plug portion CB2, an upper plug portion CC, and a plug landing portion CL2 between the lower plug portion CB2 and the upper plug portion CC. The lower plug portion CB2 may be at the same vertical level as the second stack STB and may include a portion penetrating the stepped connection part STP included in the second stack STB. The upper plug portion CC may be on the same vertical level as the third stack STC and may be surrounded by the insulating block 139 included in the third stack STC. The plug landing portion CL2 of the second memory cell contact MCC72 may have the greatest width in the horizontal direction. The plug landing portion CL2 may protrude in a horizontal direction further than a horizontal position of the sidewalls of the lower plug portion CB2 and the upper plug portion CC, respectively. The sidewalls and the bottom surface of the plug landing portion CL2 may be surrounded by the second intermediate insulating film 736.

Each of the plurality of first memory cell contacts MCC71, the plurality of second memory cell contacts MCC72, and the plurality of third memory cell contacts MCC73 may be in a hole penetrating at least one of the plurality of gate lines 130, and may be connected to one gate line 130 selected from the plurality of gate lines 130. Each of the plurality of first memory cell contacts MCC71, the plurality of second memory cell contacts MCC72, and the plurality of third memory cell contacts MCC73 may not be connected to other gate lines 130 except for the one selected gate line 130. Each of the plurality of first memory cell contacts MCC71, the plurality of second memory cell contacts MCC72, and the plurality of third memory cell contacts MCC73 may be in contact with the conductive pad part 130A of one gate line 130 selected from the plurality of gate lines 130, and may be connected to the selected one gate line 130 through the conductive pad part 130A.

Each of the plurality of first memory cell contacts MCC71, the plurality of second memory cell contacts MCC72, and the plurality of third memory cell contacts MCC73 may be horizontally spaced apart from the other gate lines 130 except for the one selected gate line 130. A first insulating ring 152A may be between the plurality of first memory cell contacts MCC71 and the other gate line 130 not connected thereto in the first stack STA. A second insulating ring 152B may be between the plurality of second memory cell contacts MCC72 and the other gate line 130 not connected thereto in the second stack STB. A third insulating ring 152C may be between the plurality of third memory cell contacts MCC73 and other gate lines 130 not connected thereto in the third stack STC. In example embodiments, the first insulating ring 152A, the second insulating ring 152B, and the third insulating ring 152C may be formed of a silicon oxide film, but is not limited thereto.

As illustrated in FIG. 19B, a plurality of dummy channel structures 740D1, 740D2, and 740D3 may be in the connection region CON. The plurality of dummy channel structures 740D1, 740D2, and 740D3 may include a plurality of first dummy channel structures 740D1 spaced apart from each other in the horizontal direction, a plurality of second dummy channel structures 740D2, and a plurality of third dummy channel structures 740D3.

The plurality of first dummy channel structures 740D1 may penetrate, at a position horizontally spaced apart from the second stack STB and the third stack STC, the stepped connection part STP, the intermediate insulating film 135, 136, 735, and 736, the upper insulating block 137 included in the second stack STB, and the insulating block 139 included in the third stack STC, which are included in the first stack STA, in the vertical direction (Z direction).

The plurality of second dummy channel structures 740D2 may penetrate, at a position spaced apart from the third stack STC in the horizontal direction, the stepped connection part STP and the intermediate insulating film 135, 136, 735, and 736 each included in the first stack STA and the second stack STB, and the insulating block 139 included in the third stack STC in the vertical direction (Z direction).

The plurality of third dummy channel structures 740D3 may penetrate the stepped connection part STP included in each of the first stack STA, the second stack STB, and the third stack STC, and the intermediate insulating films 135, 136, 735, and 736 in the vertical direction (Z direction).

FIG. 19B illustrates a case in which the plurality of first dummy channel structures 740D1, the plurality of second dummy channel structures 740D2, and the plurality of third dummy channel structures 740D3 penetrate the conductive pad part 130A included in the stepped connection part STP in the vertical direction (Z direction), but the technical idea of the inventive concept is not limited to that illustrated in FIG. 19B. For example, at least some of the plurality of first dummy channel structures 740D1, the plurality of second dummy channel structures 740D2, and the plurality of third dummy channel structures 740D3 may penetrate a portion of the gate line 130 that is horizontally spaced apart from the conductive pad part 130A in the connection region CON in the vertical direction (Z direction).

In the horizontal direction, widths of the plurality of first dummy channel structures 740D1, the plurality of second dummy channel structures 740D2, and the third dummy channel structures 740D3 may be different from each other. In the horizontal direction (e.g., the X direction), the width W74 of the uppermost surface of each of the plurality of first dummy channel structures 740D1 and the width W75 of the uppermost surface of each of the plurality of second dummy channel structures 740D2 may be greater than the width W76 of the uppermost surface of each of the plurality of third dummy channel structures 740D3.

Each of the plurality of first dummy channel structures 740D1 may include a protrusion PR71 having a greatest width in the horizontal direction. Sidewalls and a bottom surface of the protrusion PR71 may be surrounded by the second intermediate insulating film 136. Each of the plurality of second dummy channel structures 740D2 may include a protrusion PR72 having a maximum width in the horizontal direction. Sidewalls and a bottom surface of the protrusion PR72 may be surrounded by the second intermediate insulating film 736.

As illustrated in FIG. 19A, a conductive plate contact 764 may be in the connection region CON. The conductive plate contact 764 may have substantially the same configuration as that described for the conductive plate contact 164 with reference to FIG. 6A. However, the conductive plate contact 764 may penetrate the fourth upper insulating film UL4, the third upper insulating film UL3, the second upper insulating film UL2, the first upper insulating film UL1, the insulating block 139, the upper insulating block 137, the intermediate insulating film 135, 136, 735, and 736, the lower insulating block 133, the second conductive plate 118, and the insulating plate 112 to extend to the substrate 110 in a vertical direction (Z direction). A sidewall of the conductive plate contact 764 may be covered with the insulating spacer 762.

The constituent materials of each of the conductive plate contact 764 and the insulating spacer 762 are the same as described for the conductive plate contact 164 and the insulating spacer 162 with reference to FIG. 6A.

Next, a method of manufacturing a semiconductor device according to embodiments according to the technical idea of the inventive concept will be described in detail.

FIGS. 20A to 28 are cross-sectional views illustrating a method of manufacturing a semiconductor device according to embodiments according to the inventive concept. In particular, FIGS. 20A, 21A, 22A, 23A, 24A, 25A, 26A, 27A, and 28 are cross-sectional views according to the process sequence of some components of a portion corresponding to the cross-section X1-X1' of FIG. 5, and FIGS. 20B, 21B, 22B 23B, 24B, 25B, 26B, and 27B are cross-sectional views according to the process sequence of some components of a portion corresponding to the cross-section along the line X2-X2' of FIG. 5, and FIGS. 20C, 23C, 26C, and 27C are cross-sectional views according to the process sequence of some components of a portion corresponding to the cross-section Y1-Y1' of FIG. 5. An exemplary method of manufacturing the semiconductor device 100 described with reference to FIGS. 4 to 6E will be described with reference to FIGS. 20A to 28.

Figure 20A:
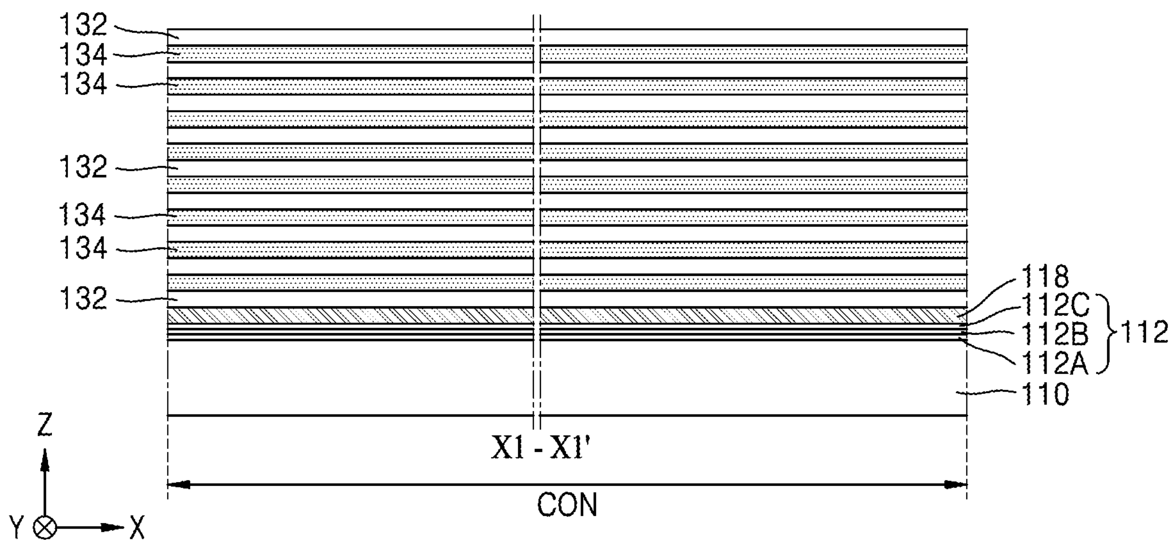
Figure 20B:
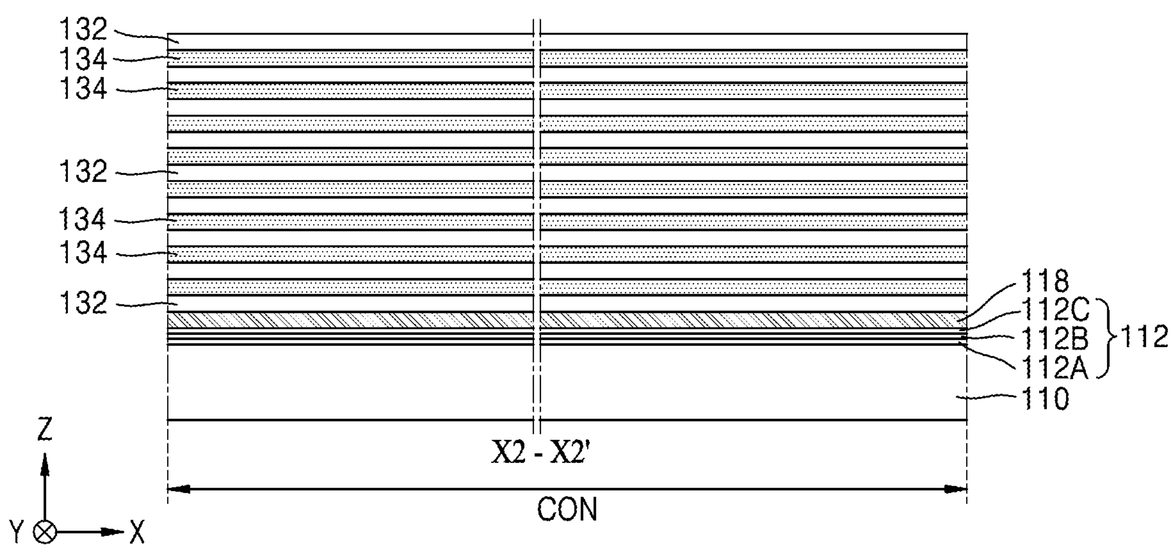
Figure 20C:
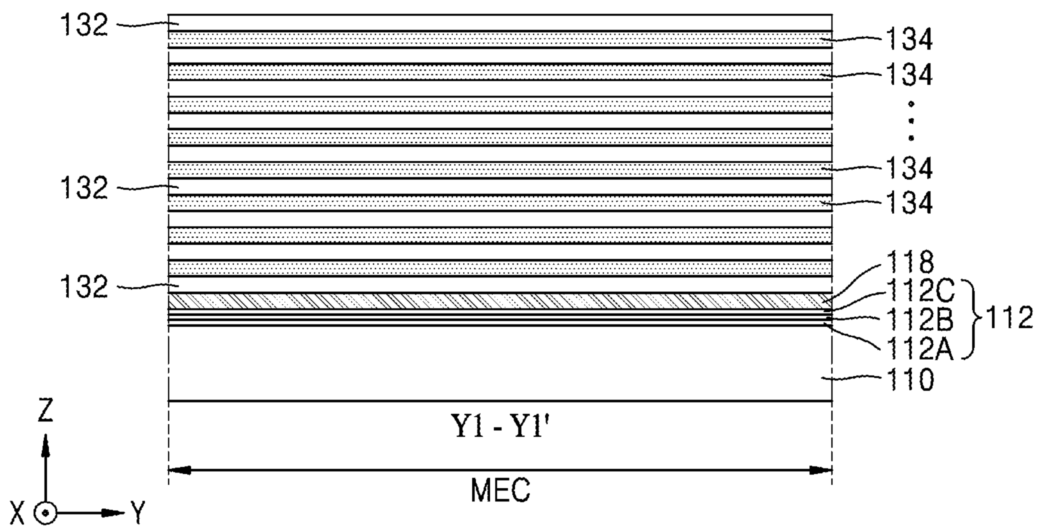

Referring to FIGS. 20A, 20B, and 20C, the insulating plate 112 and the second conductive plate 118 may be sequentially formed on the substrate 110 in the memory cell region MEC and the connection region CON. The insulating plate 112 may be formed of an insulating film having a multilayer structure including the first insulating film 112A, the second insulating film 112B, and the third insulating film 112C.

A plurality of insulating films 132 and a plurality of sacrificial insulating films 134 may be alternately stacked one by one on the second conductive plate 118 in the memory cell region MEC and the connection region CON. The plurality of insulating films 132 may include a silicon oxide film, and the plurality of sacrificial insulating films 134 may be made of silicon nitride. The plurality of sacrificial insulating films 134 may each serve to secure a space for forming the plurality of gate lines 130 in a subsequent process.

Figure 21A:
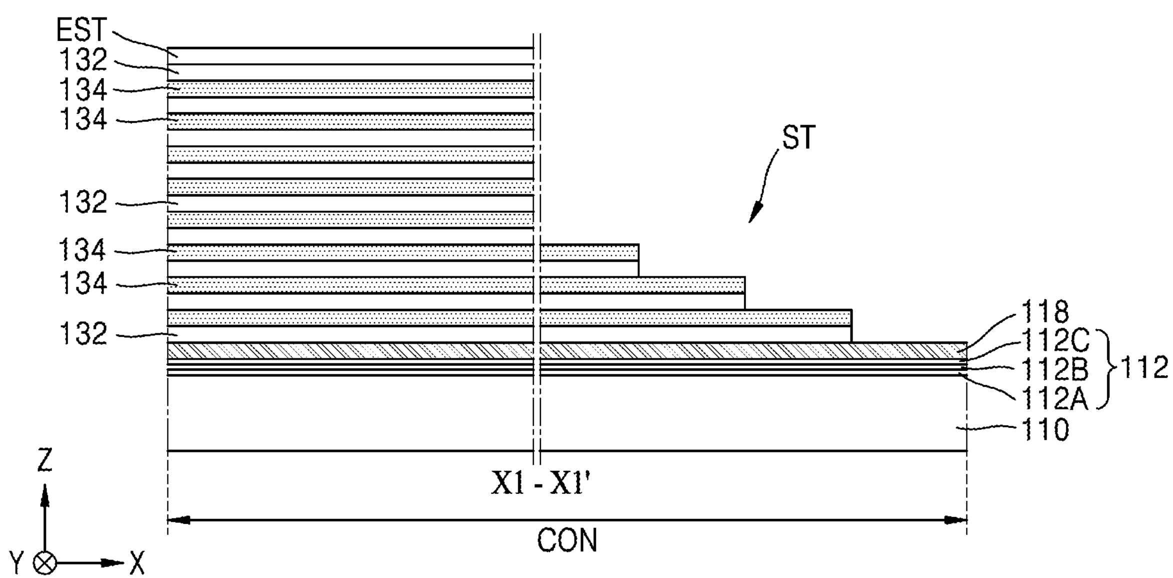
Figure 21B:
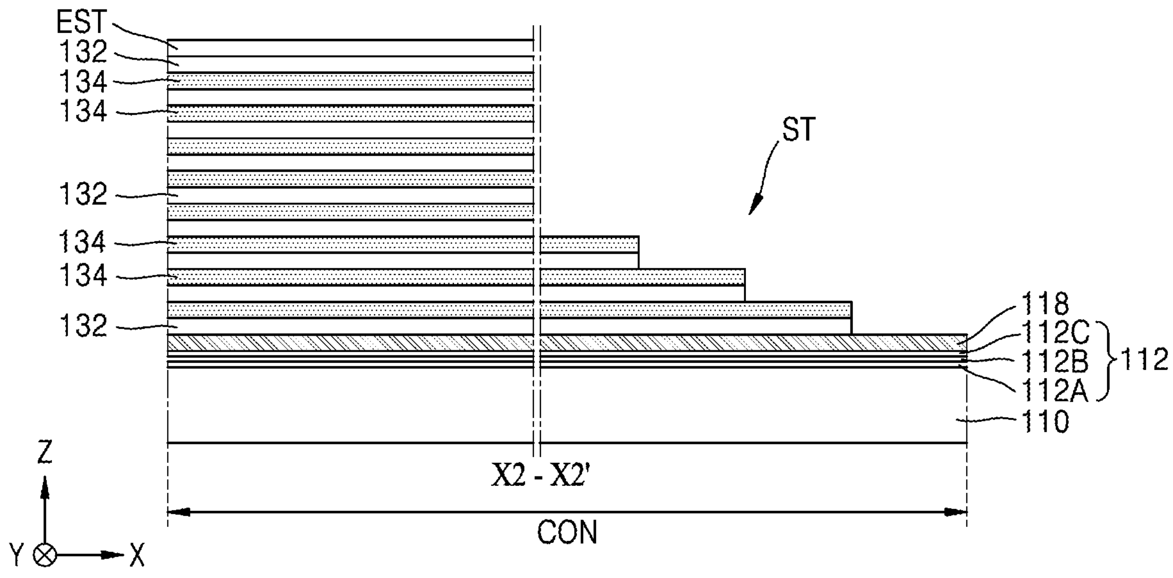

Referring to FIGS. 21A and 21B, after forming an etch stop film EST covering the uppermost insulating film 132 of the plurality of insulating films 132 in the results of FIGS. 20A, 20B, and 20C, a portion of each of the plurality of insulating films 132 and the plurality of sacrificial insulating films 134 is removed in the connection region CON by using a photolithography process, so that as one end of each of the plurality of insulating films 132 and the plurality of sacrificial insulating films 134 moves away from the substrate 110, a step structure ST having a gradually less width in the horizontal direction may be formed.

Figure 22A:
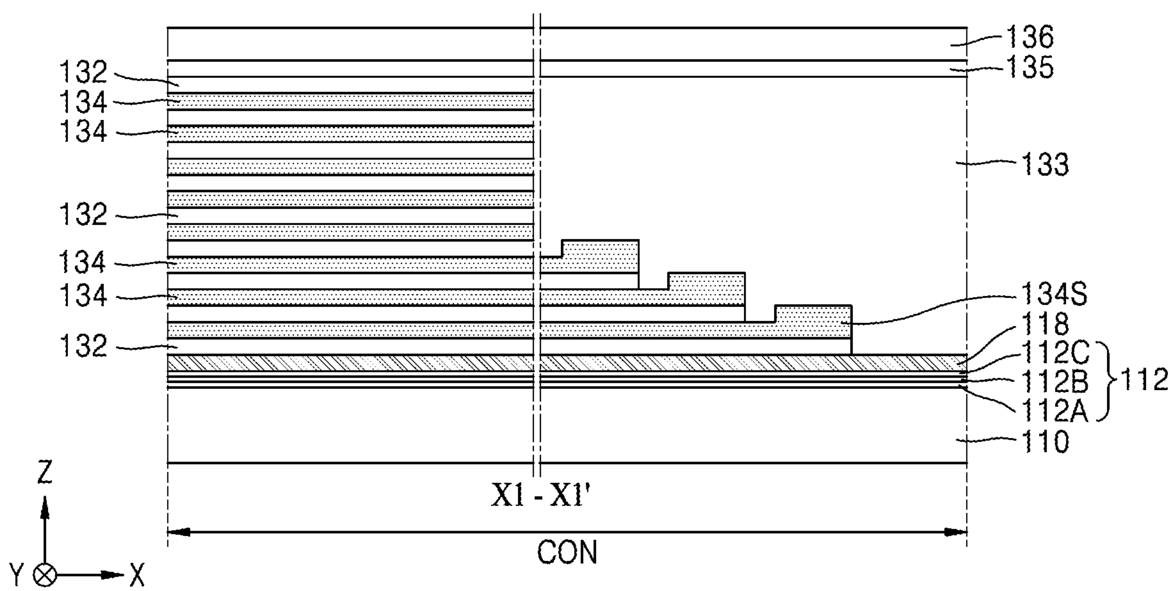
Figure 22B:
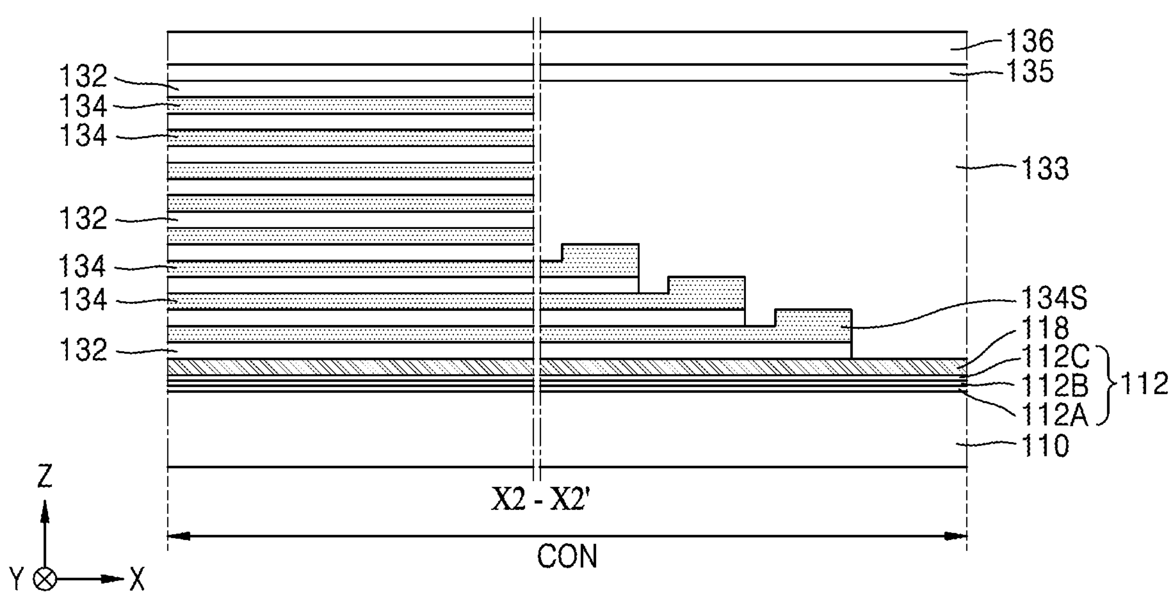

Referring to FIGS. 22A and 22B, in the results of FIGS. 21A and 21B, a sacrificial pad part 134S having an increased thickness may be formed at one end of each of the plurality of sacrificial insulating films 134 constituting the step structure ST.

In example embodiments, to form a sacrificial pad part 134S on one end of each of the plurality of sacrificial insulating films 134, after removing some of the plurality of insulating films 132 to expose one end of each of the plurality of sacrificial insulating films 134 constituting the step structure ST, an additional film made of the same material as the constituent material of the plurality of sacrificial insulating films 134 is deposited on the exposed one end of each of the plurality of sacrificial insulating films 134, and the additional layer is patterned so that the sacrificial pad part 134S remains.

After that, a lower insulating block 133 covering the step structure ST and the second conductive plate 118 is formed, and as a result, the resultant obtained is planarized by a CMP process to expose the upper surface of the uppermost insulating film 132. The etch stop film EST may be removed during the planarization process. Thereafter, the first intermediate insulating film 135 and the second intermediate insulating film 136 covering the upper surface of each of the uppermost insulating film 132 and the lower insulating block 133 may be sequentially formed.

Figure 23A:
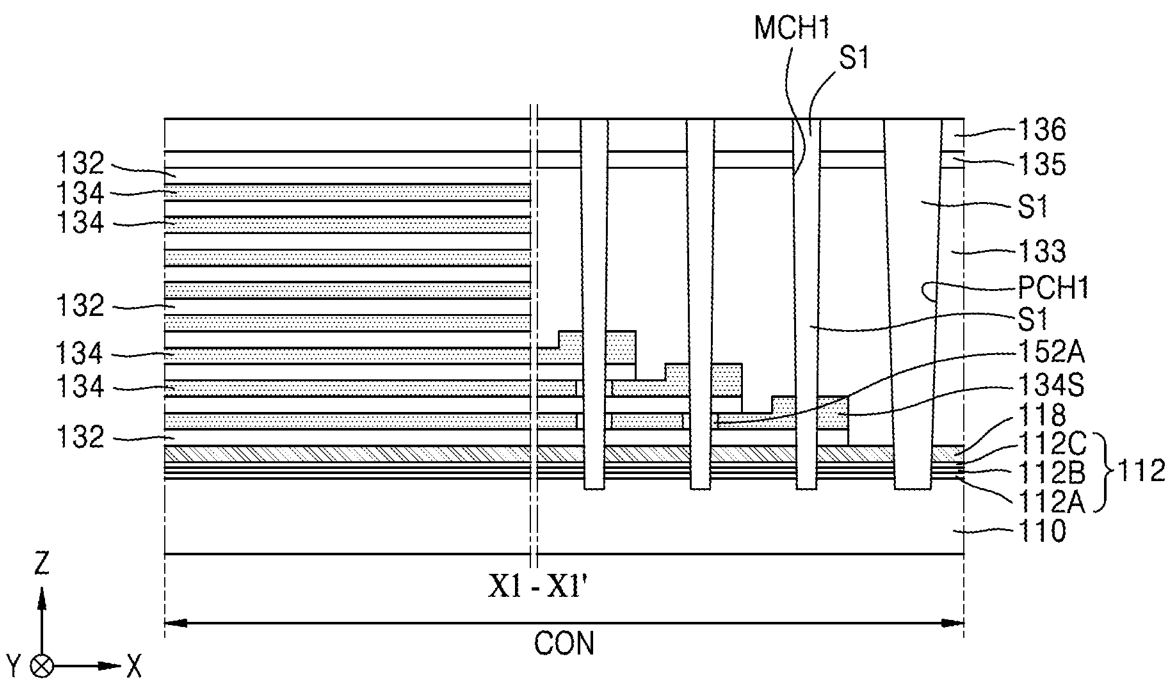
Figure 23B:
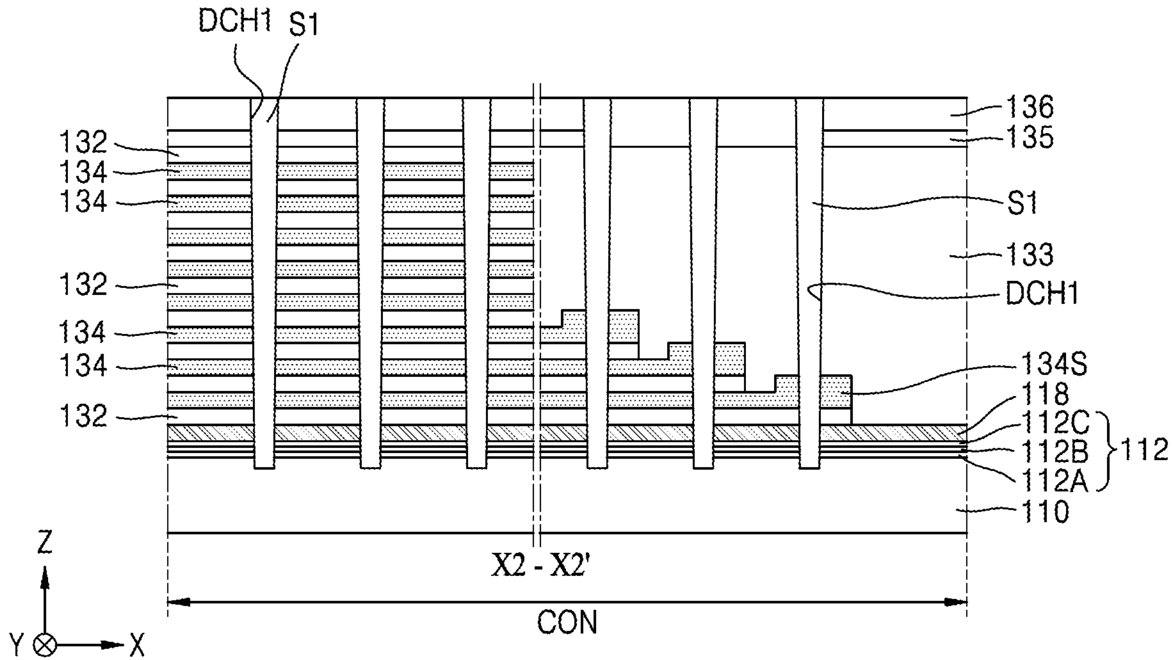
Figure 23C:
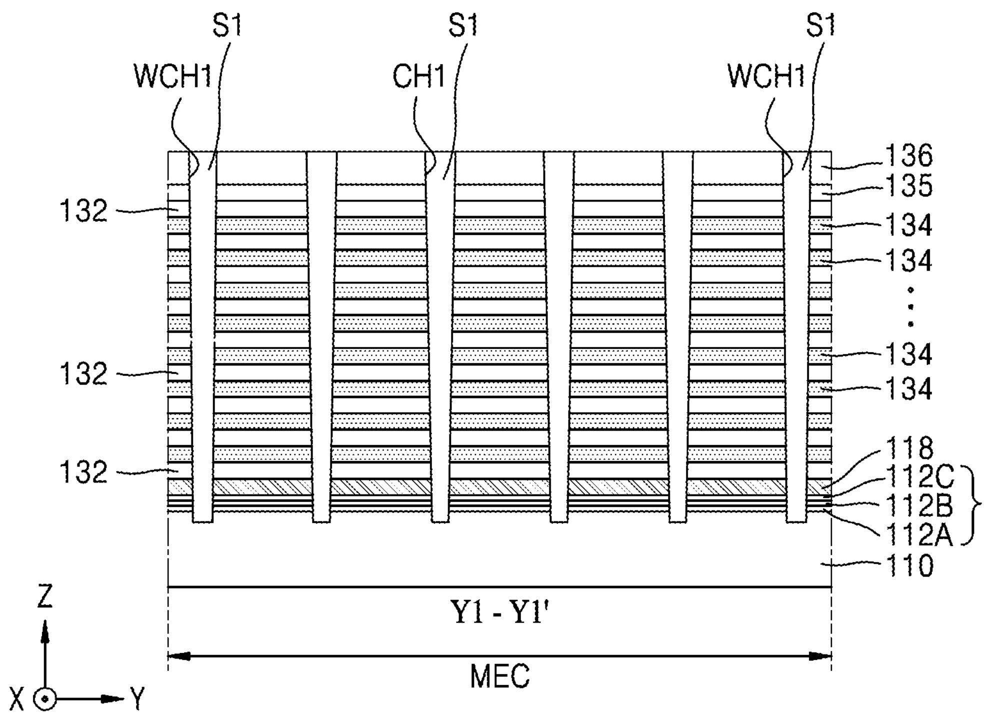

Referring to FIGS. 23A, 23B, and 23C, a plurality of lower memory cell contact holes MCH1, a lower plate contact hole PCH1, and a plurality of lower dummy channel holes DCH1 in the connection region CON, and a plurality of lower channel holes CH1 and a plurality of lower word line cut holes WCH1 in the memory cell region MEC may be formed.

Then, as illustrated in FIG. 23A, by etching a portion of the sacrificial pad part 134S and the sacrificial insulating film 134 exposed inside each of the plurality of lower memory cell contact holes MCH1 to expand the horizontal width of each of the plurality of lower memory cell contact holes MCH1 at the same vertical level as the sacrificial insulating film 134, a plurality of indent spaces in which sidewalls of the sacrificial pad part 134S and the sacrificial insulating film 134 are exposed may be formed, and an indent space exposing the sacrificial insulating film 134 among the plurality of indent spaces may be filled with a first insulating ring 152A, and the indent space exposing the sacrificial pad part 134S may be filled again with the sacrificial pad part 134S. Thereafter, a plurality of filling first sacrificial layers S1 that fills the plurality of lower memory cell contact holes MCH1, the lower plate contact hole PCH1, the plurality of lower dummy channel holes DCH1, the plurality of lower channel holes CH1, and the plurality of lower word line cut holes WCH1 may be formed. In example embodiments, the plurality of first sacrificial layers S1 may be formed of a silicon oxide film, a polysilicon film, a carbon film, or a tungsten film, but is not limited thereto.

Figure 24A:
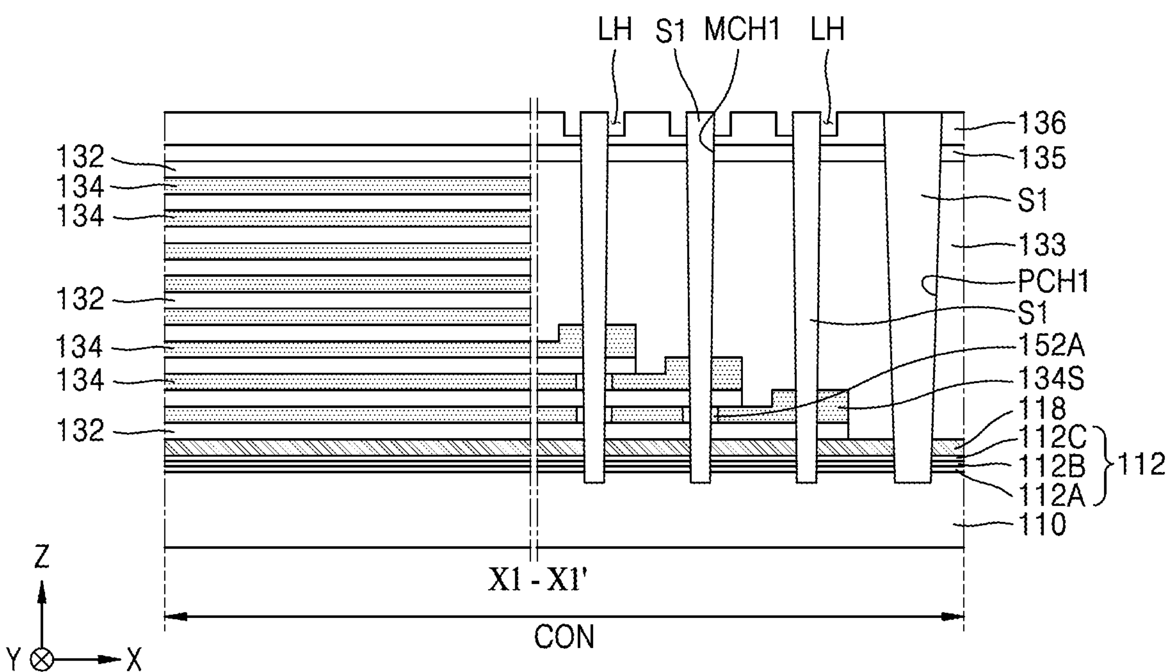
Figure 24B:
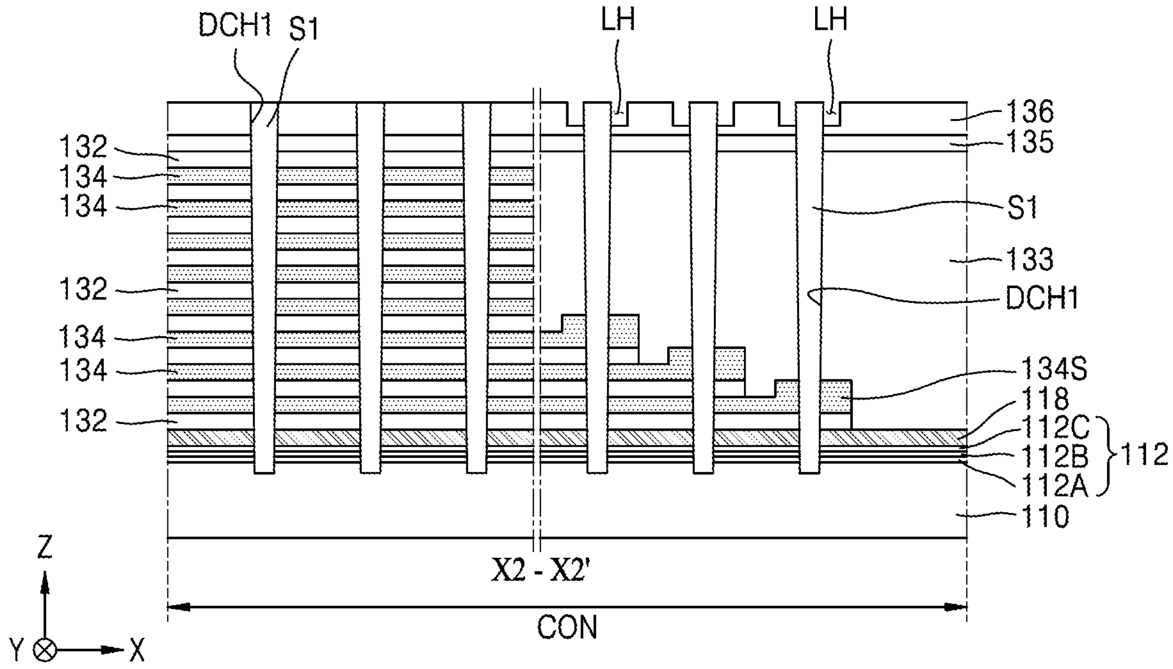

Referring to FIGS. 24A and 24B, in the connection region CON, by removing some regions of the second intermediate insulating film 136 around each of the plurality of lower memory cell contact holes MCH1 and the plurality of lower dummy channel holes DCH1, a plurality of landing holes LH may be formed in the second intermediate insulating film 136. Upper sidewalls of each of the plurality of lower memory cell contact holes MCH1 and the plurality of lower dummy channel holes DCH1 may be exposed through the plurality of landing holes LH. The plurality of landing holes LH may have an annular ring shape surrounding one of the plurality of lower memory cell contact holes MCH1 and the plurality of lower dummy channel holes DCH1 in each plane (e.g., the X-Y plane).

Figure 25A:
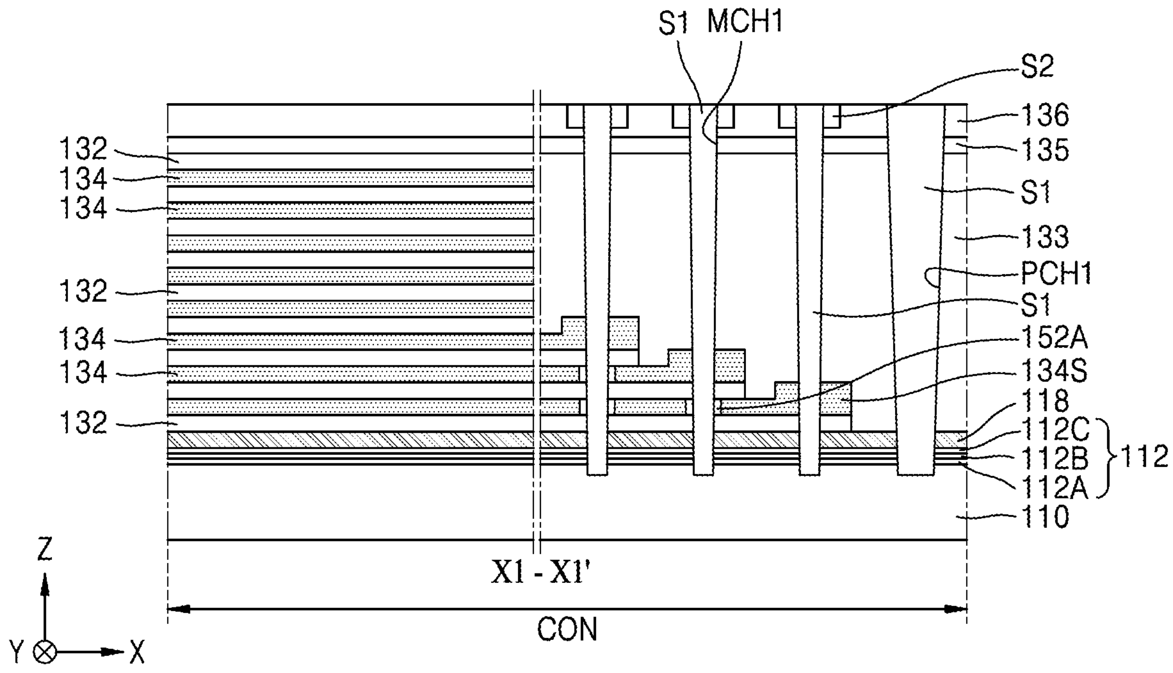
Figure 25B:
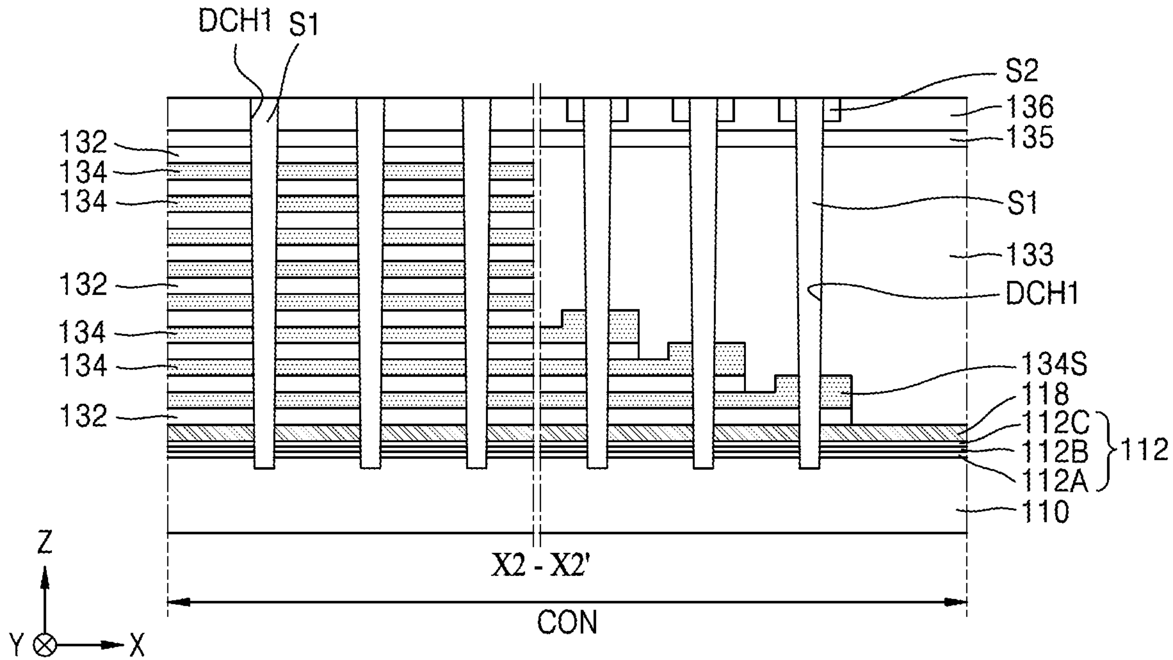

Referring to FIGS. 25A and 25B, a plurality of second sacrificial layers S2 filling the plurality of landing holes LH may be formed in the resultant of FIGS. 24A and 24B. The plurality of second sacrificial layers S2 may be made of the same material as the plurality of first sacrificial layers S1.

Figure 26A:
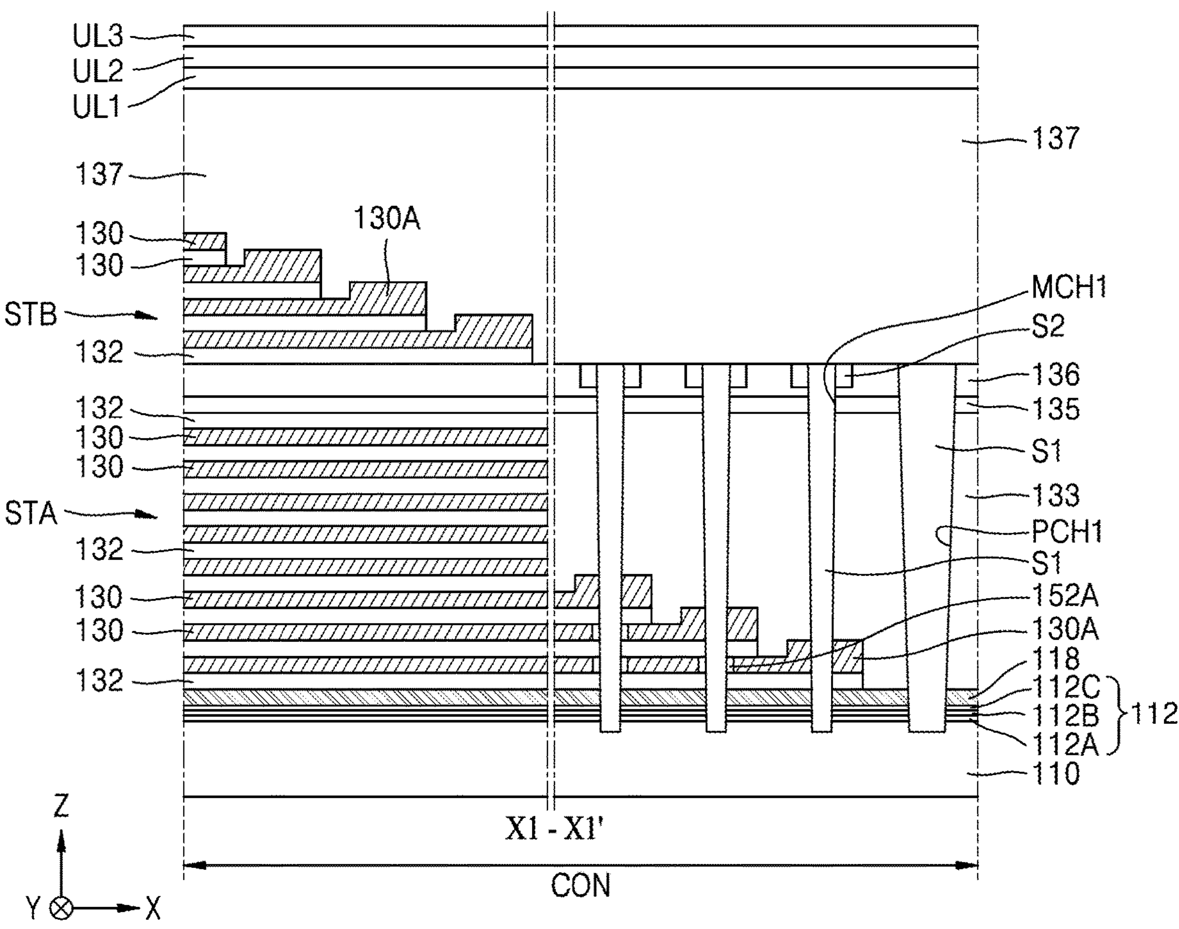
Figure 26B:
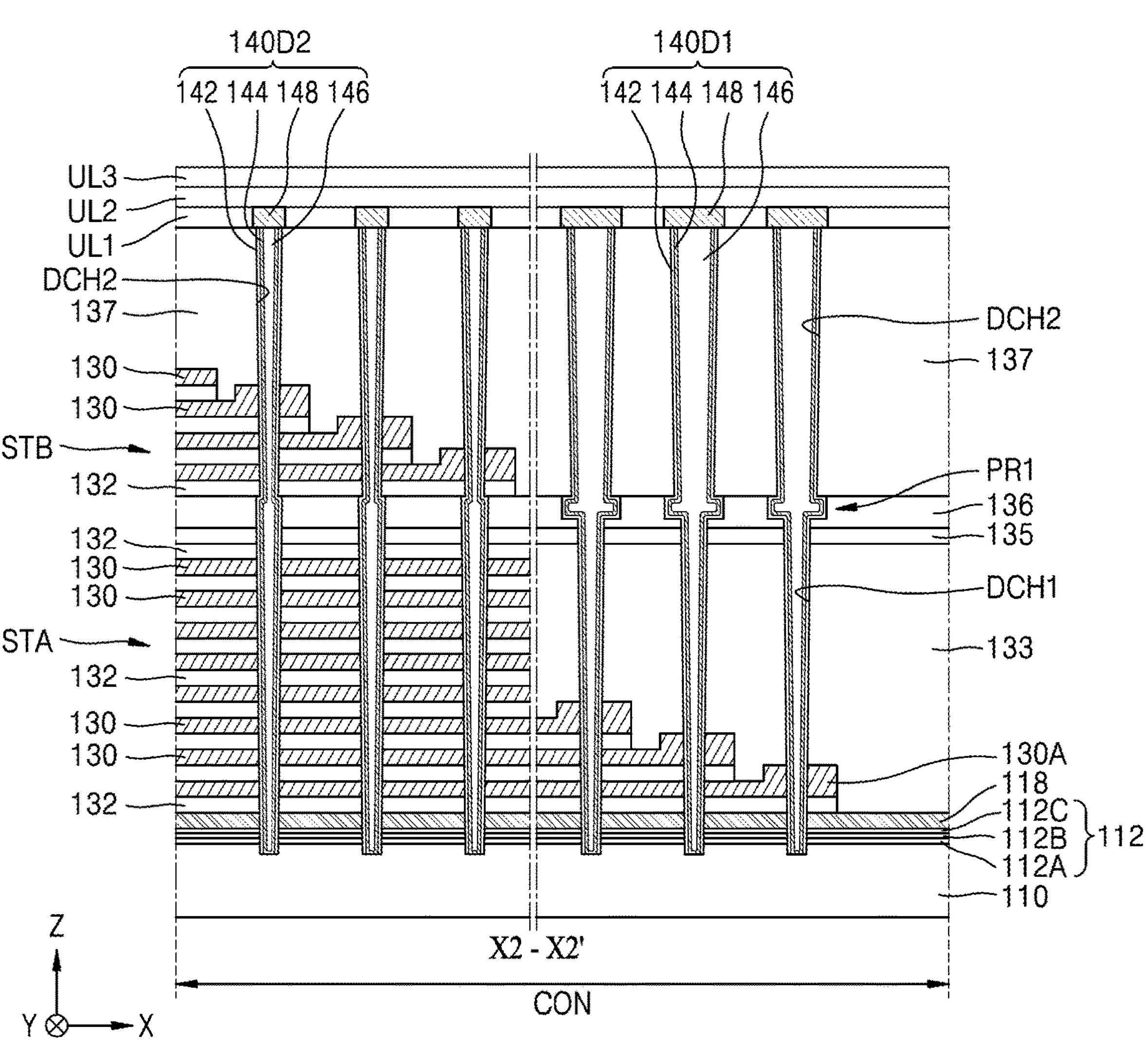
Figure 26C:
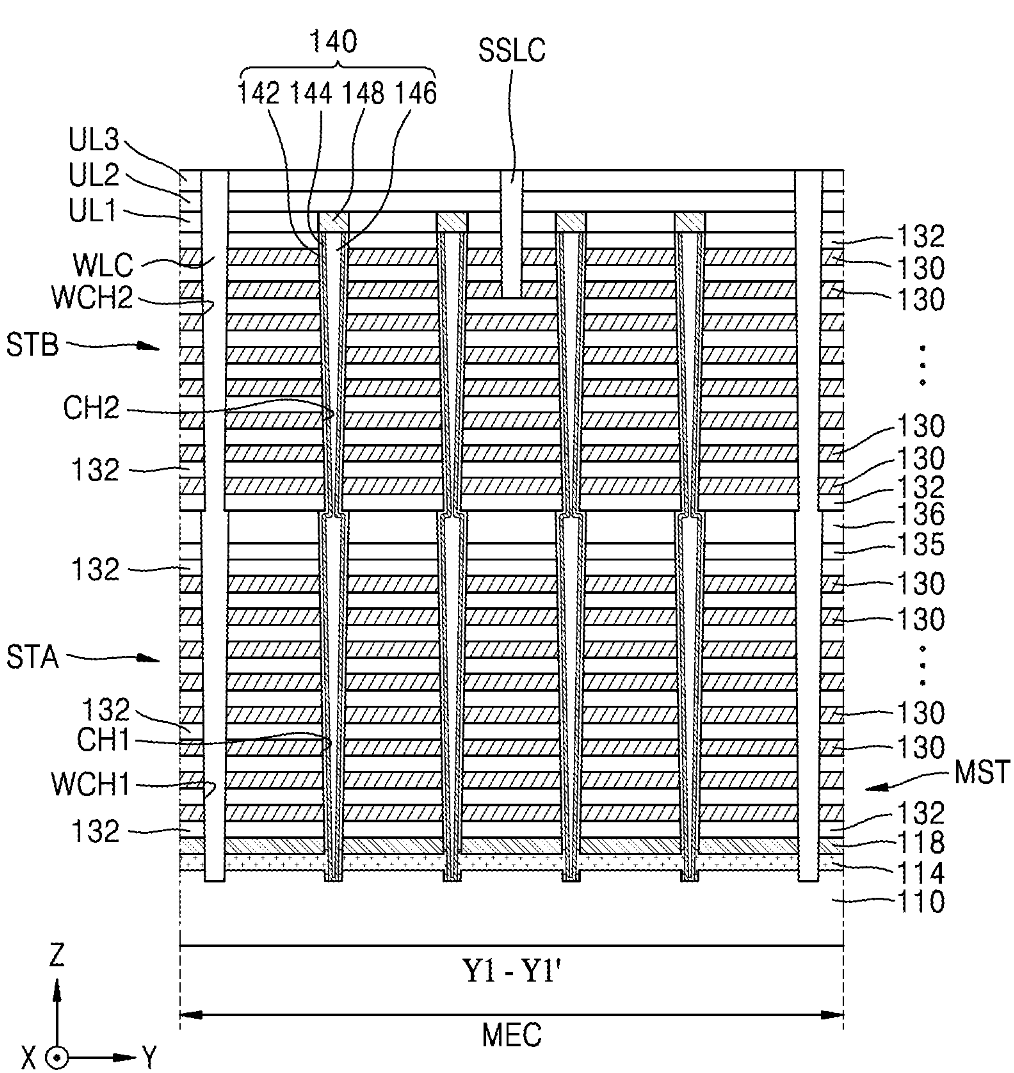

Referring to FIGS. 26A, 26B, and 26C, by performing processes similar to those described with reference to FIGS. 20A to 21B on the resultant of FIGS. 25A and 25B, a structure including a plurality of insulating films 132, a plurality of sacrificial insulating films 134, and a plurality of sacrificial pad parts 134S necessary for forming the second stack STB (see FIGS. 6A to 6C) may be formed on the second intermediate insulating film 136, and an upper insulating block 137 covering the structure may be formed in the connection region CON.

Thereafter, a plurality of upper dummy channel holes DCH2 connected to the plurality of lower dummy channel holes DCH1 in the connection region CON and a plurality of upper channel holes CH2 connected to the plurality of lower channel holes CH1 in the memory cell region MEC may be formed, and the plurality of upper dummy channel holes DCH2 and the plurality of first sacrificial layers S1 exposed through the plurality of upper channel holes CH2 may be removed.

After that, a plurality of lower dummy channel holes DCH1 and a plurality of upper dummy channel holes DCH2 in the connection region CON and a plurality of gate dielectric films 142 filling the plurality of lower channel holes CH1 and the plurality of upper channel holes CH2 in the memory cell region MEC, a plurality of channel regions 144, and a plurality of buried insulating films 146 may be formed. In the connection region CON and the memory cell region MEC, a first upper insulating film UL1 covering the result of the process and a plurality of drain regions 148 penetrating the first upper insulating film UL1 are formed, so that a plurality of first dummy channel structures 140D1 and a plurality of second dummy channel structures 140D2 in the connection region CON and a plurality of channel structures 140 in the memory cell region MEC may be formed.

After that, the second upper insulating film UL2 and the third upper insulating film UL3 covering the plurality of first dummy channel structures 140D1, the plurality of second dummy channel structures 140D2, and the plurality of channel structures 140 may be formed in the connection region CON and the memory cell region MEC, and the third upper insulating film UL3, the second upper insulating film UL2, the first upper insulating film UL1, some of the plurality of insulating films 132, and some of the plurality of sacrificial insulating films 134 may be etched to form a hole in the memory cell region MEC, and the string select line cut structure SSLC filling the hole may be formed.

A plurality of upper word line cut holes WCH2 connected to the plurality of lower word line cut holes WCH1 may be formed in the memory cell region MEC, and the plurality of first sacrificial layers S1 exposed through the plurality of upper word line cut holes WCH2 may be formed, and the insulating plate 112 may be selectively removed through the plurality of lower word line cut holes WCH1 and the plurality of upper word line cut holes WCH2 only in the memory cell region MEC of the memory cell region MEC and the connection region CON, and the resulting empty space may be filled with the first conductive plate 114. While removing the insulating plate 112 from the memory cell region MEC, portions adjacent the insulating plate 112 among the gate dielectric film 182 included in the channel structure 180 may be removed together with the insulating plate 112 in the memory cell region MEC, and as a result, the first conductive plate 114 may pass through a partial region of the gate dielectric film 182 in the horizontal direction to come into contact with the channel region 184.

Through the plurality of lower word line cut holes WCH1 and the plurality of upper word line cut holes WCH2, the plurality of sacrificial insulating films 134 and the sacrificial pad part 134S (refer to FIGS. 25A and 25B) may be replaced with the plurality of gate lines 130 and the plurality of conductive pad parts 130A in the memory cell region MEC and the connection region CON.

After the first conductive plate 114 and the plurality of gate lines 130 are formed, the plurality of word line cut holes WCH may be filled with a plurality of word line cut structures WLC.

Figure 27A:
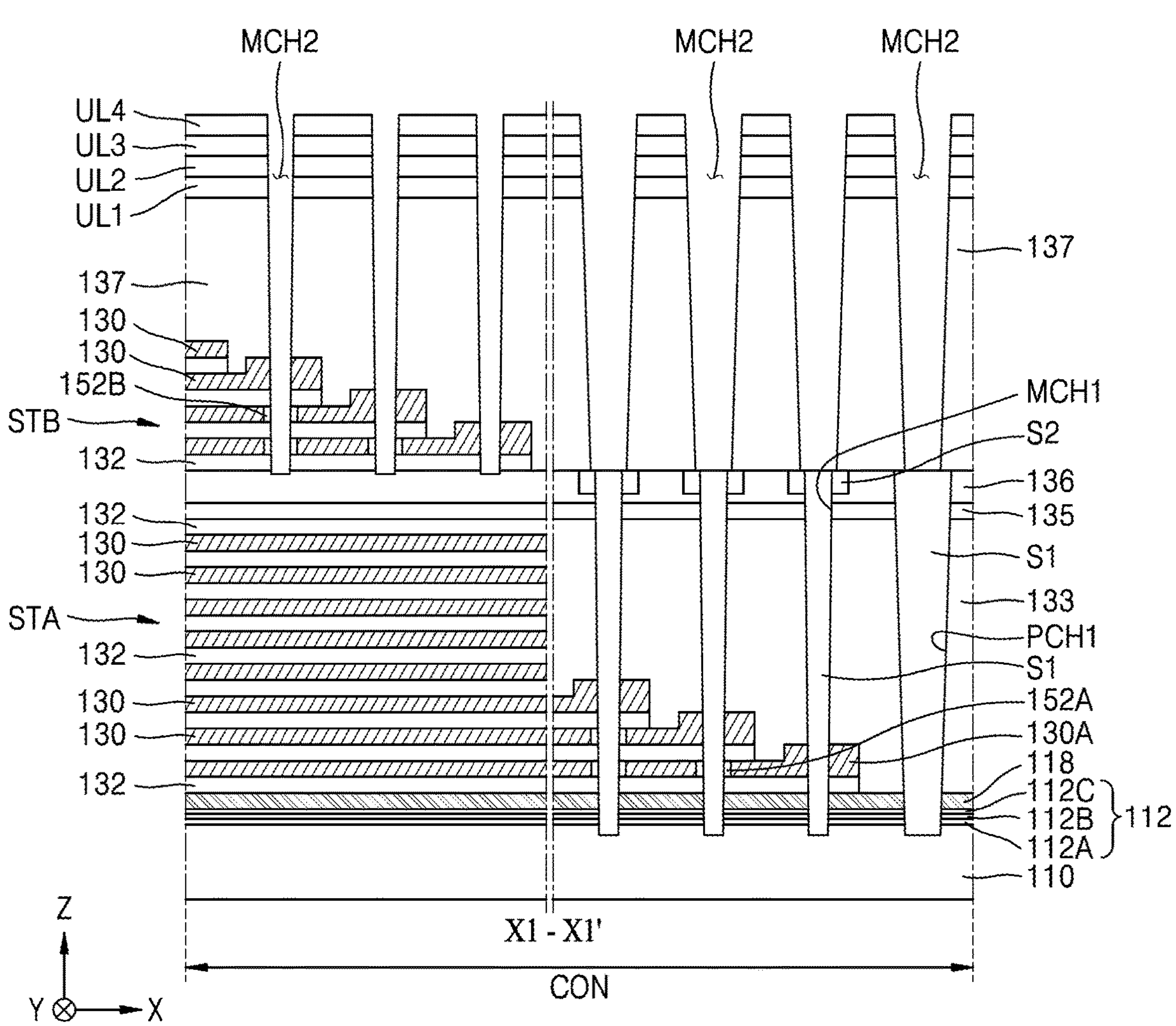
Figure 27B:
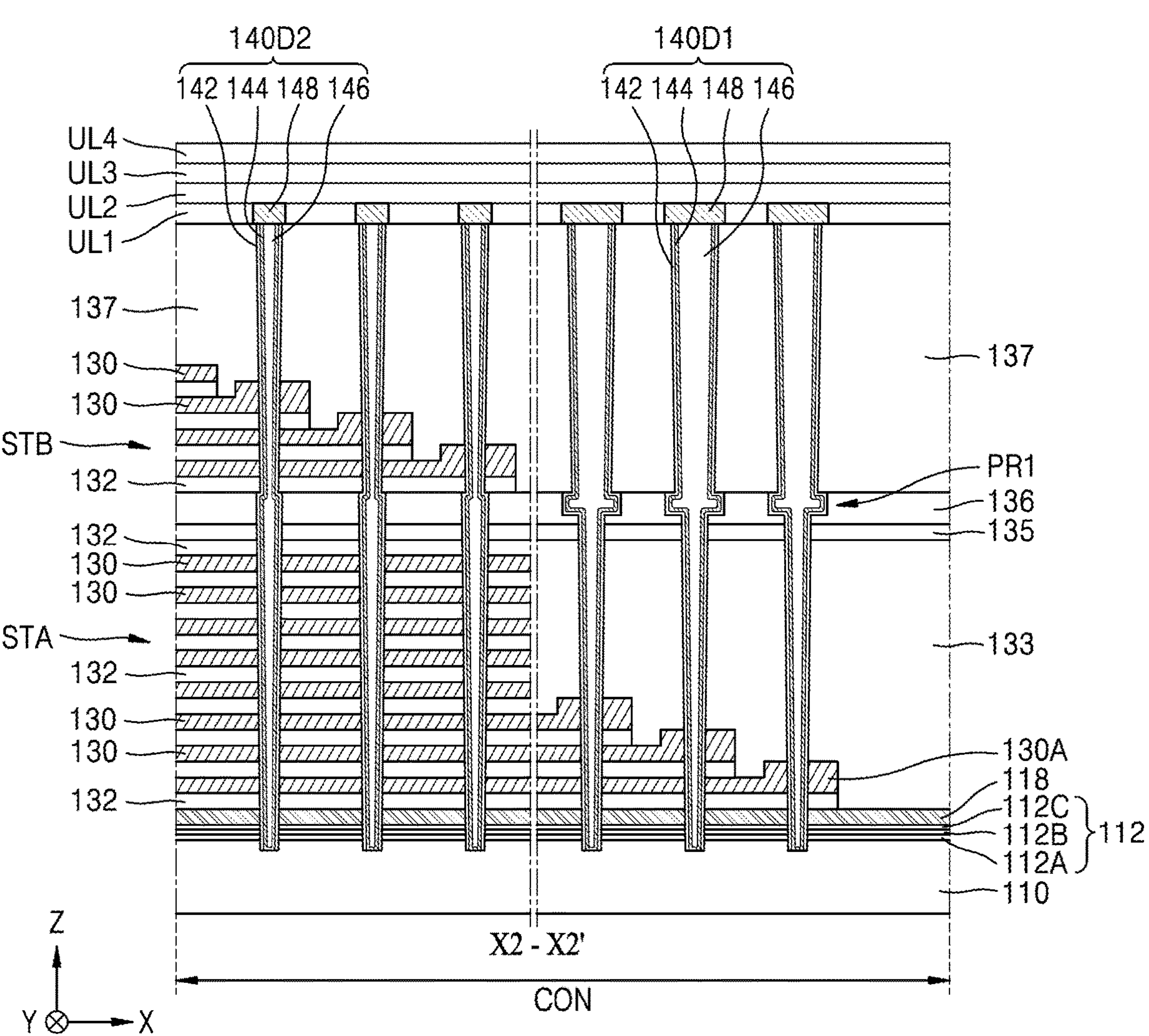
Figure 27C:
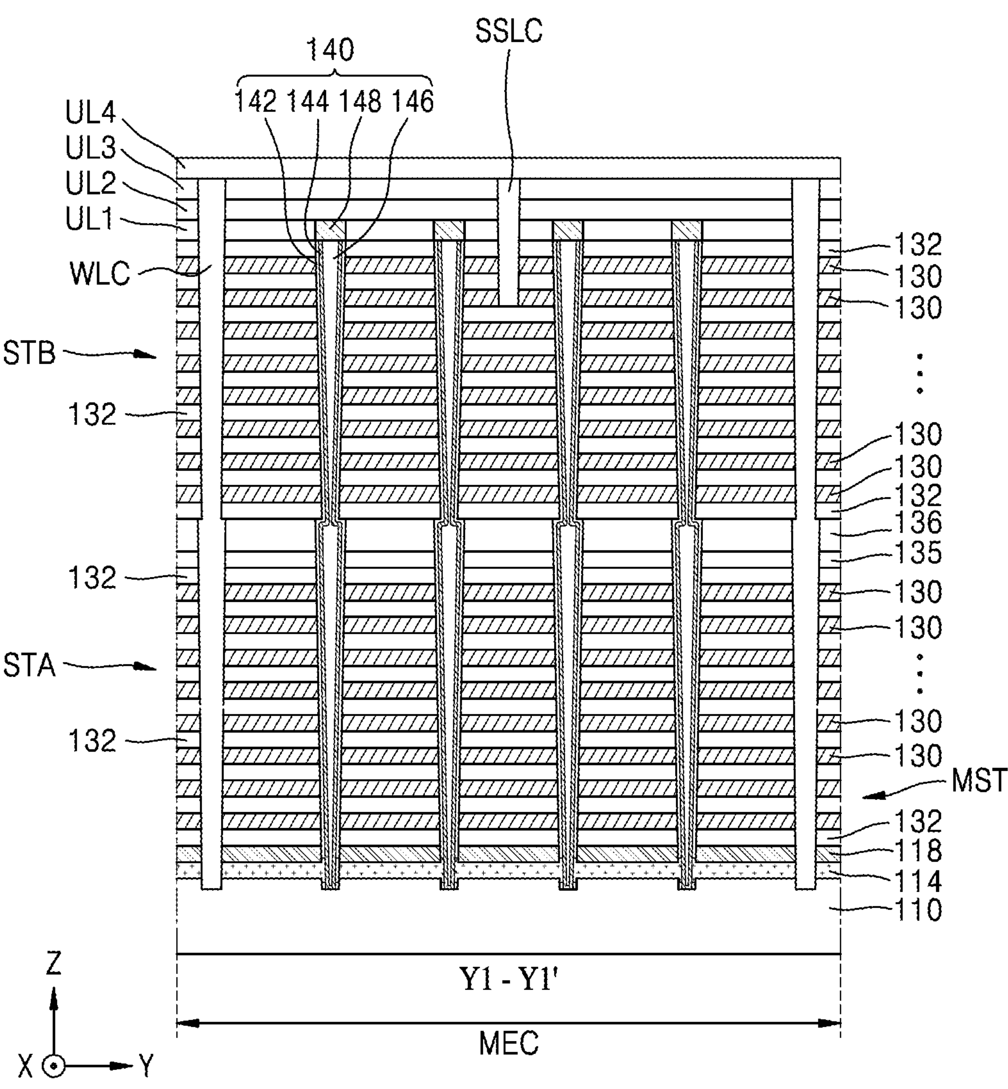

Referring to FIGS. 27A, 27B, and 27C, a fourth upper insulating film UL4 is formed on the results of FIGS. 26A, 26B, and 26C, and in the connection region CON, a plurality of upper memory cell contact holes MCH2 penetrating the fourth upper insulating film UL4, the third upper insulating film UL3, the second upper insulating film UL2, the first upper insulating film UL1, and the upper insulating block 137 and an upper plate contact hole PCH2 connected to the lower plate contact hole PCH1 may be formed.

Figure 28:
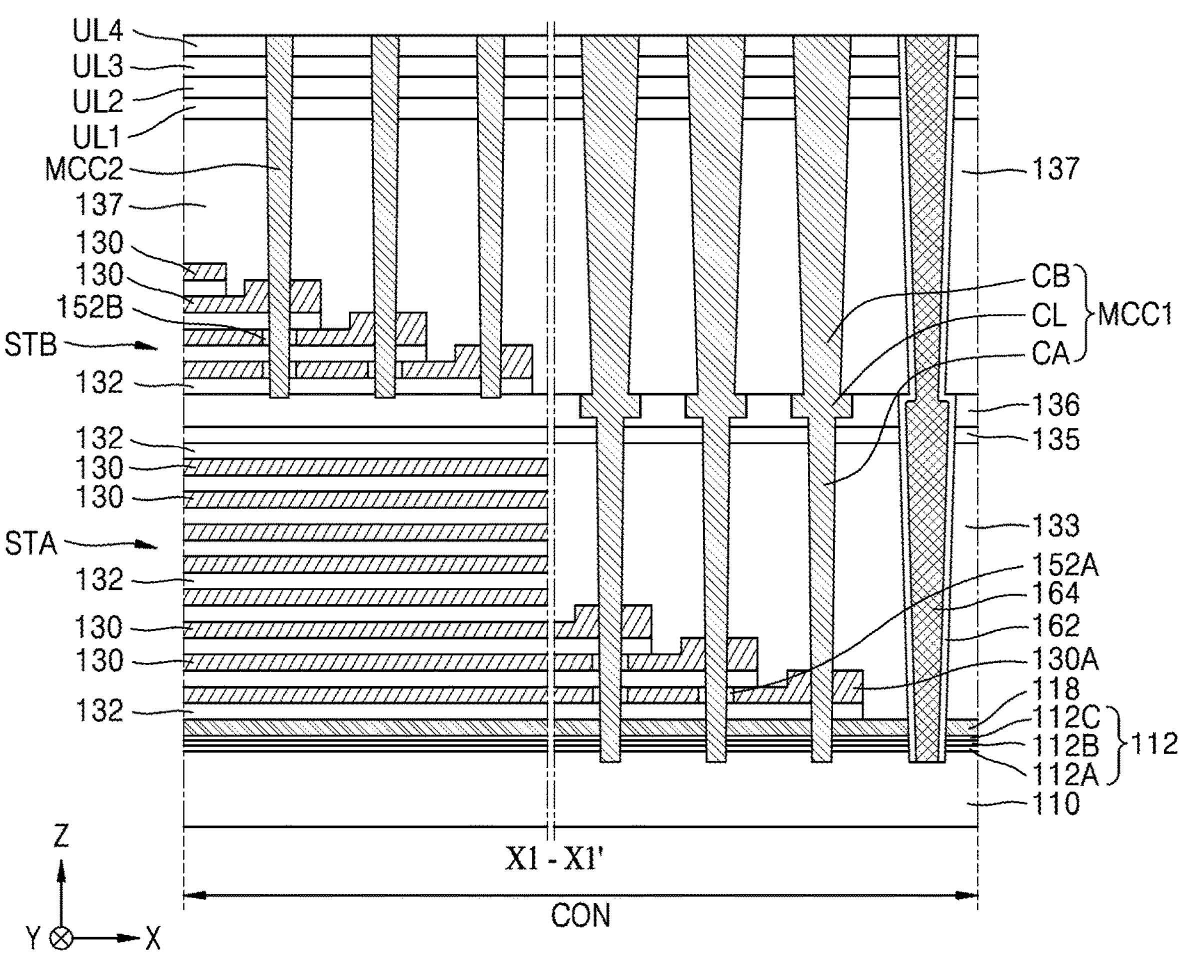

Referring to FIG. 28, the plurality of first sacrificial layers S1 and the plurality of second sacrificial layers S2 exposed through the plurality of upper memory cell contact holes MCH2 and the upper plate contact hole PCH2 may be removed in the results of FIGS. 27A, 27B, and 27C, and a plurality of first memory cell contacts MCC1, a plurality of second memory cell contacts MCC2, an insulating spacer 162, and a conductive plate contact 164 may be formed.

After that, as illustrated in FIGS. 6A to 6C, in the result of performing the process of FIG. 28, a fifth upper insulating film UL5 may be formed in the memory cell region MEC and the connection region CON, and a plurality of contact plugs 172 penetrating the fifth upper insulating film UL5 may be formed in the connection region CON, and a plurality of upper wiring layers UML may be formed on the fifth upper insulating film UL5 and the plurality of contact plugs 172 in the connection region CON, and a plurality of contact plugs 176 connected to the drain regions 148 of the plurality of channel structures 140 may be formed through the fifth upper insulating film UL5, the fourth upper insulating film UL4, the third upper insulating film UL3, and the second upper insulating film UL2 in the memory cell region MEC, and a plurality of bit lines BL connected to the plurality of contact plugs 176 may be formed on the fifth upper insulating film UL5, and a sixth upper insulating film UL6 filling a space between each of the plurality of upper wiring layers UML and the plurality of bit lines BL may be formed.

Although the method of manufacturing the semiconductor device 100 illustrated in FIGS. 4 to 6E has been described with reference to FIGS. 20A to 28, those skilled in the art will appreciate that by applying various modifications and changes from the processes described with reference to FIGS. 20A to 28 within the scope of the technical spirit of the inventive concept, the semiconductor devices 200A, 200B, 300, 400, 500, 500A, 500B, 500C, 600A, 600B, 600C, and 700 described with reference to FIGS. 7 to 19B and semiconductor devices having various structures with various modifications and changes therefrom may be manufactured within the scope of the technical spirit of the inventive concept.

Figure 29:
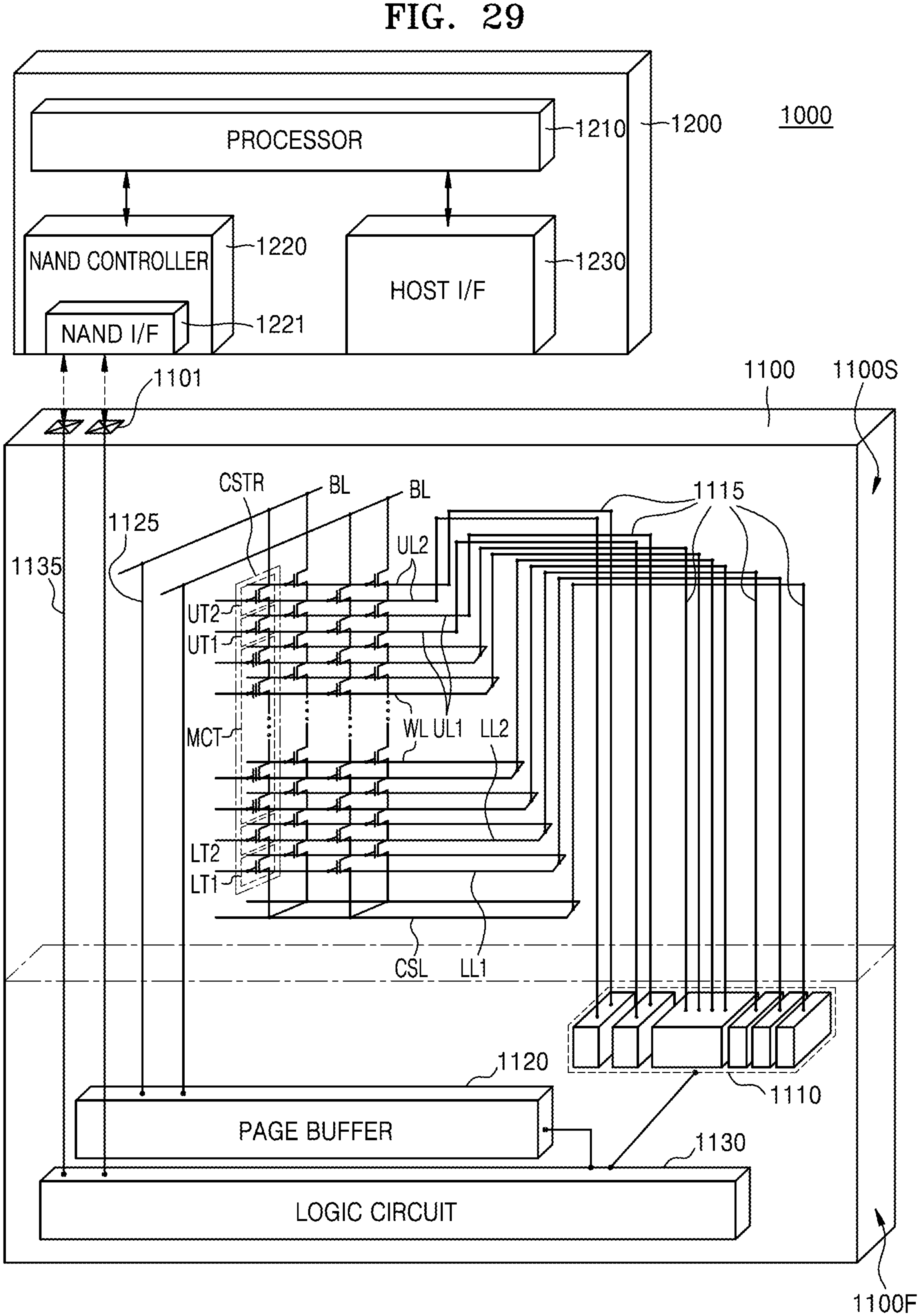
FIG. 29 is a view schematically showing an electronic system including a semiconductor device according to example embodiments of the disclosure.

FIG. 29 is a diagram schematically illustrating an electronic system including a semiconductor device according to an example embodiment.

Referring to FIG. 29, an electronic system 1000 according to an example embodiment may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive device (SSD), a universal serial bus (USB), a computing system, a medical device, or a communication device including at least one semiconductor device 1100.

The semiconductor device 1100 may be a nonvolatile memory device. For example, the semiconductor device 1100 may be a NAND flash memory device including at least one structure of the structures described above for the semiconductor devices 100, 200A, 200B, 300, 400, 500, 500A, 500B, 500C, 600A, 600B, 600C, and 700 with reference to FIGS. 4 to 19B. The semiconductor device 1100 may include a first structure 1100F and a second structure 1100S on the first structure 1100F. In example embodiments, the first structure 1100F may be next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, the plurality of memory cell strings CSTR may each include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified according to embodiments.

In example embodiments, the upper transistors UT1 and UT2 may include a string select transistor, and the lower transistors LT1 and LT2 may include a ground select transistor. The plurality of gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2.

The common source line CSL, the plurality of gate lower lines LL1 and LL2, the plurality of word lines WL, and the plurality of gate upper lines UL1 and UL2 may be electrically connected to the decoder circuit 1110 through a plurality of first connection wires 1115 extending from the first structure 1100F to the second structure 1100S. The plurality of bit lines BL may be electrically connected to the page buffer 1120 through a plurality of second connection wires 1125 extending from the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through the input/output pad 1101 electrically connected to the logic circuit 1130. The input/output pad 1101 may be electrically connected to the logic circuit 1130 through an input/output connection wire 1135 extending from the first structure 1100F to the second structure 1100S.

The memory controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to a preset firmware, and may access the semiconductor device 1100 by controlling the NAND controller 1220. The NAND controller 1220 may include a NAND I/F 1221 that processes communication with the semiconductor device 1100. Through the NAND I/F 1221, a control command for controlling the semiconductor device 1100; data to be written to the plurality of memory cell transistors MCT of the semiconductor device 1100, and data to be read from the plurality of memory cell transistors MCT of the semiconductor device 1100 may be transmitted. The host I/F 1230 may provide a communication function between the electronic system 1000 and an external host. When a control command is received from an external host through the host I/F 1230, the processor 1210 may control the semiconductor device 1100 in response to the control command.

Figure 30:
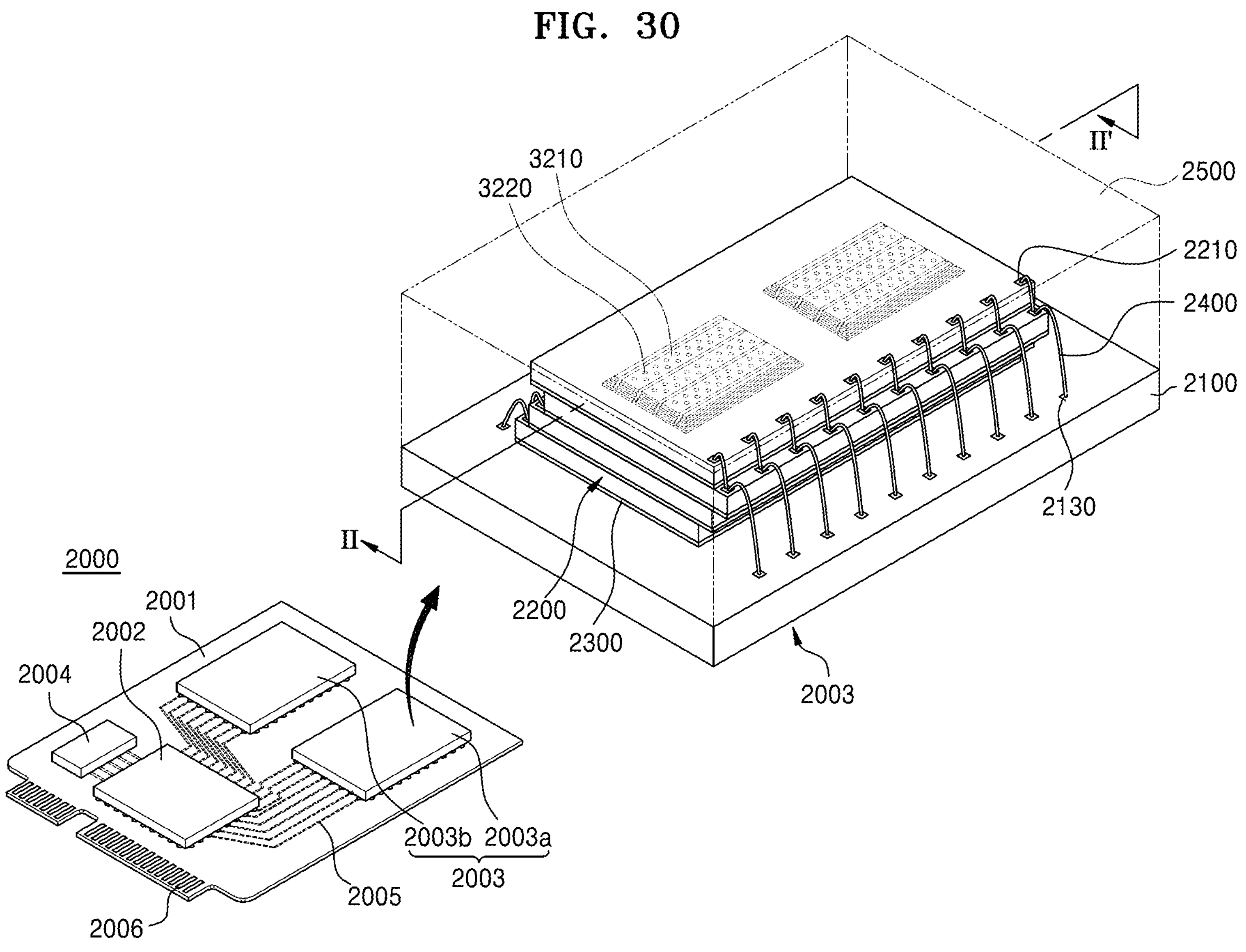
FIG. 30 is a schematic perspective view showing an electronic system including a semiconductor device according to example embodiments of the disclosure.

FIG. 30 is a schematic perspective view of an electronic system including a semiconductor device according to an example embodiment.

Referring to FIG. 30, an electronic system 2000 according to an example embodiment may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 by a plurality of wire patterns 2005 formed on the main board 2001.

The main board 2001 may include a connector 2006 including a plurality of pins coupled to an external host. The number and arrangement of the plurality of pins in the connector 2006 may vary according to a communication interface between the electronic system 2000 and the external host. In example embodiments, the electronic system 2000 may communicate with an external host according to any one of the interfaces such as Universal Serial Bus (USB), Peripheral Component Interconnect Express (PCI-Express), Serial Advanced Technology Attachment (SATA), and M-Phy for Universal Flash Storage (UFS). In example embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the electronic system 2000.

The DRAM 2004 may be a buffer memory for reducing a speed difference between the semiconductor package 2003, that is, a data storage space, and an external host. The DRAM 2004 included in the electronic system 2000 may operate as a kind of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, a plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 and the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 19. Each of the plurality of semiconductor chips 2200 may include a plurality of gate stacks 3210 and a plurality of channel structures 3220. Each of the plurality of semiconductor chips 2200 may include at least one of the semiconductor devices 100, 200A, 200B, 300, 400, 500, 500A, 500B, 500C, 600A, 600B, 600C, and 700 with reference to FIGS. 4 to 19B.

In example embodiments, the connection structure 2400 may be a bonding wire electrically connecting the input/output pad 2210 and the package upper pad 2130. Accordingly, in the first and second semiconductor packages 2003*a* and 2003*b*, the plurality of semiconductor chips 2200 may be electrically connected to each other by a bonding wire method, and may be electrically connected to the package upper pad 2130 of the package substrate 2100. In example embodiments, in relation to the first and second semiconductor packages 2003*a* and 2003*b*, the plurality of semiconductor chips 2200 may be electrically connected to each other by a connection structure including a through silicon via (TSV) instead of the bonding wire type connection structure 2400.

In example embodiments, the controller 2002 and the plurality of semiconductor chips 2200 may be included in one package. In example embodiments, the controller 2002 and the plurality of semiconductor chips 2200 may be mounted on a separate interposer substrate different from the main board 2001, and the controller 2002 and the plurality of semiconductor chips 2200 may be connected to each other by wires formed on the interposer substrate.

Figure 31:
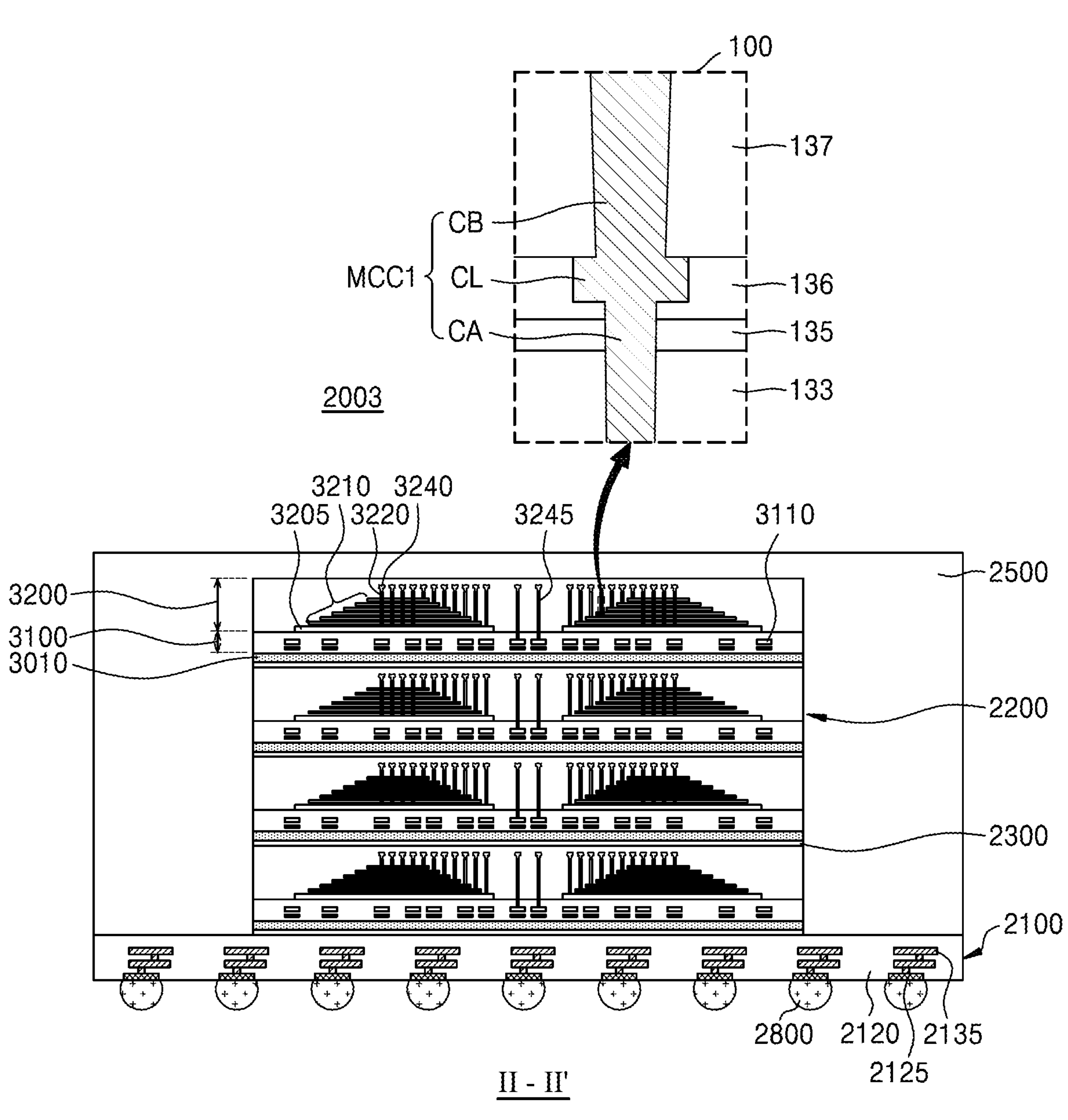
FIG. 31 is a cross-sectional view schematically showing semiconductor packages along line II-II' of FIG. 30 according to example embodiments of the disclosure.

FIG. 31 is a cross-sectional view schematically illustrating semiconductor packages according to an example embodiment. In FIG. 31, the configuration along line II-II' of FIG. 30 is shown in more detail.

Referring to FIG. 31, in the semiconductor package 2003, the package substrate 2100 may be a printed circuit board. The package substrate 2100 may include a package substrate body part 2120, a plurality of package upper pads 2130 (see FIG. 30) on the upper surface of the package substrate body part 2120, a plurality of lower pads 2125 on or exposed through the lower surface of the package substrate body part 2120, and a plurality of internal wires 2135 electrically connecting the plurality of upper pads 2130 and the plurality of lower pads 2125 inside the package substrate body part 2120. The plurality of upper pads 2130 may be electrically connected to the plurality of connection structures 2400. The plurality of lower pads 2125 may be connected to the plurality of wire patterns 2005 on the main board 2001 of the electronic system 2000 illustrated in FIG. 30 through a plurality of conductive connection parts 2800.

Each of the plurality of semiconductor chips 2200 may include a semiconductor substrate 3010 and a first structure 3100 and a second structure 3200 sequentially stacked on the semiconductor substrate 3010. The first structure 3100 may include a peripheral circuit region including a plurality of peripheral wires 3110. The second structure 3200 may include a common source line 3205, a gate stack 3210 on the common source line 3205, a channel structure 3220 through the gate stack 3210, and a bit line 3240 electrically connected to the channel structure 3220. In example embodiments, each of the plurality of semiconductor chips 2200 may include the same configuration as described for the semiconductor devices 100, 200A, 200B, 300, 400, 500, 500A, 500B, 500C, 600A, 600B, 600C, and 700 with reference to FIGS. 4 to 19B.

Each of the plurality of semiconductor chips 2200 may include a through wire 3245 electrically connected to a plurality of peripheral wires 3110 of the first structure 3100 and extending into the second structure 3200. The through wire 3245 may be outside the gate stack 3210. In other example embodiments, the semiconductor package 2003 may further include a through wire penetrating the gate stack 3210. Each of the plurality of semiconductor chips 2200 may further include the input/output pad 2210 (see FIG. 30) electrically connected to the plurality of peripheral wires 3110 of the first structure 3100.

While the inventive concept has been particularly shown and described with reference to embodiments thereof, it will be understood that various changes in form and details may be made therein without departing from the spirit and scope of the following claims.

What is claimed is:

1. A semiconductor device comprising:

a substrate;

a lower stepped connection part disposed at a first vertical level on the substrate and having a plurality of lower conductive pad parts;

an upper stepped connection part disposed at a second vertical level higher than the first vertical level on the substrate and having a plurality of upper conductive pad parts;

a lower insulating block in contact with each of the plurality of lower conductive pad parts at the first vertical level and covering the lower stepped connection part;

an upper insulating block in contact with each of the plurality of upper conductive pad parts at the second vertical level, the upper insulating block including a part covering the upper stepped connection part and a part covering the lower insulating block;

an intermediate insulating film arranged between the lower insulating block and the upper insulating block at a third vertical level between the first vertical level and the second vertical level; and a first plug structure configured to penetrate the lower stepped connection part, the intermediate insulating film, and the upper insulating block in the vertical direction at a position horizontally spaced from the upper stepped connection part, the first plug structure in which a width in the horizontal direction is greatest at the third vertical level, wherein the first plug structure comprises:

a lower plug portion at the first vertical level and including a portion penetrating the lower stepped connection part;

an upper plug portion disposed at the second vertical level and surrounded by the upper insulating block; and a plug landing portion arranged between the lower plug portion and the upper plug portion at the third vertical level, wherein a horizontal width of the plug landing portion is variable in the vertical direction and the plug landing portion gradually decreases towards the lower plug portion and has an inverted trapezoidal cross section including a horizontal bottom portion that extends away from sidewalls of the lower plug portion, wherein the first plug structure comprises a first memory cell contact configured to be electrically connectable to one lower conductive pad part selected from among the plurality of lower conductive pad parts, wherein the semiconductor device further comprises a second memory cell contact configured to penetrate the upper stepped connection part in the vertical direction and configured to be electrically connectable to one upper conductive pad part selected from among the plurality of upper conductive pad parts, wherein the first memory cell contact and the second memory cell contact are apart from each other in the horizontal direction, wherein a first width of an uppermost surface of the first memory cell contact in the horizontal direction is greater than a second width of an uppermost surface of the second memory cell contact, and wherein the first memory cell contact and the second memory cell contact have different greatest widths in the horizontal direction.

2. The semiconductor device of claim 1, wherein the plug landing portion arranged between the lower plug portion and the upper plug portion protrudes in the horizontal direction from a first sidewall of the lower plug portion and a second sidewall of the upper plug portion at the third vertical level.

3. The semiconductor device of claim 1, wherein the lower plug portion has an uppermost portion adjacent to a bottom surface of the plug landing portion, wherein the upper plug portion has a lowermost portion adjacent to an upper surface of the plug landing portion, and wherein a width of the lowermost portion of the upper plug portion in the horizontal direction is greater than a width of the uppermost portion of the lower plug portion.

4. The semiconductor device of claim 1, wherein the first plug structure comprises a through electrode configured to penetrate at least one lower conductive pad part selected from among the plurality of lower conductive pad parts in the vertical direction and configured not to be electrically connected to the plurality of lower conductive pad parts.

5. The semiconductor device of claim 1, further comprising a second plug structure penetrating the upper stepped connection part in the vertical direction, wherein a first width of an uppermost surface of the first plug structure in the horizontal direction is greater than a second width of an uppermost surface of the second plug structure.

6. The semiconductor device of claim 1, further comprising a peripheral circuit structure comprising a lower substrate, a plurality of circuits between the lower substrate and the substrate, and a plurality of wiring layers connected to the plurality of circuits, wherein the first plug structure extends to the peripheral circuit structure through the substrate and is connected to at least one wiring layer selected from among the plurality of wiring layers.

7. A semiconductor device comprising:

a substrate including a memory cell region and a connection region;

a first stack disposed at a first vertical level on the substrate, the first stack including a lower stepped connection part having a plurality of lower gate lines overlapping each other in a vertical direction in the memory cell region and a plurality of lower conductive pad parts disposed in the connection region and integrally connected to the plurality of lower gate lines;

a second stack disposed at a second vertical level higher than the first vertical level on the substrate, the second stack including an upper stepped connection part having a plurality of upper gate lines overlapping each other in the vertical direction in the memory cell region and a plurality of upper conductive pad parts disposed in the connection region and integrally connected to the plurality of upper gate lines;

a lower insulating block configured to cover the lower stepped connection part at the first vertical level;

an upper insulating block configured to cover the upper stepped connection part and the lower insulating block at the second vertical level;

an intermediate insulating film arranged between the first stack and the second stack and between the lower insulating block and the upper insulating block at a third vertical level between the first vertical level and the second vertical level; and a plug structure penetrating the lower stepped connection part, the intermediate insulating film, and the upper insulating block in the vertical direction at a location horizontally apart from the first stack in the connection region, the plug structure in which a width in the horizontal direction is greatest at the third vertical level, wherein the plug structure comprises:

a lower plug portion at the first vertical level and including a portion penetrating the lower stepped connection part;

an upper plug portion disposed at the second vertical level and surrounded by the upper insulating block; and a plug landing portion arranged between the lower plug portion and the upper plug portion at the third vertical level, wherein a horizontal width of the plug landing portion is variable in the vertical direction and the plug landing portion gradually decreases towards the lower plug portion and has a semicircular cross section, wherein the plug structure comprises a first memory cell contact configured to be electrically connectable to one lower conductive pad part selected from among the plurality of lower conductive pad parts, wherein the semiconductor device further comprises a second memory cell contact configured to penetrate the upper stepped connection part in the vertical direction and configured to be electrically connectable to one upper conductive pad part selected from among the plurality of upper conductive pad parts, wherein the first memory cell contact and the second memory cell contact are apart from each other in the horizontal direction, and wherein a first width of an uppermost surface of the first memory cell contact in the horizontal direction is greater than a second width of an uppermost surface of the second memory cell contact, and wherein the first memory cell contact and the second memory cell contact have different greatest widths in the horizontal direction.

8. The semiconductor device of claim 7, wherein the plug landing portion protrudes in the horizontal direction from a first sidewall of the lower plug portion and a second sidewall of the upper plug portion at the third vertical level, and wherein a first width of an uppermost portion of the lower plug portion adjacent to a bottom surface of the plug landing portion in the horizontal direction is less than a second width of a lowermost portion of the upper plug portion adjacent to an upper surface of the plug landing portion.

9. An electronic system comprising:

a main board;

a semiconductor device on the main board; and a controller electrically connected to the semiconductor device on the main board, wherein the semiconductor device comprises:

a substrate;

a lower stepped connection part disposed at a first vertical level on the substrate and having a plurality of lower conductive pad parts;

an upper stepped connection part disposed at a second vertical level higher than the first vertical level on the substrate and having a plurality of upper conductive pad parts;

a lower insulating block in contact with each of the plurality of lower conductive pad parts at the first vertical level and covering the lower stepped connection part;

an upper insulating block in contact with each of the plurality of upper conductive pad parts at the second vertical level, the upper insulating block including a part covering the upper stepped connection part and a part covering the lower insulating block; and an intermediate insulating layer arranged between the lower insulating block and the upper insulating block at a third vertical level between the first vertical level and the second vertical level;

a plug structure configured to penetrate the lower stepped connection part, the intermediate insulating film, and the upper insulating block in the vertical direction at a position horizontally spaced from the upper stepped connection part, the plug structure in which a width in the horizontal direction is greatest at the third vertical level wherein the plug structure comprises:

a lower plug portion at the first vertical level and including a portion penetrating the lower stepped connection part;

an upper plug portion disposed at the second vertical level and surrounded by the upper insulating block; and a plug landing portion arranged between the lower plug portion and the upper plug portion at the third vertical level, wherein a horizontal width of the plug landing portion is variable in the vertical direction and the plug landing portion gradually decreases towards the lower plug portion and has a semicircular cross section, wherein the plug structure comprises a first memory cell contact configured to be electrically connectable to one lower conductive pad part selected from among the plurality of lower conductive pad parts, wherein the semiconductor device further comprises a second memory cell contact configured to penetrate the upper stepped connection part in the vertical direction and configured to be electrically connectable to one upper conductive pad part selected from among the plurality of upper conductive pad parts, wherein the first memory cell contact and the second memory cell contact are apart from each other in the horizontal direction, and wherein a first width of an uppermost surface of the first memory cell contact in the horizontal direction is greater than a second width of an uppermost surface of the second memory cell contact, and wherein the first memory cell contact and the second memory cell contact have different greatest widths in the horizontal direction.

* * * * *